(12) United States Patent
Iguchi et al.

(10) Patent No.: US 11,289,015 B2
(45) Date of Patent: *Mar. 29, 2022

(54) DISPLAY DEVICE

(71) Applicant: SHARP KABUSHIKI KAISHA, Sakai (JP)

(72) Inventors: Katsuji Iguchi, Sakai (JP); Tsuyoshi Ono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/127,897

(22) Filed: Dec. 18, 2020

(65) Prior Publication Data

US 2021/0150978 A1 May 20, 2021

Related U.S. Application Data

(62) Division of application No. 16/471,476, filed as application No. PCT/JP2017/043614 on Dec. 5, 2017, now Pat. No. 10,902,770.

(30) Foreign Application Priority Data

Dec. 22, 2016 (JP) .................................. 2016-249777

(51) Int. Cl.
| | | |
|---|---|---|
| *G09G 3/30* | (2006.01) | |
| *G09G 5/00* | (2006.01) | |
| *G06F 3/038* | (2013.01) | |
| *G09G 3/32* | (2016.01) | |
| *G09G 3/00* | (2006.01) | |

(Continued)

(52) U.S. Cl.
CPC .............. *G09G 3/32* (2013.01); *G09G 3/006* (2013.01); *H01L 25/0753* (2013.01); *H01L 27/1214* (2013.01); *H01L 33/0093* (2020.05); *H01L 33/44* (2013.01); *H01L 33/50* (2013.01); *H01L 33/58* (2013.01); *H01L 33/60* (2013.01); *H01L 33/62* (2013.01); *G09G 2300/0426* (2013.01); *G09G 2330/12* (2013.01); *H01L 2933/0025* (2013.01); *H01L 2933/0033* (2013.01);

(Continued)

(58) Field of Classification Search
CPC ................................................ G02F 1/133603
See application file for complete search history.

(56) References Cited

U.S. PATENT DOCUMENTS 5,621,225 A * 4/1997 Shieh .................... H01L 25/162
257/81
2001/0032985 A1* 10/2001 Bhat ....................... H01L 24/17
257/88

(Continued)

FOREIGN PATENT DOCUMENTS

JP S5571081 A 5/1980
JP H11251634 A 9/1999

(Continued)

*Primary Examiner* — Nan-Ying Yang
(74) *Attorney, Agent, or Firm* — ScienBiziP, P.C.

(57) ABSTRACT

To enable manufacturing of a display device with a low defect rate and high yield, an integrated circuit chip includes a drive circuit that drives a light emitting unit, and the drive circuit includes a P-side electrode connected to an anode of the light emitting unit and a nonvolatile memory transistor that controls current supply to the P-side electrode.

20 Claims, 63 Drawing Sheets

(51) Int. Cl.
*H01L 25/075* (2006.01)
*H01L 27/12* (2006.01)
*H01L 33/44* (2010.01)
*H01L 33/50* (2010.01)
*H01L 33/58* (2010.01)
*H01L 33/60* (2010.01)
*H01L 33/62* (2010.01)
*H01L 33/00* (2010.01)

(52) U.S. Cl.
CPC ........... *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2002/0047958 A1* | 4/2002 | Hirata | G02F 1/13392 349/106 |
| 2006/0061526 A1* | 3/2006 | Shirasaki | G09G 3/3233 345/77 |
| 2006/0284195 A1 | 12/2006 | Nagai | |
| 2007/0097045 A1* | 5/2007 | Lee | G09G 3/3426 345/82 |
| 2008/0042554 A1* | 2/2008 | Komoto | G02F 1/133617 313/501 |
| 2008/0149945 A1 | 6/2008 | Nagai | |
| 2010/0078657 A1 | 4/2010 | Nagai | |
| 2011/0121731 A1 | 5/2011 | Tsutsumi et al. | |
| 2011/0175117 A1 | 7/2011 | Jagt et al. | |
| 2013/0119422 A1 | 5/2013 | Nagai | |
| 2016/0093781 A1 | 3/2016 | Tamaki et al. | |
| 2018/0040583 A1 | 2/2018 | Tamaki et al. | |
| 2019/0221541 A1 | 7/2019 | Tamaki et al. | |

FOREIGN PATENT DOCUMENTS

| | | |
|---|---|---|
| JP | 2006147679 A | 6/2006 |
| JP | 2008262993 A | 10/2008 |
| JP | 2011044741 A | 3/2011 |
| JP | 2011108589 A | 6/2011 |
| JP | 2012503876 A | 2/2012 |
| JP | 2015170666 A | 9/2015 |
| JP | 2016072471 A | 5/2016 |

* cited by examiner

30: LIGHT EMITTING ARRAY
31: LIGHT EMITTING UNIT
32: WIRING UNIT
34: N-SIDE ELECTRODE REGION
35: N-SIDE EPITAXIAL LAYER EXPOSED REGION
42: P-SIDE INDIVIDUAL ELECTRODE
43: N-SIDE WIRING ELECTRODE
51: COMPOUND SEMICONDUCTOR LAYER
55: TRANSPARENT CONDUCTIVE FILM
58: P-SIDE CONTACT HOLE
59: N-SIDE CONTACT HOLE
60: UNIT SEPARATION GROOVE

20: INTEGRATED CIRCUIT CHIP
70: DRIVE CIRCUIT
46: P-SIDE ELECTRODE
47: N-SIDE ELECTRODE

31: LIGHT EMITTING UNIT
46: P-SIDE ELECTRODE
47: N-SIDE ELECTRODE
70: DRIVE CIRCUIT
71: ROW-SELECTION SIGNAL LINE
72: COLUMN SIGNAL LINE
73: POWER SUPPLY LINE
74: GND LINE
75: ROW-SELECTION TRANSISTOR
76: VOLTAGE HOLDING CAPACITOR
77 DRIVE TRANSISTOR
78: NONVOLATILE MEMORY TRANSISTOR
79: GATE CONTROL SIGNAL LINE
80: TEST TRANSISTOR
81: TEST TERMINAL
I: DRIVE CURRENT

58: P-SIDE CONTACT HOLE
59: N-SIDE CONTACT HOLE

60: UNIT SEPARATION GROOVE

33: N-SIDE COMMON ELECTRODE

40: PIXEL
68: WAVELENGTH CONVERSION LAYER
69: LIGHT-SHIELDING LAYER

FIG.26

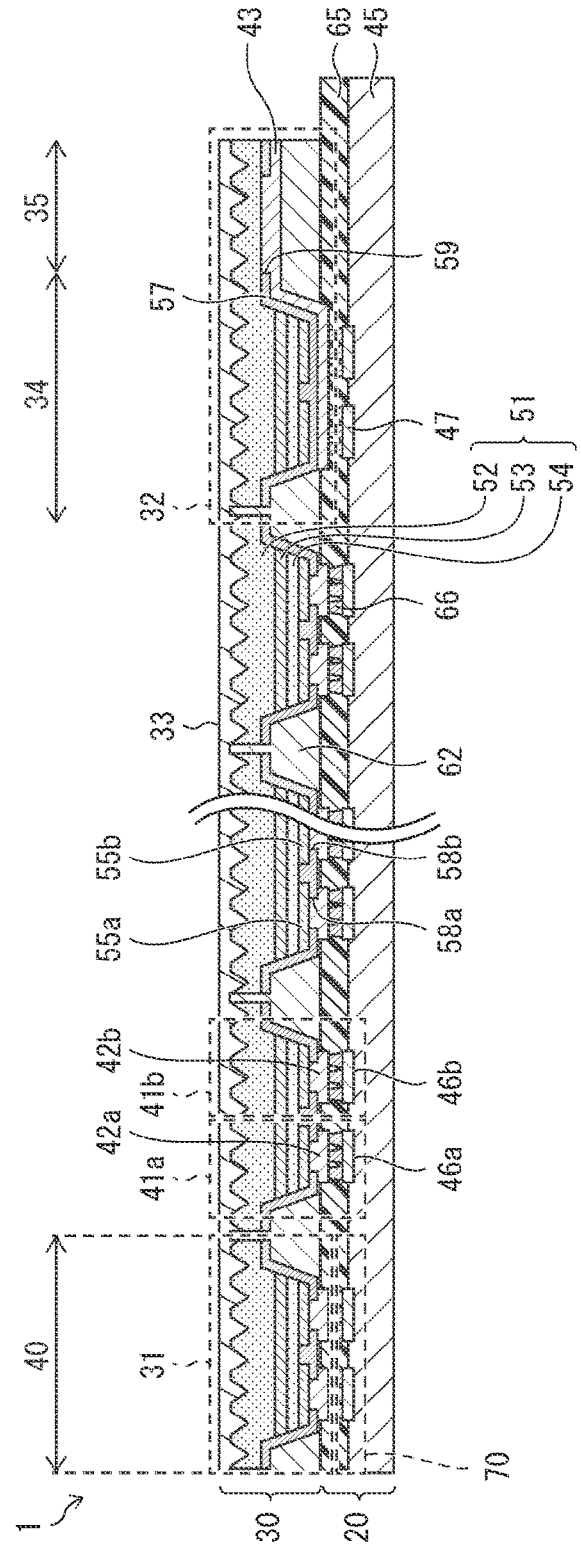

- 1: LED DISPLAY CHIP
- 20: INTEGRATED CIRCUIT CHIP
- 30: LIGHT EMITTING ARRAY
- 31: LIGHT EMITTING UNIT
- 32: WIRING UNIT
- 33: N-SIDE COMMON ELECTRODE
- 34: N-SIDE ELECTRODE REGION
- 35: N-SIDE EPITAXIAL LAYER EXPOSED REGION
- 40: PIXEL
- 41a: FIRST LED
- 41b: SECOND LED
- 42a: FIRST P-SIDE INDIVIDUAL ELECTRODE
- 42b: SECOND P-SIDE INDIVIDUAL ELECTRODE
- 43: N-SIDE WIRING ELECTRODE
- 45: SILICON SUBSTRATE
- 46a: FIRST P-SIDE ELECTRODE
- 46b: SECOND P-SIDE ELECTRODE
- 47: N-SIDE ELECTRODE
- 51: COMPOUND SEMICONDUCTOR LAYER
- 52: N-SIDE EPITAXIAL LAYER
- 53: LIGHT EMITTING LAYER
- 54: P-SIDE EPITAXIAL LAYER
- 55a: FIRST TRANSPARENT CONDUCTIVE FILM PATTERN
- 55b: SECOND TRANSPARENT CONDUCTIVE FILM PATTERN
- 57: PROTECTIVE FILM
- 58a: FIRST P-SIDE CONTACT HOLE
- 58b: SECOND P-SIDE CONTACT HOLE
- 59: N-SIDE CONTACT HOLE
- 62: REFLECTIVE MATERIAL
- 65: RESIN LAYER
- 66: MICROBUMP
- 70: DRIVE CIRCUIT

FIG.27

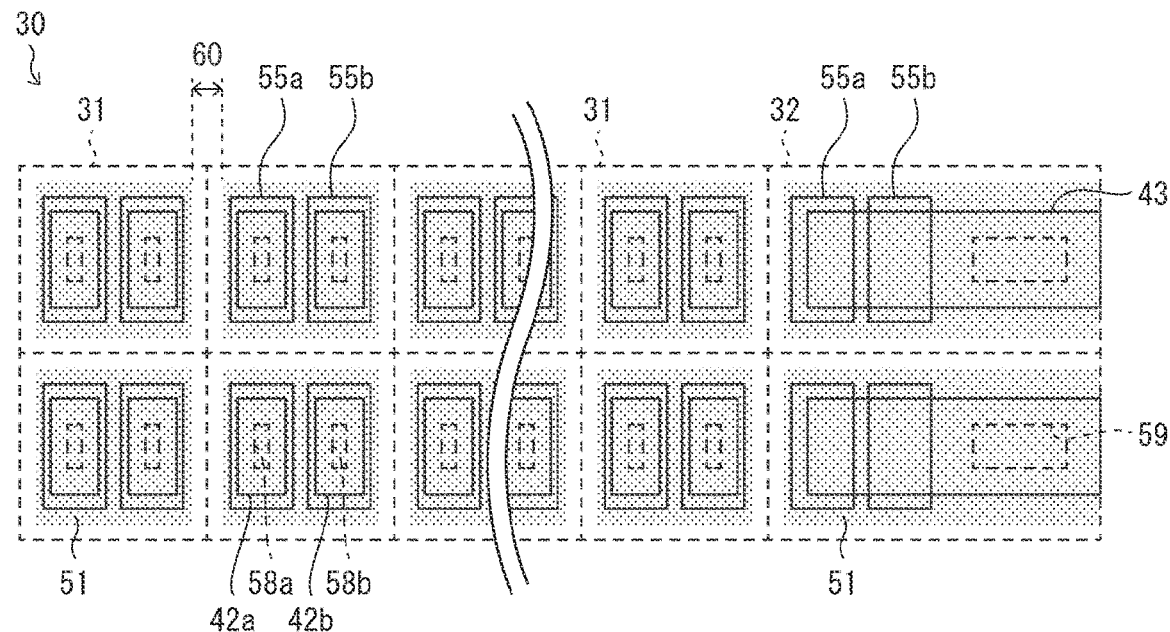

30: LIGHT EMITTING ARRAY
31: LIGHT EMITTING UNIT
32: WIRING UNIT
42a: FIRST P-SIDE INDIVIDUAL ELECTRODE
42b: SECOND P-SIDE INDIVIDUAL ELECTRODE
43: N-SIDE WIRING ELECTRODE
51: COMPOUND SEMICONDUCTOR LAYER
55a: FIRST TRANSPARENT CONDUCTIVE FILM PATTERN
55b: SECOND TRANSPARENT CONDUCTIVE FILM PATTERN
58a: FIRST P-SIDE CONTACT HOLE
58b: SECOND P-SIDE CONTACT HOLE
59: N-SIDE CONTACT HOLE
60: UNIT SEPARATION GROOVE

20: INTEGRATED CIRCUIT CHIP
46a: FIRST P-SIDE ELECTRODE
46b: SECOND P-SIDE ELECTRODE
47: N-SIDE ELECTRODE
70: DRIVE CIRCUIT

FIG.29

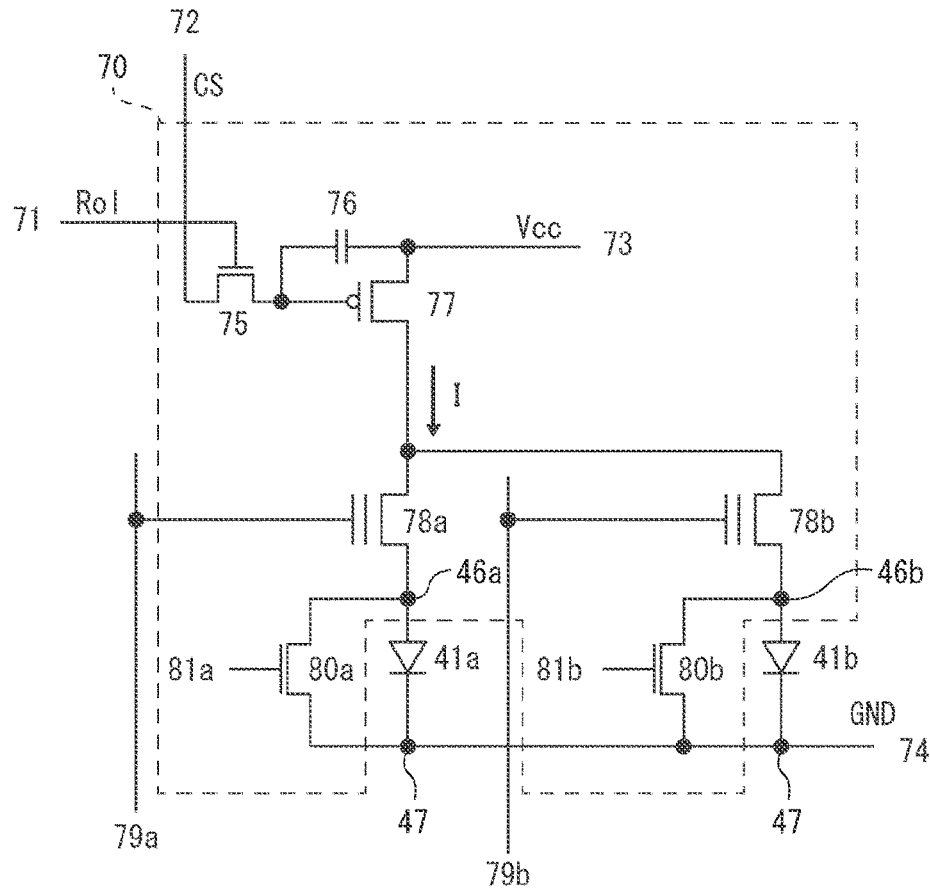

46a: FIRST P-SIDE ELECTRODE
46b: SECOND P-SIDE ELECTRODE
47: N-SIDE ELECTRODE
70: DRIVE CIRCUIT
71: ROW-SELECTION SIGNAL LINE
72: COLUMN SIGNAL LINE
73: POWER SUPPLY LINE
74: GND LINE
75: ROW-SELECTION TRANSISTOR
76: VOLTAGE HOLDING CAPACITOR
77: DRIVE TRANSISTOR
78a: FIRST NONVOLATILE MEMORY TRANSISTOR
78b: SECOND NONVOLATILE MEMORY TRANSISTOR
79a: FIRST GATE CONTROL SIGNAL LINE
79b: SECOND GATE CONTROL SIGNAL LINE
80a: FIRST TEST TRANSISTOR
80b: SECOND TEST TRANSISTOR
81a: FIRST TEST TERMINAL
81b: SECOND TEST TERMINAL
I: DRIVE CURRENT

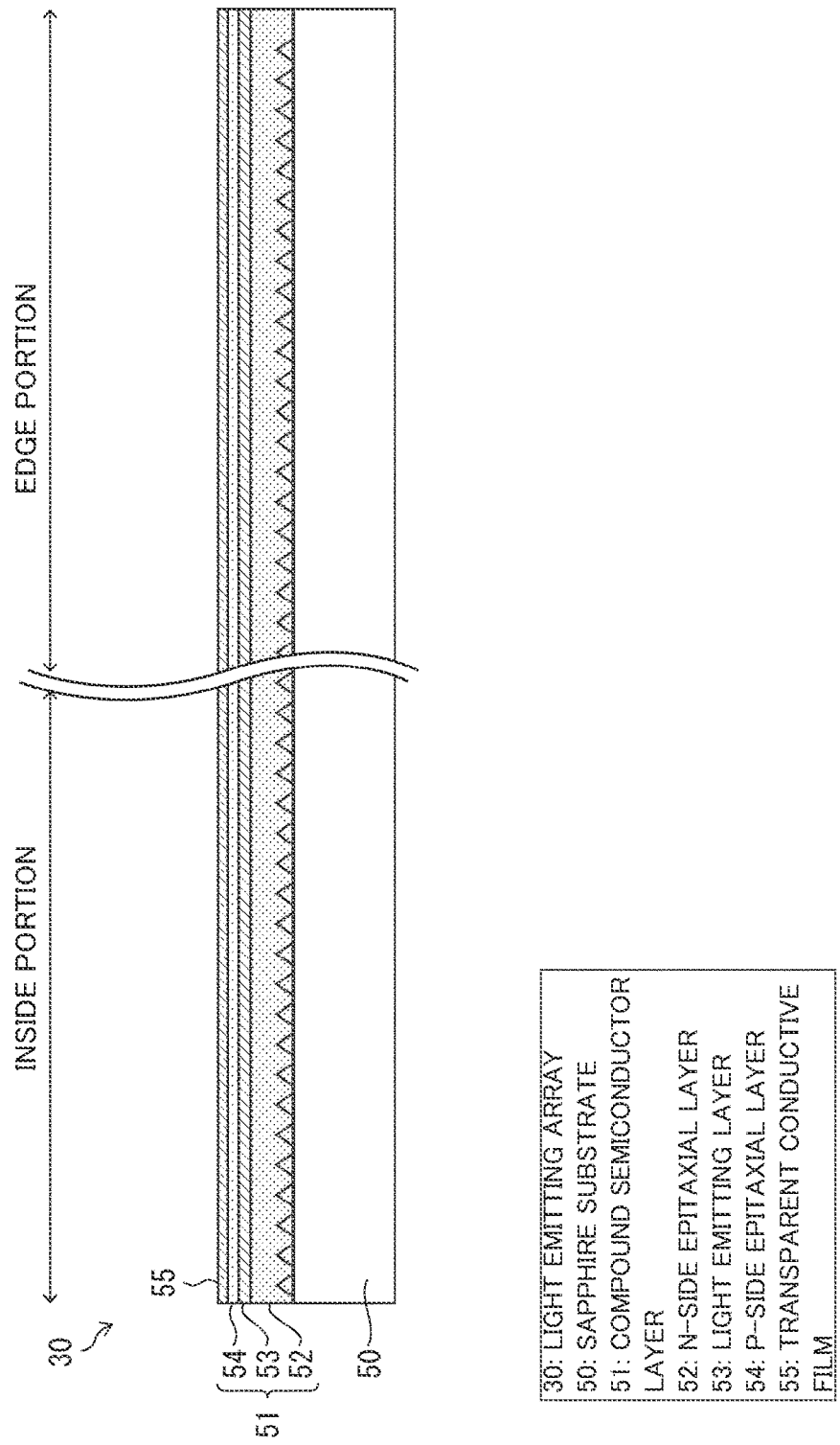

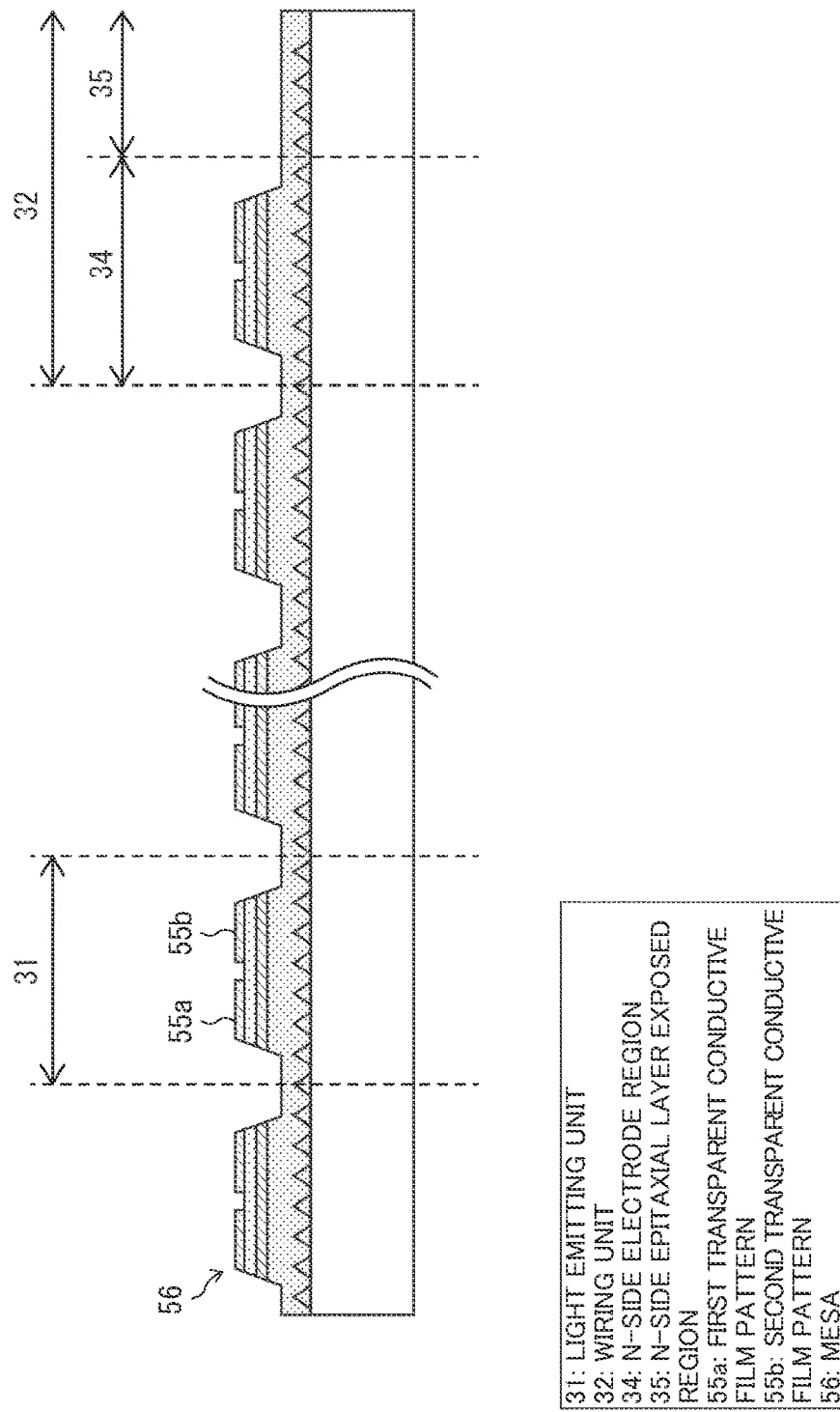

60: UNIT SEPARATION GROOVE

30: LIGHT EMITTING ARRAY
31: LIGHT EMITTING UNIT
42a: FIRST P-SIDE INDIVIDUAL ELECTRODE
42b: SECOND P-SIDE INDIVIDUAL ELECTRODE
51: COMPOUND SEMICONDUCTOR LAYER
55a: FIRST TRANSPARENT CONDUCTIVE FILM PATTERN
55b: SECOND TRANSPARENT CONDUCTIVE FILM PATTERN
58a: FIRST P-SIDE CONTACT HOLE
58b: SECOND P-SIDE CONTACT HOLE
60: UNIT SEPARATION GROOVE

FIG.41

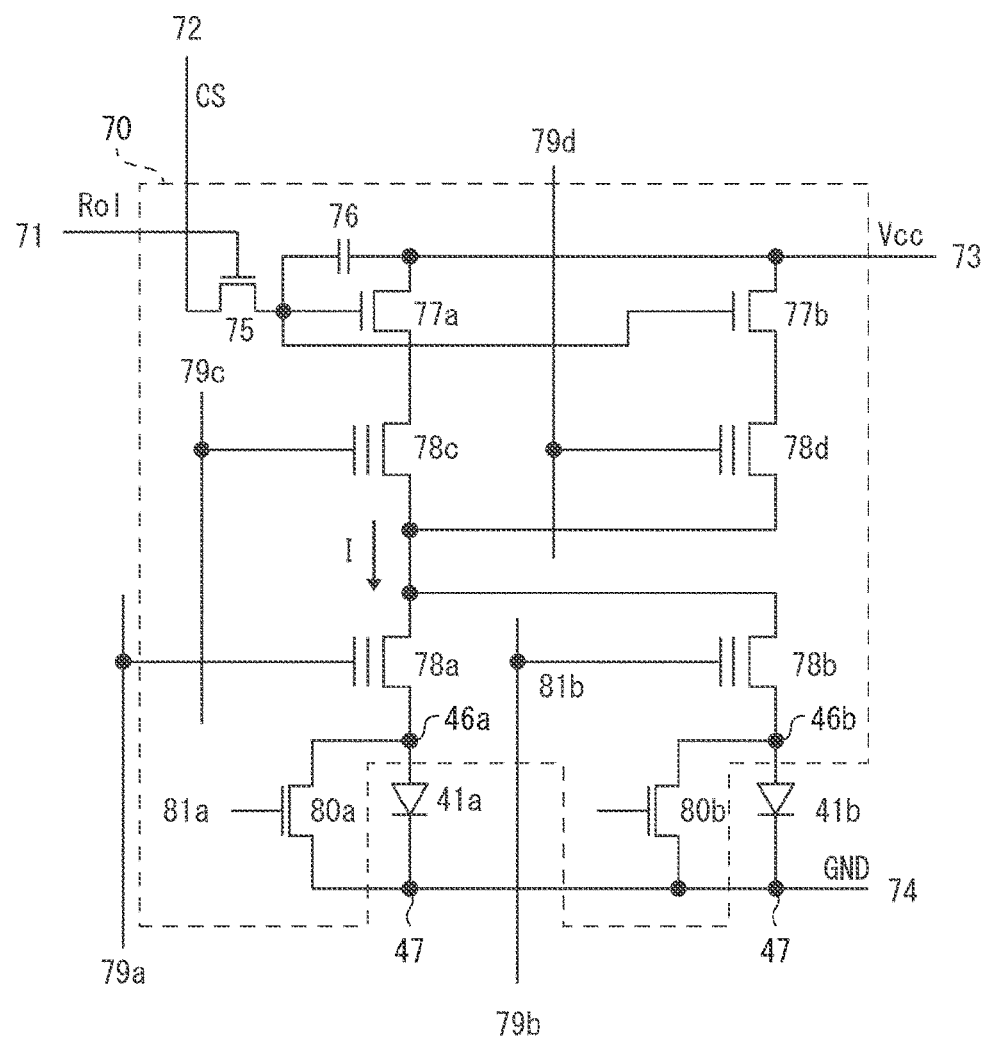

| 41a: FIRST LED | 78a: FIRST NONVOLATILE MEMORY TRANSISTOR |
| 41b: SECOND LED | 78b: SECOND NONVOLATILE MEMORY TRANSISTOR |
| 46a: FIRST P-SIDE ELECTRODE | |
| 46b: SECOND P-SIDE ELECTRODE | 78c: THIRD NONVOLATILE MEMORY TRANSISTOR |
| 47: N-SIDE ELECTRODE | 78d: FOURTH NONVOLATILE MEMORY TRANSISTOR |
| 70: DRIVE CIRCUIT | |
| 71: ROW-SELECTION SIGNAL LINE | 79a: FIRST GATE CONTROL SIGNAL LINE |
| 72: COLUMN SIGNAL LINE | 79b: SECOND GATE CONTROL SIGNAL LINE |
| 73: POWER SUPPLY LINE | 79c: THIRD GATE CONTROL SIGNAL LINE |
| 74: GND LINE | 79d: FOURTH GATE CONTROL SIGNAL LINE |
| 75: ROW-SELECTION TRANSISTOR | 80a: FIRST TEST TRANSISTOR |
| 76: VOLTAGE HOLDING CAPACITOR | 80b: SECOND TEST TRANSISTOR |
| 77a: FIRST DRIVE TRANSISTOR | 81a: FIRST TEST TERMINAL |
| 77b: SECOND DRIVE TRANSISTOR | 81b: SECOND TEST TERMINAL |
| | I: DRIVE CURRENT |

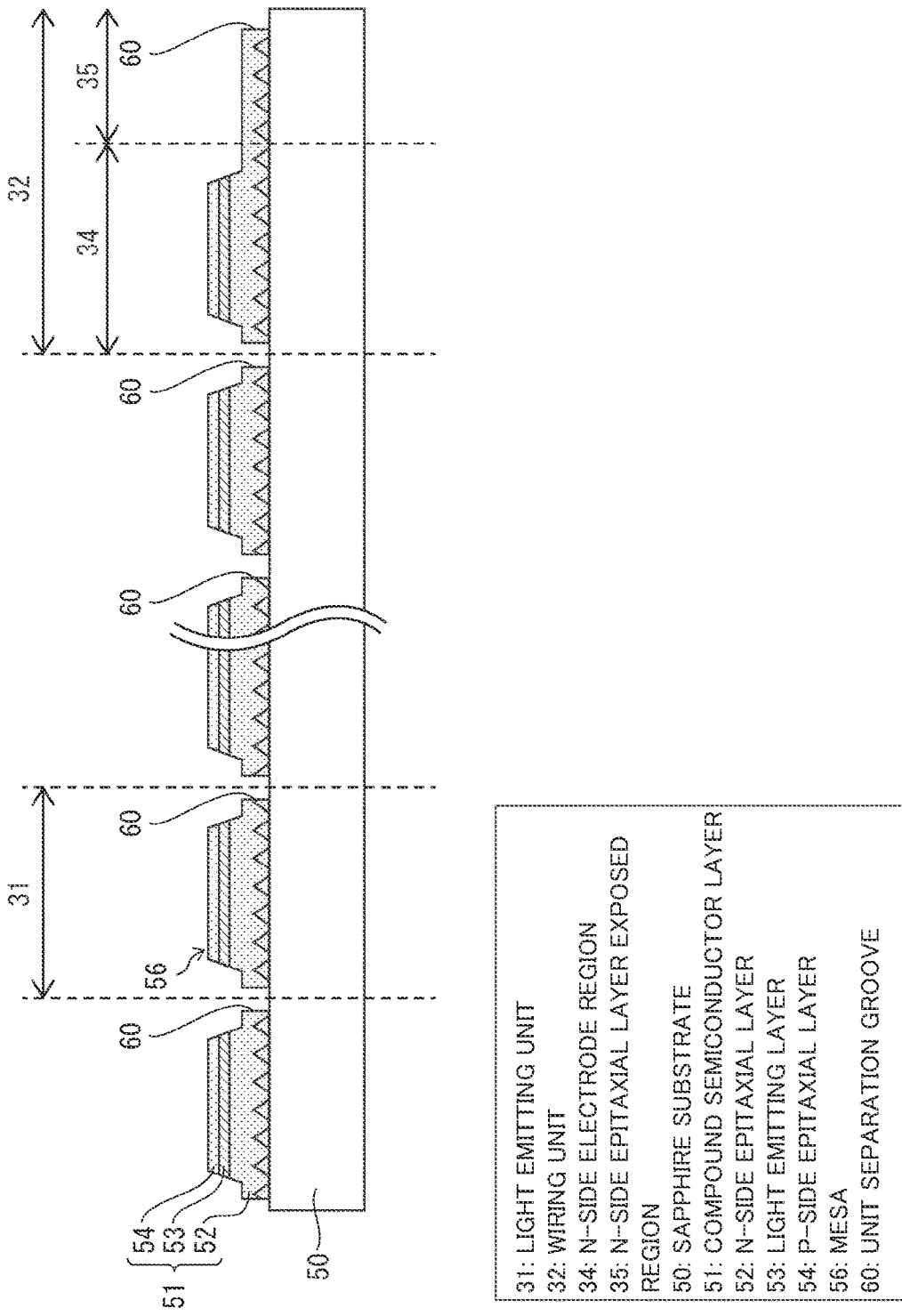

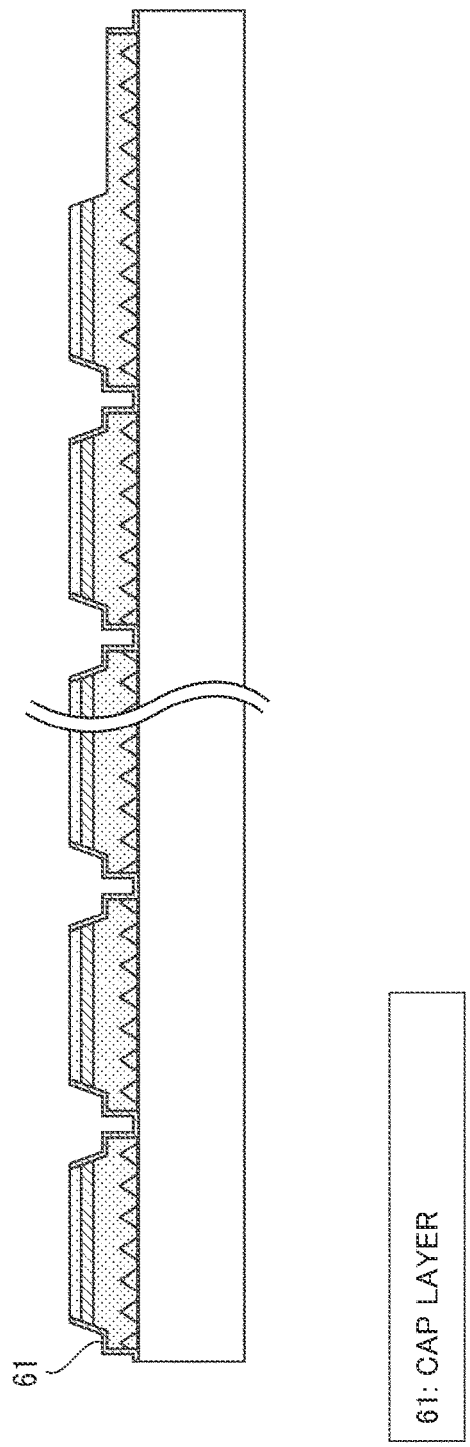

42a: FIRST P-SIDE INDIVIDUAL ELECTRODE
42b: SECOND P-SIDE INDIVIDUAL ELECTRODE
43: N-SIDE WIRING ELECTRODE

60: UNIT SEPARATION GROOVE

67: PLANARIZING LAYER

33: N-SIDE COMMON ELECTRODE
62: REFLECTIVE MATERIAL

FIG.56

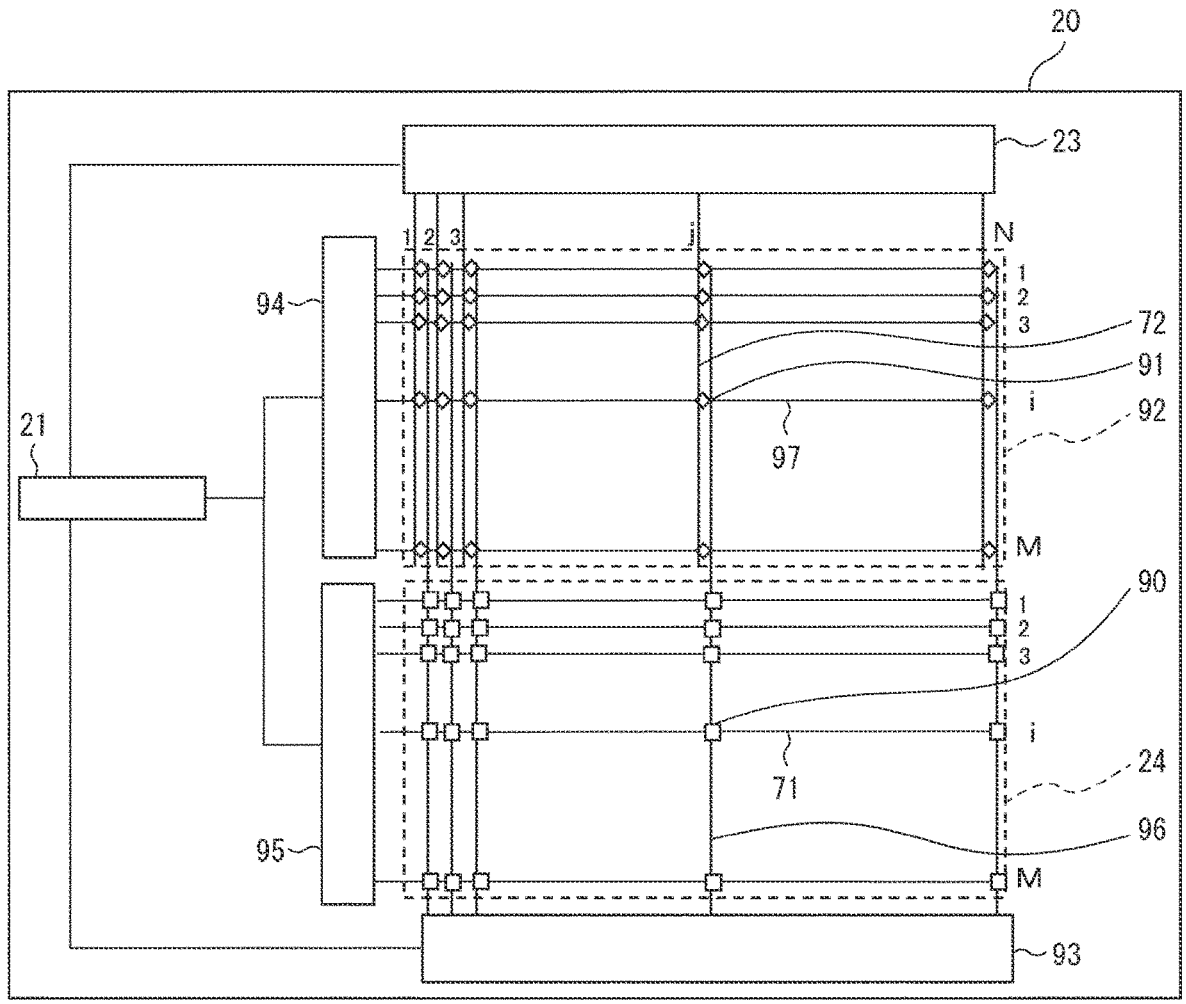

20: INTEGRATED CIRCUIT CHIP
21: IMAGE PROCESSING CIRCUIT PORTION
23: FIRST COLUMN SIGNAL OUTPUT CIRCUIT PORTION
24: PIXEL DRIVE CIRCUIT ARRAY PORTION
71: FIRST ROW-SELECTION SIGNAL LINE
72: FIRST COLUMN SIGNAL LINE
90: DRIVE CIRCUIT
91: CURRENT ADJUSTING CIRCUIT
92: CURRENT ADJUSTING CIRCUIT ARRAY PORTION
93: SECOND COLUMN SIGNAL LINE CONTROL CIRCUIT PORTION
94: SECOND ROW-SELECTION CIRCUIT PORTION
95: FIRST ROW-SELECTION CIRCUIT PORTION
96: SECOND COLUMN SIGNAL LINE
97: SECOND ROW-SELECTION SIGNAL LINE

FIG.57

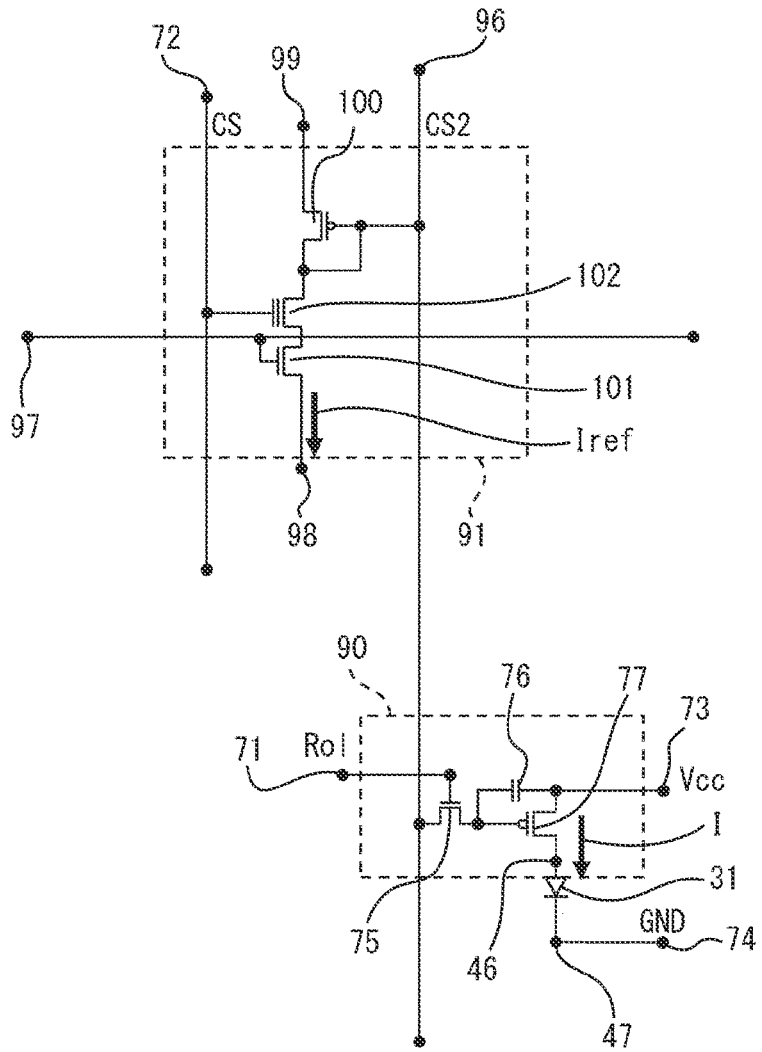

| | |
|---|---|
| 31: LIGHT EMITTING UNIT | 91: CURRENT ADJUSTING CIRCUIT |
| 46: P-SIDE ELECTRODE | 96: SECOND COLUMN SIGNAL LINE |
| 47: N-SIDE ELECTRODE | 97: SECOND ROW-SELECTION SIGNAL LINE |
| 71: FIRST ROW-SELECTION SIGNAL LINE | 98: GND LINE |
| 72: FIRST COLUMN SIGNAL LINE | 99: POWER SUPPLY LINE |
| 73: POWER SUPPLY LINE | 100: SECOND DRIVE TRANSISTOR |
| 74: GND LINE | 101: SECOND ROW-SELECTION TRANSISTOR |
| 75: FIRST ROW-SELECTION TRANSISTOR | |
| 76: VOLTAGE HOLDING CAPACITOR | 102: NONVOLATILE MEMORY TRANSISTOR |
| 77: FIRST DRIVE TRANSISTOR | I: DRIVE CURRENT |
| 90: DRIVE CIRCUIT | Iref: REFERENCE CURRENT |

FIG.58

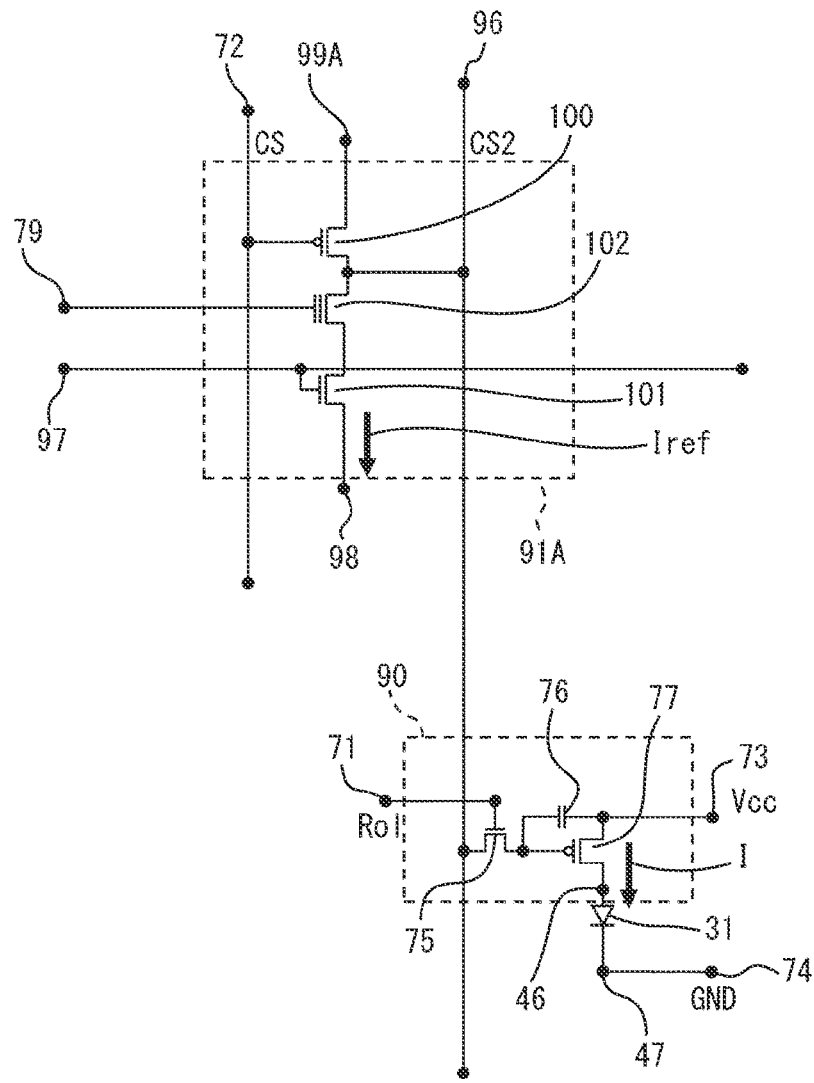

| | |
|---|---|
| 31: LIGHT EMITTING UNIT | 90: DRIVE CIRCUIT |
| 46: P-SIDE ELECTRODE | 91A: CURRENT ADJUSTING CIRCUIT |
| 47: N-SIDE ELECTRODE | 96: SECOND COLUMN SIGNAL LINE |
| 71: FIRST ROW-SELECTION SIGNAL LINE | 97: SECOND ROW-SELECTION SIGNAL LINE |
| 72: FIRST COLUMN SIGNAL LINE | 98: GND LINE |
| 73: POWER SUPPLY LINE | 99A: POWER SUPPLY LINE |
| 74: GND LINE | 100: SECOND DRIVE TRANSISTOR |
| 75: FIRST ROW-SELECTION TRANSISTOR | 101: SECOND ROW-SELECTION TRANSISTOR |
| 76: VOLTAGE HOLDING CAPACITOR | 102: NONVOLATILE MEMORY TRANSISTOR |
| 77: FIRST DRIVE TRANSISTOR | I: DRIVE CURRENT |
| 79: GATE CONTROL SIGNAL LINE | Iref: REFERENCE CURRENT |

31a: LIGHT EMITTING UNIT
46c: P-SIDE ELECTRODE
47a: N-SIDE ELECTRODE
70a: DRIVE CIRCUIT
71: ROW-SELECTION SIGNAL LINE
72: COLUMN SIGNAL LINE
73: POWER SUPPLY LINE
74: GND LINE
75: ROW-SELECTION TRANSISTOR
76: VOLTAGE HOLDING CAPACITOR
77c: DRIVE TRANSISTOR
78: NONVOLATILE MEMORY TRANSISTOR
79: GATE CONTROL SIGNAL LINE
80: TEST TRANSISTOR
81: TEST TERMINAL
I: DRIVE CURRENT

DISPLAY DEVICE

TECHNICAL FIELD

The present invention relates to a display device including a plurality of light emitting units and a manufacturing method for the same.

BACKGROUND ART

A projector, a head-up display (HUD), or the like modulates the intensity of light emitted by a light source or blocks the light by using an optical switch, in units of pixels, to project a digital image. Furthermore, a projector, a head-up display (HUD), or the like for projecting a color image combine and project images of primary colors, that is, red, green, and blue, where the primary color lights are generated by splitting light emitted by a light source into light beams of the three primary colors, or by using light sources that emit light beams of the primary colors.

Examples of the optical switch used in this manner are a liquid crystal device and a digital mirror device (DMD). Examples of the liquid crystal device are a transmissive liquid crystal panel and a reflective liquid crystal device (for example, liquid crystal on silicon (LCOS)) in which a liquid crystal layer is disposed on a liquid crystal drive circuit device constituted by a silicon large scale integrated circuit (LSI). The DMD includes micromirrors arranged for individual pixels on their drive circuits, and adjusts the angles of the micromirrors to switch light.

In a system for displaying a digital image by using the above-described optical switch, light from a light source is blocked or absorbed by liquid crystal or light is deviated from a light path by the foregoing mirrors in dark pixels. However, light is wasted in either case. Regardless of whether the image is light or dark, the amount of energy consumed by the light source is constant and large energy loss occurs. Furthermore, when a liquid crystal device is used as an optical switch, an issue arises that the contrast of the image decreases because it is difficult to perfectly block light. When a DMD is used as an optical switch, stray light resulting from light deviated from a light path may decrease the contrast. As described, in a display device using an optical switch element, such as a liquid crystal device or DMD, energy that is wastefully consumed by a light source has a negative influence on an image to be displayed.

To reduce the power consumed by a light source, there has been proposed a display device in which a self-light-emitting element is provided for each pixel. For example, PTL 1, PTL 2, NPL 1, NPL 2, and NPL 3 disclose a configuration in which drive circuits are arranged in matrix on a substrate, light emitting diodes (LEDs) are arranged in matrix on another substrate, and the drive circuits and the LEDs are connected to each other by flip chip bonding. Specifically, various configurations are disclosed: an epitaxial layer (normally an N-type epitaxial layer) of an LED is used for one electrode (normally a cathode) of the LED (NPL 1); a transparent conductive layer, not an epitaxial layer of an LED, is used as a layer for holding one electrode of the LED (PTL 2); an LED whose two electrodes are provided on surfaces oriented in the same direction is used (NPLs 1 and 2); an LED whose two electrodes are provided on surfaces oriented in opposite directions is used (PTL 1 and NPL 3); and a substrate on which an LED array is formed is selectively removed after flip chip bonding (PTL 1 and PTL 2).

In these configurations, current is supplied to LEDs from drive circuits of individual pixels in accordance with brightness information on the individual pixels. Thus, a dark LED does not consume current, and a light LED consumes only a current corresponding to its brightness. Thus, the current consumption can be significantly reduced compared to a conventional optical switch system.

In addition, as an example of the related art of the present invention, PTL 3 discloses a structure in which LEDs are bonded onto a conductive layer on a silicon substrate having drive circuits formed thereon, the conductive layer serves as a lower-side common electrode, and individual electrodes are provided on an upper side. In addition, PTL 4 discloses a structure in which quantum dots are used to convert the wavelength of light emitted by LEDs.

CITATION LIST

Patent Literature

PTL 1: Japanese Unexamined Patent Application Publication No. 10-12932
PTL 2: Japanese Unexamined Patent Application Publication No. 2002-141492
PTL 3: Japanese Patent No. 3813123
PTL 4: U.S. Pat. No. 9,111,464

Non Patent Literature

NPL 1: Liu, Z. J. et al., "Monolithic LED Microdisplay on Active Matrix Substrate Using Flip-Chip Technology", IEEE journal of selected topics in quantum electronics, Vol. 15, No. 4, pp. 1298-1302, (2009)
NPL 2: Liu, Z. J. et al., "360 PPI Flip-Chip Mounted Active Matrix Addressable Light Emitting Diode on Silicon (LEDoS) Micro-Displays", Journal of Display Technology 9(8), 678-682 (April 2013)
NPL 3: J Day et al., "III-Nitride full-scale high-resolution microdisplays", Applied Physics Letters 99(3), 031116, (2011)

SUMMARY OF INVENTION

Technical Problem

However, the above-described related art involves the following issues.

First, the LEDs used in the structures described in PTLs 1 to 3, part of PTL 4, and NPL 3 are of a so-called upper and lower electrodes type. In an LED of an upper and lower electrodes type, a cathode, an N-type epitaxial layer, a light emitting layer, a P-type epitaxial layer, and an anode are provided in this order, and the surfaces provided with the two electrodes (cathode and anode) are oriented in opposite directions. Thus, one electrode (either the cathode or the anode) provided on a surface facing a drive circuit can be connected to the drive circuit by flip chip bonding, but the other electrode provided on the opposite surface needs to be connected to the drive circuit in a different step after connecting the one electrode.

Secondly, since the LEDs are tested after connecting both electrodes, it is very difficult to replace a defective LED with a non-defective LED when the defective LED, such as an LED that does not illuminate or an LED with poor gradation, is found in the test. In the case of replacing the defective LED, it is necessary to (i) remove a wiring line for connecting the electrode of the LED provided on the surface opposite to the drive circuit to the drive circuit, (ii) replace the defective LED with a non-defective LED, and (iii) connect again the electrode of the LED provided on the surface opposite to the drive circuit to the drive circuit. These steps involve high cost and may damage the surrounding pixels, which may decrease yield. In the case of not replacing the defective LED, the defective LED directly results in a defective pixel. Therefore, it is anyway difficult to manufacture a display device with a low defect rate and high yield.

Thirdly, in the structures described in PTLs 1 and 2 and NPLs 1 to 3, there is no obstacle blocking light between LEDs. In addition, the LEDs are arranged as densely as possible to increase the number of pixels, for example, 12 µm pixels are arranged at a pitch of 15 µm in NPL 3. Thus, (i) when a transparent growth substrate of the LEDs remains in a final structure, (ii) when portions of an epitaxial layer constituting the LEDs are not completely separated from each other in individual pixels in a final structure, and (iii) when portions of an epitaxial layer constituting the LEDs are close to each other between LEDs, part of light generated in the light emitting layer of an LED emitting light (i) leaks to the epitaxial layer of an adjacent LED through the continuous transparent growth substrate or epitaxial layer or through a minute space between LEDs close to each other, and (ii) exits from the adjacent LED. This causes a phenomenon in which it looks like the adjacent LED is emitting light although the adjacent LED is not emitting light. This phenomenon increases the brightness of a dark pixel adjacent to a light pixel and decreases the brightness of a light pixel adjacent to a dark pixel, thereby decreasing the contrast of the image.

As described, the above-described related art involves (i) a first issue that the number of steps for connecting LEDs and drive circuits is large, (ii) a second issue that it is difficult to manufacture a display device with a low defect rate and high yield, and (iii) a third issue that the contrast of an image displayed by the display device is decreased.

An object of a first aspect of the present invention is to decrease the number of steps for connection in the manufacturing steps of a display device.

An object of a second aspect of the present invention is to make it possible to manufacture a display device with a low defect rate and high yield.

An object of a third aspect of the present invention is to provide a display device capable of displaying an image with higher contrast.

Solution to Problem

To solve the above-described issues, a display device according to the first aspect of the present invention includes: a plurality of light emitting units each of which includes at least one light emitting element and has a first surface and a second surface opposite to the first surface; and an integrated circuit device that includes a plurality of drive circuits each of which is configured to drive a corresponding one of the plurality of light emitting units and that has a mounting surface on which the plurality of light emitting units are mounted. The first surface faces the mounting surface, each light emitting element includes a first electrode that is disposed on the first surface, and each drive circuit includes a first drive electrode that is disposed on the mounting surface and connected to the first electrode of the light emitting element included in the corresponding light emitting unit, and includes a nonvolatile memory configured to control current supply to the first drive electrode.

To solve the above-described issues, a manufacturing method for a display device according to the first aspect of the present invention includes: a light emitting unit formation step of forming, on a first heterogeneous substrate, a plurality of light emitting units each of which includes at least one light emitting element and has a first surface and a second surface opposite to the first surface such that the second surface faces the first heterogeneous substrate; an integrated circuit device formation step of forming an integrated circuit device that includes a plurality of drive circuits each of which is configured to drive a corresponding one of the plurality of light emitting units and that has a mounting surface; a light emitting unit mounting step of mounting the plurality of light emitting units on the mounting surface of the integrated circuit device such that the first surface faces the mounting surface; and a first heterogeneous substrate separation step of selectively separating the first heterogeneous substrate from the plurality of light emitting units. Each light emitting element includes a first electrode that is disposed on the first surface, each drive circuit includes a first drive electrode that is disposed on the mounting surface and includes a nonvolatile memory configured to control current supply to the first drive electrode, and in the light emitting unit mounting step, the first drive electrode of each drive circuit is connected to the first electrode of the light emitting element included in the corresponding light emitting unit.

To solve the above-described issues, a display device according to the second aspect of the present invention includes: a plurality of light emitting units each of which includes at least one light emitting element and has a first surface and a second surface opposite to the first surface; a connection unit that has a third surface and a fourth surface opposite to the third surface; and an integrated circuit device that includes a plurality of drive circuits each of which is configured to drive a corresponding one of the plurality of light emitting units and that has a mounting surface on which the plurality of light emitting units are mounted. The first surface and the third surface face the mounting surface, each light emitting element includes a first electrode that is disposed on the first surface and a second electrode that is disposed on the second surface, the connection unit includes a third electrode that is disposed on the third surface and a fourth electrode that is disposed on the fourth surface and connected to the third electrode through an inner portion of the connection unit, each drive circuit includes a first drive electrode that is disposed on the mounting surface and connected to the first electrode of the light emitting element included in the corresponding light emitting unit, the integrated circuit device includes a second drive electrode that is disposed on the mounting surface and connected to each drive circuit through an inner portion of the integrated circuit device, the second electrode is connected to the fourth electrode, and the third electrode is connected to the second drive electrode.

To solve the above-described issues, a manufacturing method for a display device according to the second aspect of the present invention includes: a light emitting unit formation step of forming, on a first heterogeneous substrate, a plurality of light emitting units each of which includes at least one light emitting element and has a first surface and a second surface opposite to the first surface such that the second surface faces the first heterogeneous substrate; a connection unit formation step of forming, on a second heterogeneous substrate, at least one connection unit that has a third surface and a fourth surface opposite to the third surface such that the fourth surface faces the second heterogeneous substrate; an integrated circuit device formation step of forming an integrated circuit device that includes a plurality of drive circuits each of which is configured to drive a corresponding one of the plurality of light emitting units and that has a mounting surface; a light emitting unit mounting step of mounting the plurality of light emitting units on the mounting surface of the integrated circuit device such that the first surface faces the mounting surface; a connection unit mounting step of mounting the connection unit on the mounting surface of the integrated circuit device such that the third surface faces the mounting surface; a first heterogeneous substrate separation step of selectively separating the first heterogeneous substrate from the plurality of light emitting units; and a second heterogeneous substrate separation step of selectively separating the second heterogeneous substrate from the connection unit. Each light emitting element includes a first electrode that is disposed on the first surface and a second electrode that is disposed on the second surface, the connection unit includes a third electrode that is disposed on the third surface and a fourth electrode that is disposed on the fourth surface and connected to the third electrode through an inner portion of the connection unit, each drive circuit includes a first drive electrode that is disposed on the mounting surface, the integrated circuit device includes a second drive electrode that is disposed on the mounting surface and connected to each drive circuit through an inner portion of the integrated circuit device, in the connection unit mounting step, the third electrode is connected to the second drive electrode, and in the light emitting unit mounting step, the first drive electrode of each drive circuit is connected to the first electrode of the light emitting element included in the corresponding light emitting unit. The manufacturing method further includes a unit-to-unit connection step of connecting the second electrode to the fourth electrode.

To solve the above-described issues, a display device according to the third aspect of the present invention includes a plurality of light emitting units. The plurality of light emitting units are separated from each other by a reflective material that is able to reflect light emitted by the plurality of light emitting units.

To solve the above-described issues, a manufacturing method for a display device according to the third aspect of the present invention includes: a light emitting unit formation step of forming a plurality of light emitting units; and a filling-with-reflective-material step of filling spaces between the plurality of light emitting units with a reflective material that is able to reflect light emitted by the plurality of light emitting units.

Advantageous Effects of Invention

According to the first aspect of the present invention, the drive circuit includes the first drive electrode that is disposed on the mounting surface and connected to the first electrode of the light emitting element included in the corresponding light emitting unit, and includes the nonvolatile memory configured to control current supply to the first drive electrode. Accordingly, the nonvolatile memory is able to control current supply to the first electrode of the light emitting element, and is thus able to adjust the light emission intensity of the light emitting element and to cause the light emitting element to emit no light.

As a result of adjusting the light emission intensity of the light emitting element, the light emission intensity of each light emitting unit can be adjusted to be within a range of the light emission intensity required for the display device, making an effect enabling the manufacturing yield of the light emitting unit to increase and the display device to be manufactured with a low defect rate and high yield.

According to the second aspect of the present invention, the second electrode of each light emitting element is disposed on the second surface opposite to the first surface and is connected to the fourth electrode of the connection unit. Furthermore, the third electrode of the connection unit is connected to the fourth electrode in the inner portion of the connection unit. Thus, the second electrode of each light emitting element is connected to the second drive electrode of the integrated circuit device via the connection unit.

Furthermore, according to the above-described configuration, the first surface of the light emitting unit and the third surface of the connection unit face the mounting surface of the integrated circuit device. Thus, a step of connecting the first electrode on the first surface to the first drive electrode and a step of connecting the third electrode on the third surface to the second drive electrode can be integrated into the same step. Furthermore, since the second surface of the light emitting unit and the fourth surface of the connection unit faces away from the integrated circuit device, the second electrode of each light emitting element can be easily connected to the fourth electrode of the connection unit, and the second electrode and the fourth electrode can be integrated with each other.

Thus, in the light emitting element in which two electrodes are provided on surfaces oriented in opposite directions, both electrodes can be connected to the integrated circuit device substantially only by flip chip bonding. Thus, the number of steps for connection in the manufacturing steps of the display device can be reduced.

According to the third aspect of the present invention, the light emitting units are separated from each other by the reflective material. This prevents a situation from occurring where light generated in a light emitting unit leaks to a space between light emitting units, enters another light emitting unit, and is output to the outside from the other light emitting unit. Accordingly, the contrast of an image to be displayed can be increased.

BRIEF DESCRIPTION OF DRAWINGS

FIG. 26 corresponds to a cross-sectional view taken along line A-A in FIG. 1, and is a cross-sectional view of an LED display chip according to another embodiment of the present invention.

FIG. 27 corresponds to an enlarged view of the portion B defined by the broken line in FIG. 3, and is a plan view illustrating a schematic configuration of a light emitting array according to the other embodiment of the present invention.

FIG. 29 is a circuit diagram illustrating an example of a drive circuit provided in the IC chip according to the other embodiment of the present invention.

FIG. 30 is a cross-sectional view for describing part of exemplary manufacturing steps of the light emitting array according to the other embodiment of the present invention.

FIG. 31 is a cross-sectional view for describing part of the exemplary manufacturing steps of the light emitting array according to the other embodiment of the present invention.

FIG. 41 is a circuit diagram illustrating an example of a drive circuit provided in an IC chip according to still another embodiment of the present invention.

FIG. 42 is a cross-sectional view for describing part of exemplary manufacturing steps of a light emitting array according to still another embodiment of the present invention.

FIG. 43 is a cross-sectional view for describing part of the exemplary manufacturing steps of the light emitting array according to the still another embodiment of the present invention.

FIG. 56 is a schematic diagram illustrating an example of a schematic configuration of an IC chip according to still another embodiment of the present invention.

FIG. 57 is a circuit diagram illustrating an example of a drive circuit and a current adjusting circuit of the IC chip according to the still another embodiment of the present invention.

FIG. 58 is a circuit diagram illustrating an example of a drive circuit and a current adjusting circuit of an IC chip according to still another embodiment of the present invention.

DESCRIPTION OF EMBODIMENTS

Hereinafter, some embodiments of the present invention will be described in detail with reference to the drawings. Note that the dimensions, materials, shapes, and relative positions of components described in the embodiments are merely examples of the embodiments and should not limit the scope of the present invention.

In this description, the term "light emitting diode (LED)" means a light source portion of each pixel. Specifically, an LED includes a light emitting layer, an epitaxial layer for supplying holes or electrons to the light emitting layer, and an electrode for connecting the epitaxial layer to a wiring line. The LED may be provided with but does not include a wavelength conversion layer for converting the wavelength of light emitted from the light emitting layer.

In this description, the term "light emitting unit" means a unit including one or more LEDs. A light emitting unit including only one LED is an LED.

In this description, the term "unit separation" means (i) a state where a single circuit element or a plurality of circuit elements integrated into one body is separated as a unit from an adjacent circuit element, for example, a state where light emitting units are separated from each other or a light emitting unit and a wiring unit are separated from each other, and (ii) an operation of separating a single circuit element or a plurality of circuit elements integrated into one body as a unit from an adjacent circuit element to generate the state. Unit separation of a light emitting unit including only one LED is equivalent to a so-called "element separation".

First Embodiment

Hereinafter, an embodiment of the present invention will be described in detail with reference to FIG. 1 to FIG. 25.
(Configuration of LED Display Chip)

Hereinafter, a schematic configuration of an LED display chip 1 will be described.

Figure 1:
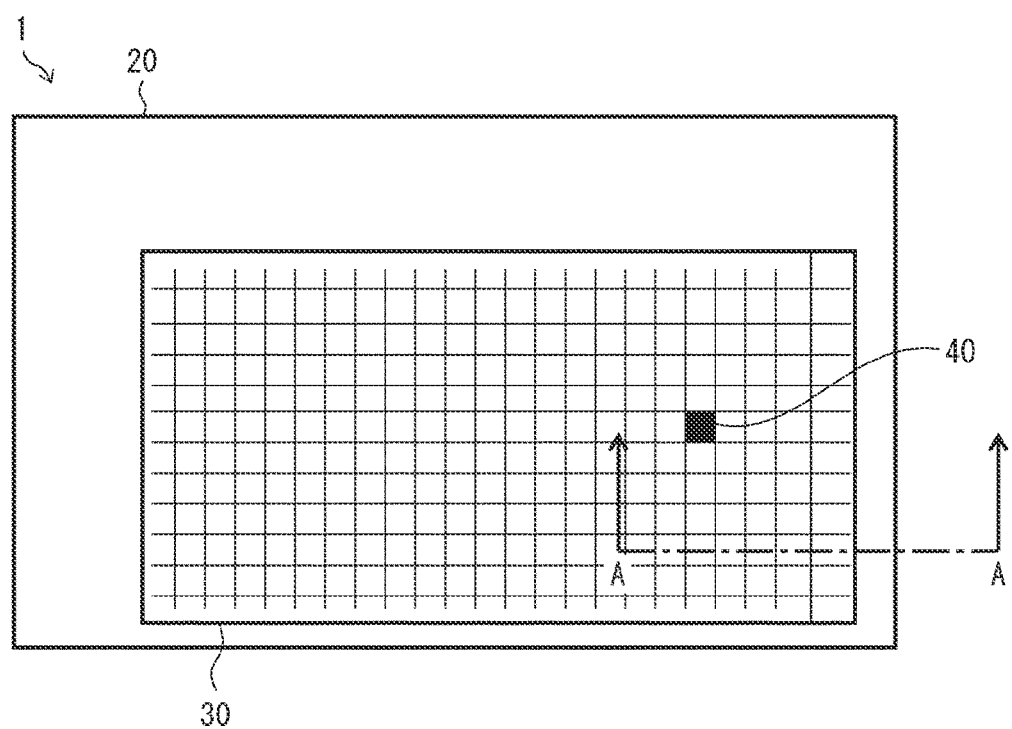
FIG. 1 is a plan view for describing a schematic configuration of an LED display chip according to some embodiments of the present invention.

FIG. 1 is a schematic diagram for describing the schematic configuration of the LED display chip 1 according to a first embodiment of the present invention. FIG. 1 is a top view of the LED display chip 1.

As illustrated in FIG. 1, the LED display chip 1 includes an integrated circuit (IC) chip 20 and a light emitting array 30 mounted on a mounting surface of the IC chip 20 (integrated circuit device). The LED display chip 1 may arbitrarily include an adhesive layer (not illustrated) including a resin layer, metallic particles, or the like for bonding the IC chip 20 and the light emitting array 30, a wavelength conversion layer (not illustrated) for converting the wavelength of light emitted by the light emitting array 30, and so forth. The IC chip 20 and the light emitting array 30 are able to form a plurality of pixels 40 in cooperation with each other. The LED display chip 1 includes the plurality of pixels 40.

The pixels 40 are two-dimensionally arranged in N rows and M columns, the total number of which is N×M (N and M are natural numbers). For example, in a display of the full high definition standard, N=1080 and M=1920, and the number of the pixels 40 is about two million.

Figure 2:
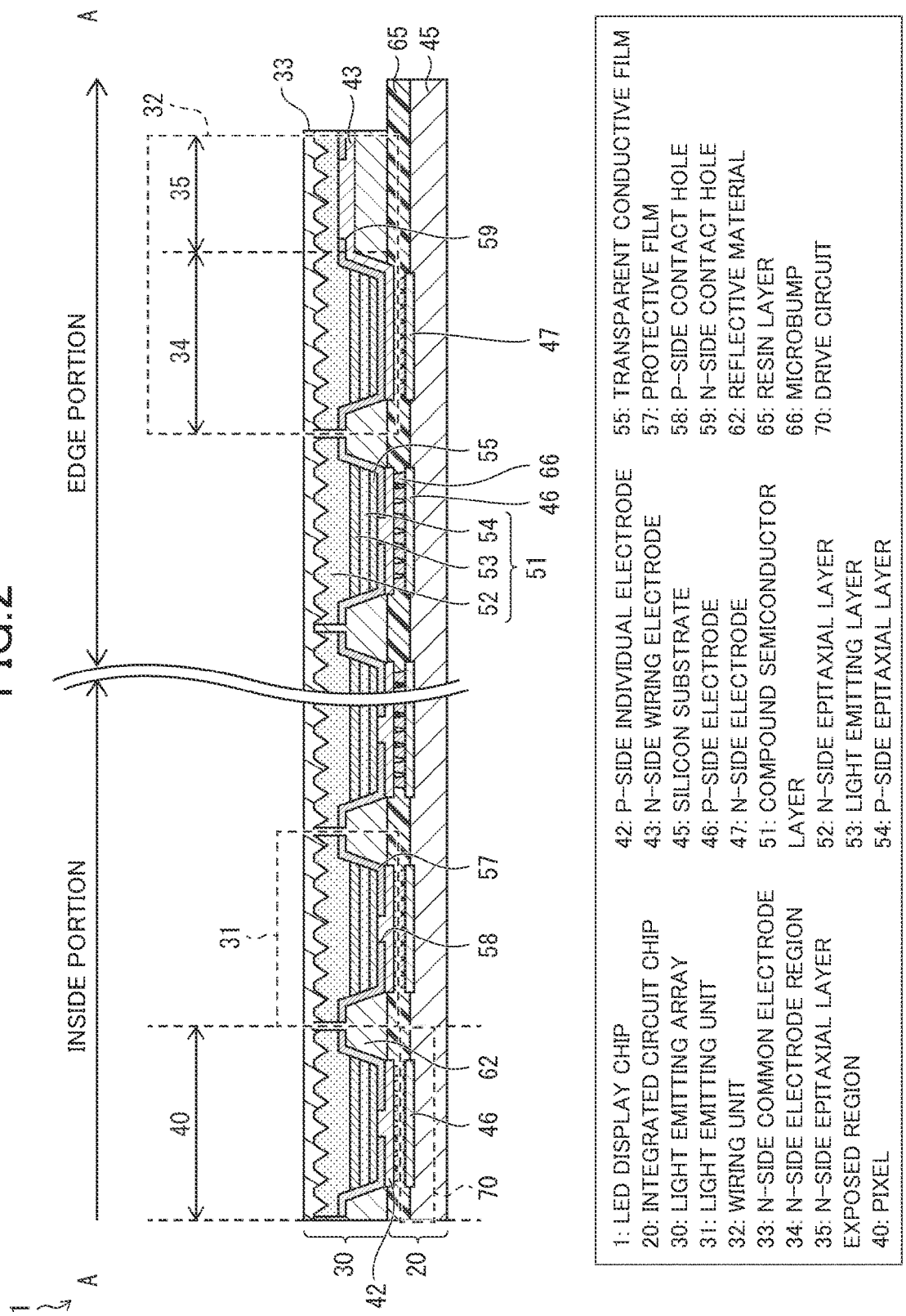
FIG. 2 corresponds to a cross-sectional view taken along line A-A in FIG. 1, and is a cross-sectional view of an LED display chip according to one embodiment of the present invention.

FIG. 2 corresponds to a cross-sectional view taken along line A-A of the LED display chip 1 illustrated in FIG. 1, and is a cross-sectional view of the LED display chip 1 according to the first embodiment.

As illustrated in FIG. 2, the light emitting array 30 includes a compound semiconductor layer 51 including an N-side epitaxial layer 52, a light emitting layer 53, and a P-side epitaxial layer 54 that are stacked in this order; a transparent conductive film 55 that is in contact with the P-side epitaxial layer 54; a protective film 57 for protecting the compound semiconductor layer 51 and the transparent conductive film 55; P-side individual electrodes 42 that are in contact with the transparent conductive film 55 through P-side contact holes 58 provided in the protective film 57; N-side wiring electrodes 43 (third electrode) that are in contact with the N-side epitaxial layer 52 through N-side contact holes 59 provided in the protective film 57; a reflective material 62 that fills the spaces between portions of the compound semiconductor layer 51 that is divided into units (light emitting units 31 and wiring units 32); and an N-side common electrode 33 (second electrode, fourth electrode) that is in contact with the N-side epitaxial layer 52.

The light emitting array 30 is constituted by a plurality of light emitting units 31 (light emitting units each of which includes at least one light emitting element) and a plurality of wiring units 32 (connection units). In the present embodiment, the LED display chip 1 performs single-color display, and thus each pixel 40 may include only one light emitting unit 31 and the one light emitting unit 31 may be only one LED (light emitting element). Alternatively, each pixel 40 may include a plurality of light emitting units 31 and each light emitting unit 31 may include a plurality of LEDs (light emitting elements). Alternatively, the LED display chip 1 may perform multi-color display.

Each light emitting unit 31 includes the P-side individual electrode 42 (first electrode), which is an anode, disposed on a downward-facing surface in FIG. 2 (first surface), and the N-side common electrode 33 (second electrode), which is a cathode, disposed on an upward-facing surface in FIG. 2 (second surface). The downward-facing surface in FIG. 2 and the upward-facing surface in FIG. 2 are oriented in opposite directions. The light emitting unit 31 is an LED of a so-called upper and lower electrodes type including a cathode and an anode disposed on surfaces oriented in opposite directions. Each wiring unit 32 includes an N-side electrode region 34 and an N-side epitaxial layer exposed region 35. The N-side wiring electrode 43 is at the same height (the position in the thickness direction of the light emitting array 30) as the P-side individual electrode 42 in the N-side electrode region 34, and is in contact with the N-side epitaxial layer 52 in the N-side epitaxial layer exposed region 35.

The wiring unit 32 has a multilayer structure similar to that of the light emitting unit 31 but does not have a function of emitting light. With such a similar multilayer structure, the wiring unit 32 can be manufactured at the same time as the step of manufacturing the light emitting unit 31 without adding a new step. The wiring unit 32 includes the N-side wiring electrode 43 (third electrode) disposed on a downward-facing surface in FIG. 2 (third surface), and the N-side common electrode 33 (fourth electrode), which is shared with the light emitting unit 31, disposed on an upward-facing surface in FIG. 2 (fourth surface). The wiring unit 32 is a dedicated wiring unit for connecting the N-side common electrode 33 of the light emitting array 30 to an N-side electrode 47 of the IC chip 20.

As illustrated in FIG. 2, the IC chip 20 includes a silicon substrate 45 with multilayer wiring (not illustrated) and circuit elements (not illustrated) formed therein; P-side electrodes 46 (first drive electrode) and N-side electrodes 47 (second drive electrode) disposed on the uppermost surface of the silicon substrate 45; microbumps 66 disposed on the P-side electrodes 46 and the N-side electrodes 47; and a resin layer 65 that covers the uppermost surface of the silicon substrate 45, the P-side electrodes 46, the N-side electrodes 47, and the microbumps 66. The silicon substrate 45 includes drive circuits 70 each of which drives a corresponding one of the light emitting units 31 of the light emitting array 30. Each drive circuit 70 includes the P-side electrode 46.

The IC chip 20 and the light emitting array 30 are mechanically bounded to each other by adhesion using the resin layer 65. The IC chip 20 and the light emitting array 30 are electrically connected to each other by the connections between the P-side individual electrodes 42 and the P-side electrodes 46 and between the N-side wiring electrodes 43 and the N-side electrodes 47 via the microbumps 66. In an inner portion of the wiring unit 32 (an inner portion of a connection unit), the N-side common electrode 33 and the N-side wiring electrode 43 are connected to each other through the N-side epitaxial layer 52 in the N-side epitaxial layer exposed region 35. Thus, the N-side common electrode 33 of the light emitting array 30 is connected to the N-side electrode 47 of the IC chip 20 through the N-side epitaxial layer 52, the N-side wiring electrode 43, and the microbumps 66.

In this way, the wiring units 32 enable the light emitting array 30 to be connected to the IC chip 20 using only flip chip die bonding, and accordingly assembly steps of mounting the light emitting array 30 on the IC chip 20 can be simplified.

(Light Emitting Array)

Hereinafter, the light emitting array 30 will be described in detail with reference to FIG. 2 to FIG. 4.

Figure 3:
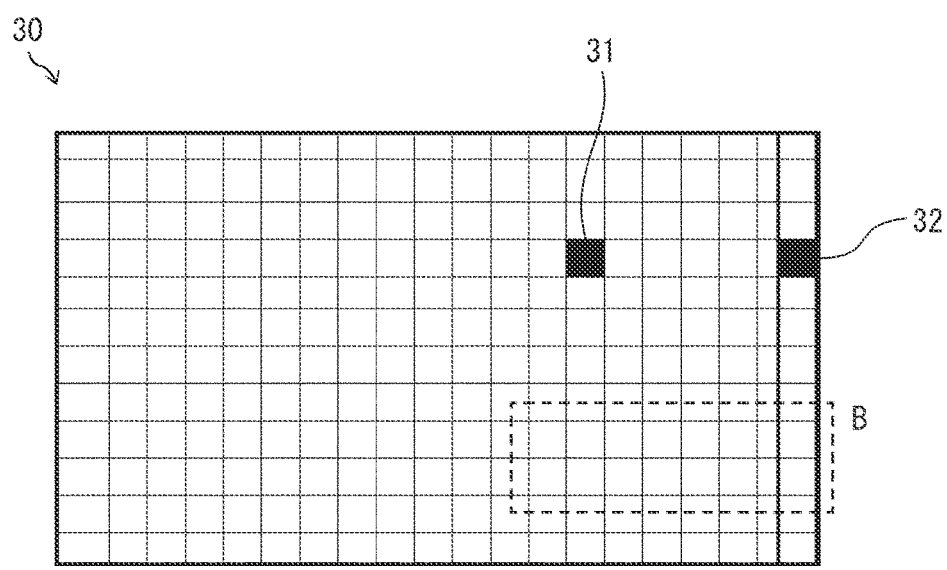
FIG. 3 is a plan view illustrating an exemplary arrangement of light emitting units and wiring units in a light emitting array included in the LED display chip according to some embodiments of the present invention.

FIG. 3 is a plan view illustrating an exemplary arrangement of the light emitting units 31 and the wiring units 32 in the light emitting array 30 included in the LED display chip 1 according to the first embodiment.

In the example illustrated in FIG. 3, the light emitting units 31 are arranged to form a group, specifically, in an inside portion and three edge portions of the light emitting array 30. The light emitting units 31 are arranged in matrix in N rows and M columns and correspond to the pixels 40 of the LED display chip 1 illustrated in FIG. 1. In the light emitting array 30, a portion occupied by the light emitting units 31 is an effective portion of the light emitting array 30. For example, when the light emitting units 31 are arranged such that the number of effective pixels of the VGA standard is 480×640, each light emitting unit 31 having an area of 10 µm×10 µm, the effective portion of the light emitting array 30 has an area of 4.8 mm×6.4 mm. The light emitting units 31 may be integrated in 30 rows and 30 columns at a pitch of 140 µm or in 60 row and 60 columns at a pitch of 70 µm as in NPL 2, or may be integrated in 160 columns and 120 rows as in NPL 3, or may be arranged in any other manner.

The wiring units 32 are arranged next to the outer periphery of the light emitting units 31 that are arranged to form a group, specifically, in the other edge portion of the light emitting array 30. As the number of arranged wiring units 32 increases, the wiring resistance between the N-side common electrode 33 of the light emitting array 30 and the N-side electrodes 47 of the IC chip 20 decreases. Thus, it is preferable that the number of wiring units 32 be large, for example, it is preferable that the wiring units 32 be arranged in all the four edge portions of the light emitting array 30. When the area of the effective portion of the light emitting array 30 is the same, the area of the light emitting array 30 increases as the number of wiring units 32 increases. Thus, it is also preferable that the number of wiring units 32 be moderately large, for example, it is preferable that the wiring units 32 be arranged in two edge portions facing each other of the light emitting array 30.

In FIG. 3, the wiring units 32 are arranged in only one column at the outermost edge of the light emitting array 30 so as to be adjacent to the light emitting units 31. This is merely schematic illustration for simplifying the illustration. Alternatively, for example, dummy units may be arranged to avoid variation in luminous characteristics caused by variation in film thickness or line width at an edge portion of the light emitting array 30 during manufacturing steps. In the case of arranging dummy units, dummy units having the same shape as that of the light emitting units 31 may be arranged between the light emitting units 31 and the wiring units 32, dummy units having a shape different from that of the light emitting units 31 may be arranged outside the wiring units 32, or both types of dummy units may be arranged. Another arrangement pattern may also be employed. Alternatively, to reduce the wiring resistance, the wiring units 32 may be arranged in an inside portion of the light emitting array 30, that is, between the light emitting units 31, although the pitch of the pixels 40 is slightly changed. Alternatively, the wiring units 32 also functioning as dummy units may be arranged. Alternatively, to reduce the wiring resistance, the wiring units 32 may be arranged in two columns and/or two rows.

(Unit Configuration in Light Emitting Array)

Hereinafter, the schematic configurations of the light emitting units 31 and the wiring units 32 in the light emitting array 30 will be described in detail with reference to FIG. 2 and FIG. 4.

Figure 4:
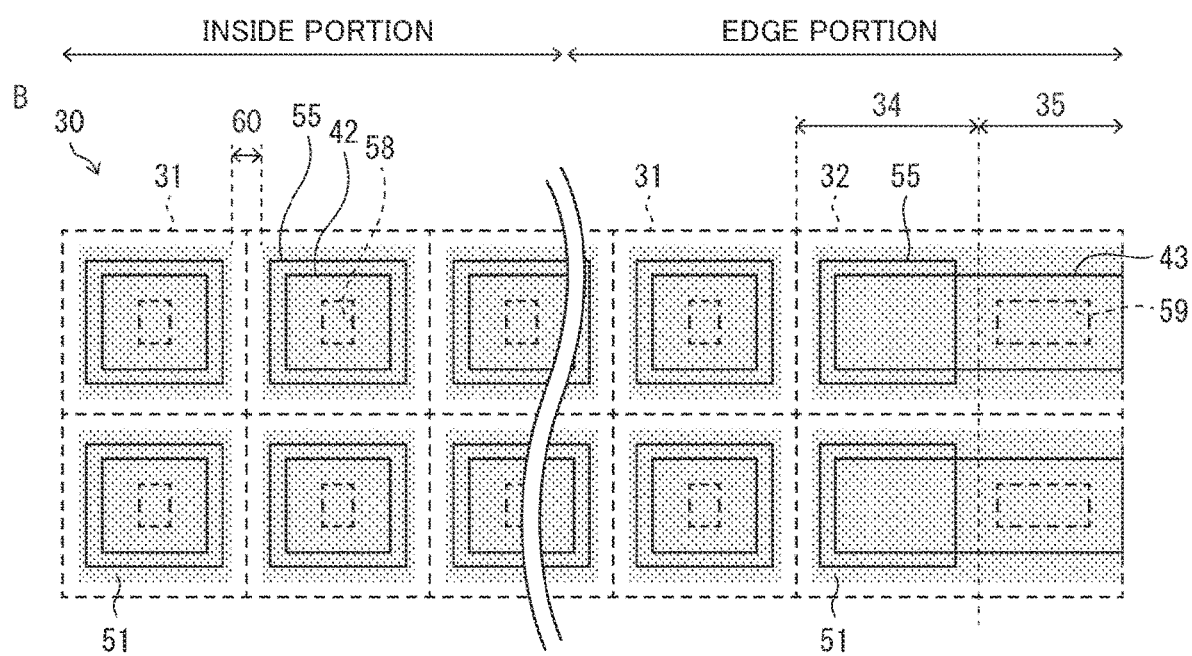
FIG. 4 corresponds to an enlarged view of a portion B defined by a broken line in FIG. 3, and is a plan view illustrating a schematic configuration of a light emitting array according to the one embodiment of the present invention.

FIG. 4 corresponds to an enlarged view of a portion B defined by a broken line in FIG. 3, and is a plan view of the light emitting array 30 according to the present first embodiment viewed from a side where the P-side individual electrodes 42 and the N-side wiring electrode 43 illustrated in FIG. 2 exist. For convenience of illustration, an inside portion of the light emitting array 30 is illustrated on the left in FIG. 4, and an edge portion of the light emitting array 30 is illustrated on the right in FIG. 4, with the other portion not being illustrated.

As illustrated in FIG. 4, the light emitting array 30 is constituted by the plurality of light emitting units 31 and the plurality of wiring units 32. The compound semiconductor layer 51 has portions corresponding to the units, and the portions are separated from each other by unit separation grooves 60. The reflective material 62 is at least able to reflect the light emitted by the light emitting units 31. The unit separation grooves 60 are filled with the reflective material 62 illustrated in FIG. 2, so that the leakage of light is suppressed and the individual light emitting units 31 are optically separated from each other. The unit separation grooves 60 contribute to a reduction of distortion and stress, as well as to the optical separation. Thus, it is preferable that the unit separation grooves 60 be provided also between the light emitting unit 31 and the wiring unit 32 and between the wiring units 32. Although it is preferable that the light emitting units 31 be optically separated from each other, the wiring units 32 need not necessarily be separated from each other. Thus, the unit separation grooves 60 need not necessarily be provided between the light emitting unit 31 and the wiring unit 32 and between the wiring units 32. The light emitting unit 31 and the wiring unit 32 adjacent to each other may be integrated, or the wiring units 32 may be integrated.

In each light emitting unit 31, the P-side individual electrode 42 is in contact with the transparent conductive film 55 through the P-side contact hole 58 represented by a broken line. In each wiring unit 32, the N-side wiring electrode 43 is in contact with the N-side epitaxial layer 52 of the compound semiconductor layer 51 through the N-side contact hole 59 in the N-side epitaxial layer exposed region 35, and is thus not in contact with the transparent conductive film 55 in the N-side electrode region 34. The transparent conductive film 55 may be replaced with a metallic multilayer film including a metallic thin film that is in contact with the compound semiconductor film 51 and has high interface reflectivity, for example, a thin film made of aluminum, silver, or the like. When the size of each light emitting unit 31 is small, for example, several μm (a size within a perfect circle with a diameter of 10 μm), the transparent conductive film 55 may be omitted.

(Configuration of IC Chip)

Hereinafter, the schematic configuration of the IC chip 20 will be described in detail with reference to FIG. 5.

Figure 5:
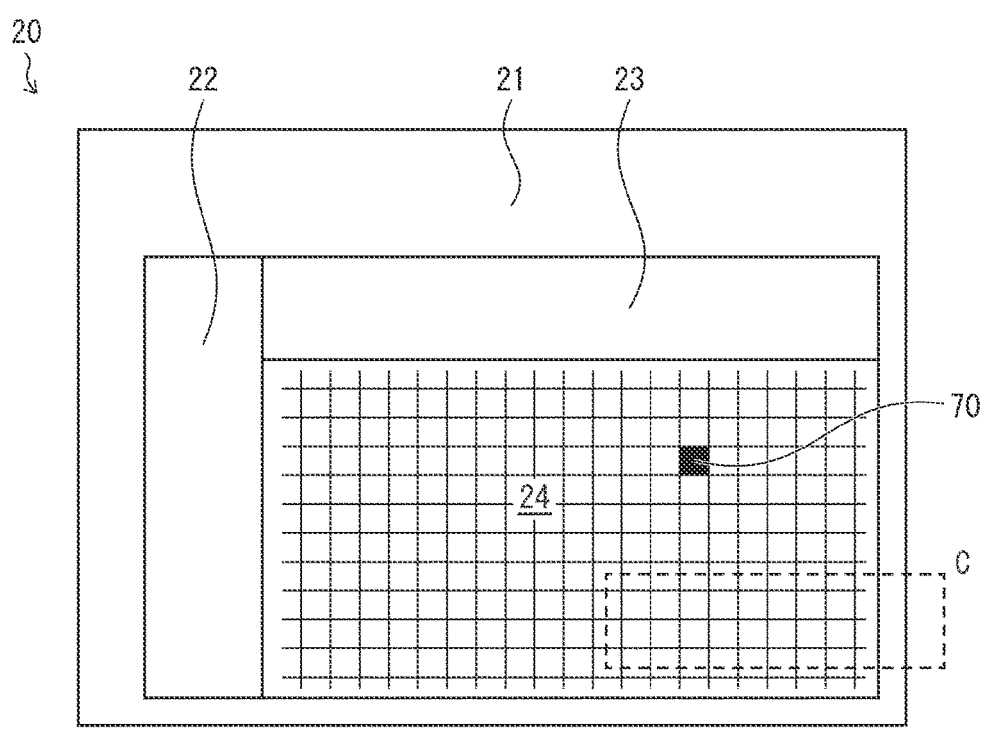
FIG. 5 is a plan view illustrating a schematic arrangement of individual circuit portions in an integrated circuit (IC) chip included in the LED display chip according to some embodiments of the present invention.

FIG. 5 is a plan view illustrating a schematic arrangement of individual circuit portions in the IC chip 20 according to the first embodiment.

As illustrated in FIG. 5, the IC chip 20 includes an image processing circuit portion 21, a row-selection circuit portion 22, a column signal output circuit portion 23, and a pixel drive circuit array portion 24 including a plurality of drive circuits 70. The IC chip 20 supplies power to the light emitting array 30 and controls light emission of the light emitting array 30.

Figure 8:
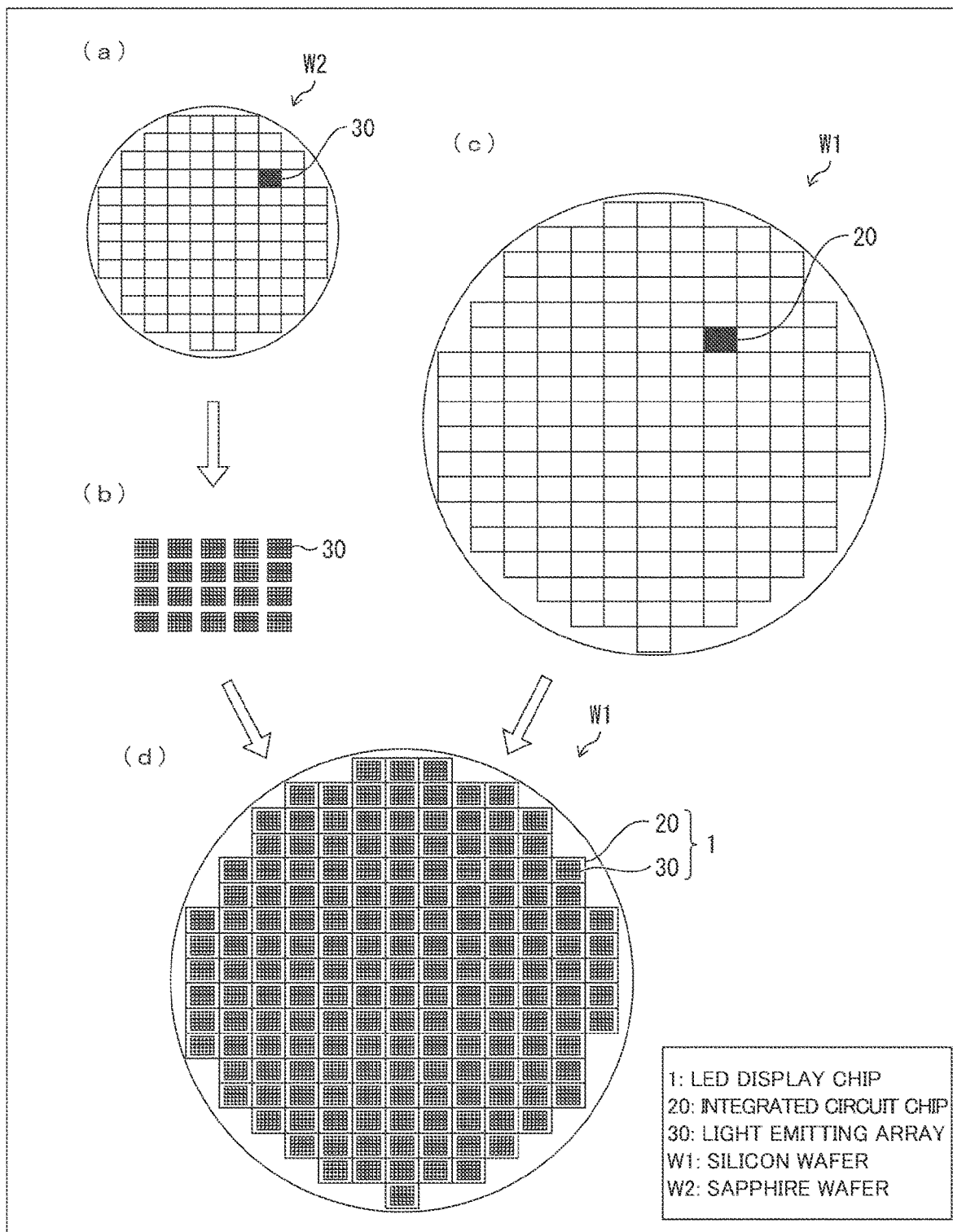
FIG. 8 is a diagram for describing exemplary manufacturing steps of LED display chips according to some embodiments of the present invention.

The image processing circuit portion 21, the row-selection circuit portion 22, the column signal output circuit portion 23, and the pixel drive circuit array portion 24 included in the IC chip 20 correspond to a large scale integrated circuit (LSI) monolithically formed on a silicon wafer W1 (see FIG. 8). The above-mentioned circuit portions (the image processing circuit portion 21, the row-selection circuit portion 22, the column signal output circuit portion 23, and the pixel drive circuit array portion 24) included in the IC chip 20 can be formed by a normal complementary metal oxide semiconductor (CMOS) process and another process. The process capable of forming the IC chip 20 (integrated circuit device formation step) is obvious to a person skilled in the art, and thus the detailed description thereof is omitted. In the present first embodiment, the IC chip 20 is formed on the silicon wafer W1, but this is an example and is not intended to limit the scope of the present invention. The wafer on which the IC chip 20 is formed may be a semiconductor substrate on which a semiconductor IC can be formed, and may be, for example, a silicon on insulator (SOI) substrate, a gallium arsenide substrate, a gallium nitride substrate, or the like.

The image processing circuit portion 21 processes image data input thereto and outputs a processing result to the row-selection circuit portion 22 and the column signal output circuit portion 23. The row-selection circuit portion 22 is disposed at an edge portion in the row direction of the pixel drive circuit array portion 24 and selects, on the basis of the processing result from the image processing circuit portion 21, a row of the drive circuits 70 in which a column signal from the column signal output circuit portion 23 is to be written. The column signal output circuit portion 23 is disposed at an edge portion in the column direction of the pixel drive circuit array portion 24 and outputs, on the basis of the processing result from the image processing circuit portion 21, a column signal to be written in the drive circuits 70 arranged in the row selected by the row-selection circuit portion 22, thereby controlling light emission by the light emitting units 31. The possible configurations and functions of the image processing circuit portion 21, the row-selection circuit portion 22, and the column signal output circuit portion 23 are known to a person skilled in the art, and thus the detailed description thereof is omitted.

Figure 6:
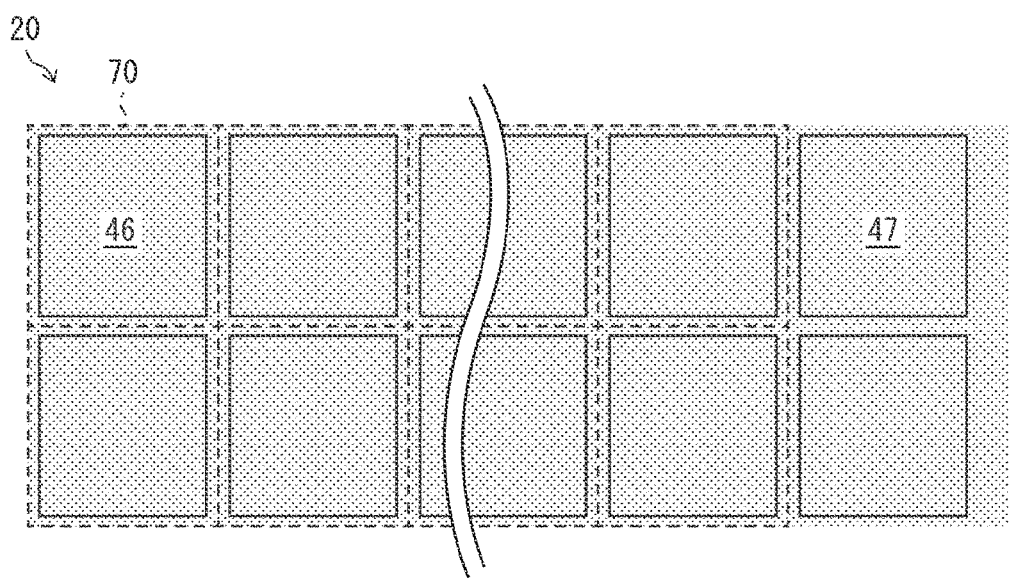
FIG. 6 corresponds to an enlarged view of a portion C defined by a broken line in FIG. 5, and is a plan view illustrating a schematic configuration of an IC chip according to the one embodiment of the present invention.

FIG. 6 corresponds to an enlarged view of a portion C defined by a broken line in FIG. 5, and is a plan view from the side where the P-side electrodes 46 and the N-side electrode 47 illustrated in FIG. 2 exist, in which the resin layer 65 and the microbumps 66 are not illustrated. For convenience of illustration, an inside portion of the pixel drive circuit array portion 24 is illustrated on the left in FIG.

6, and an edge portion of the pixel drive circuit array portion 24 is illustrated on the right in FIG. 6, with the other portion not being illustrated.

As illustrated in FIG. 6, the pixel drive circuit array portion 24 includes the drive circuits 70 for driving the light emitting units 31 of the light emitting array 30 and also includes the N-side electrodes 47 connected to the N-side wiring electrodes 43 of the wiring units 32 of the light emitting array 30. In the exemplary configuration illustrated in FIG. 6, the N-side electrodes 47 are separated from each other. However, the N-side electrodes 47 are connected to the same N-side common electrode 33 via the N-side wiring electrodes 43 and thus may be integrated together.

Each drive circuit 70 is a circuit for driving a corresponding one of the light emitting units 31 and includes the P-side electrode 46 connected to the P-side individual electrode 42 of the light emitting unit 31. The drive circuits 70 correspond to the light emitting units 31 and are arranged in matrix in N rows and M columns. Each drive circuit 70 is able to constitute a pixel 40 together with the light emitting unit 31. Thus, the area of the drive circuits 70 in the pixel drive circuit array portion 24 is equivalent to the area of the light emitting units 31 in the light emitting array 30, and the area of the pixel drive circuit array portion 24 is substantially equivalent to the area of the light emitting array 30. As a result, for example, the area of the effective portion of the light emitting array 30 is 4.8 mm×6.4 mm, whereas the area of the IC chip 20 including the pixel drive circuit array portion 24, the image processing circuit portion 21, the row-selection circuit portion 22, and the column signal output circuit portion 23 is 8 mm×10 mm.

(Drive Circuit)

Hereinafter, the drive circuit 70 will be described in detail with reference to FIG. 7.

Figure 7:
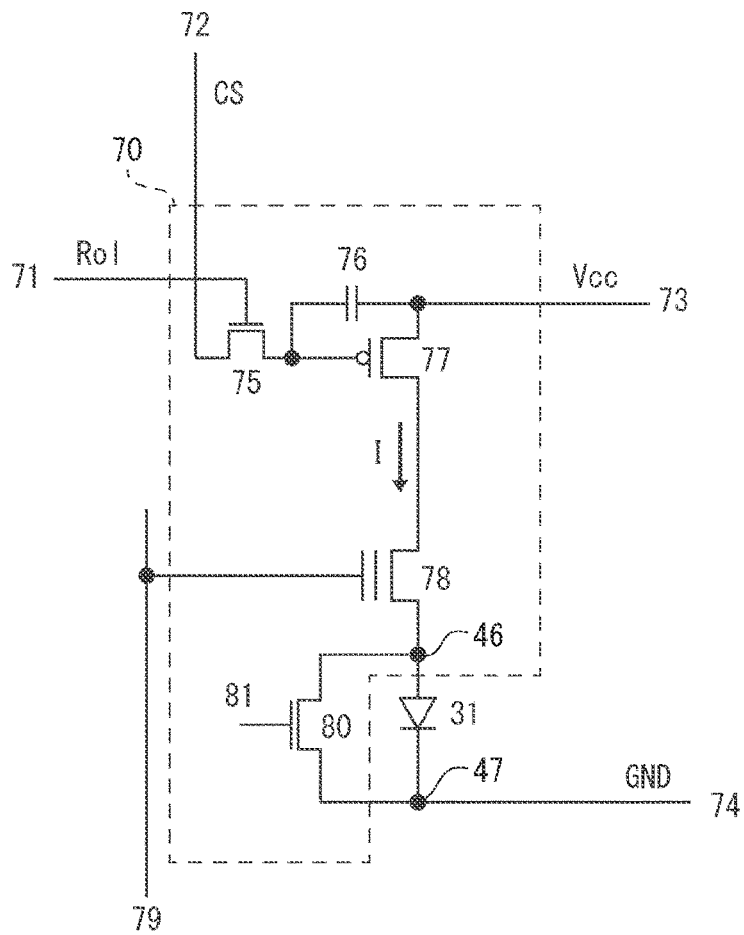
FIG. 7 is a circuit diagram illustrating an example of a drive circuit provided in the IC chip according to the one embodiment of the present invention.

FIG. 7 is a circuit diagram illustrating an example of the drive circuit 70 according to the first embodiment. The drive circuit 70 is not limited to the example illustrated in FIG. 7, and the circuit configurations of various known pixel drive circuits may be used in combination with various circuit elements functioning as a nonvolatile memory.

As illustrated in FIG. 7, the drive circuit 70 is connected to a row-selection signal line 71 for transmitting a row-selection signal Rol output from the row-selection circuit portion 22, a column signal line 72 for transmitting a column signal CS output from the column signal output circuit portion 23, a power supply line 73 for supplying a power supply voltage Vcc, the N-side electrode 47, a GND line 74 for providing a ground GND, and a gate control signal line 79 for supplying a control gate voltage. The drive circuit 70 includes a row-selection transistor 75, a voltage holding capacitor 76, a drive transistor 77, a nonvolatile memory transistor 78, a test transistor 80, a test terminal 81, and the P-side electrode 46. In addition, the drive circuit 70 is connected to the light emitting unit 31 when the light emitting array 30 is mounted on the IC chip 20.

When not writing a signal in the nonvolatile memory transistor 78, the gate control signal line 79 supplies an operating control gate voltage (for example, 5 V to 12 V) that is able to turn ON the nonvolatile memory transistor 78 in which a signal to hold an OFF state is not written. When writing a signal so that the nonvolatile memory transistor 78 holds an OFF state, the gate control signal line 79 appropriately supplies a writing control gate voltage that is able to inject electrons to the floating gate. The injection of electrons to the floating gate increases a threshold value at which the nonvolatile memory transistor 78 shifts from an OFF state to an ON state. Thus, the nonvolatile memory transistor 78 holds an OFF state when being supplied with an operating control gate voltage. The writing control voltage is adjusted depending on the size and structure of the nonvolatile memory transistor 78. For example, a voltage of 4 V to 12 V is applied to the control gate terminal in a state where a power supply voltage Vcc of 3 V to 6 V is applied to the drain terminal and a ground voltage GND of 0 V is applied to the source terminal. A write operation of the nonvolatile memory transistor 78 requires a current flowing between the drain and source of the nonvolatile memory transistor 78. The signal written in the nonvolatile memory transistor 78 is erased by irradiation with ultraviolet rays or the like.

The row-selection transistor 75 is, for example, an N-type MOS transistor. In the row-selection transistor 75, the gate terminal is connected to the row-selection signal line 71, the drain terminal is connected to the column signal line 72, and the source terminal is connected to one of the electrodes of the voltage holding capacitor 76 and the gate terminal of the drive transistor 77. Accordingly, the gate terminal of the drive transistor 77 is connected to the column signal line 72 via the row-selection transistor 75.

In the voltage holding capacitor 76, the other electrode is connected to the power supply line 73 and the source terminal of the drive transistor 77. Accordingly, the gate terminal of the drive transistor 77 is connected to the power supply line 73 via the voltage holding capacitor 76.

The drive transistor 77 is, for example, a P-type MOS transistor. The drain terminal of the drive transistor 77 is connected to the drain terminal of the nonvolatile memory transistor 78. Accordingly, the drain terminal of the nonvolatile memory transistor 78 is connected to the power supply line 73 via the drive transistor 77.

The nonvolatile memory transistor 78 is, for example, a stacked gate transistor including a floating gate. The nonvolatile memory transistor 78 is not limited thereto and may be another type of transistor, for example, a charge trap transistor, as long as it functions as a nonvolatile memory. Alternatively, a circuit element that functions as a nonvolatile memory and is not a transistor and a transistor that does not function as a nonvolatile memory may be used in combination, instead of the nonvolatile memory transistor 78. In the nonvolatile memory transistor 78, the control gate terminal is connected to the gate control signal line 79, and the source terminal is connected to the P-side electrode 46 and the drain terminal of the test transistor 80. Accordingly, the drain terminal of the test transistor 80 is connected to the power supply line 73 via the drive transistor 77 and the nonvolatile memory transistor 78. When the P-side individual electrode 42 of the light emitting unit 31 is connected to the P-side electrode 46 of the drive circuit 70, the light emitting unit 31 is connected to the power supply line 73 via the P-side electrode 46, the nonvolatile memory transistor 78, and the drive transistor 77.

In the test transistor 80, the gate terminal is connected to the test terminal 81, and the source terminal is connected to the N-side electrode 47 and the GND line 74. Accordingly, the P-side electrode 46 of each drive circuit 70 can be short-circuited to the N-side electrode 47 via the test transistor 80.

With the circuit configuration illustrated in FIG. 7, during a selection period over which the row-selection circuit portion 22 selects the row-selection signal lines 71 of I rows (I is a natural number equal to or smaller than N), in the drive circuits 70 belonging to the I rows, (i) the row-selection signal Rol transmitted to the drive circuits 70 of the I rows has an ON voltage, (ii) the source-drain of the row-selection transistor 75 is in an ON state, (iii) a column signal CS is applied to the gate terminal of the drive transistor 77, and (iv) the voltage holding capacitor 76 accumulates or discharges charges so that the difference in voltage between the electrodes of the voltage holding capacitor 76 becomes equal to the difference in voltage between the signal voltage of the column signal CS and the power supply voltage Vcc. At this time, when the column signal CS has an ON voltage, the source-drain of the drive transistor 77 is in an ON state and the drive current I flows. On the other hand, when the column signal CS has an OFF voltage, the source-drain of the drive transistor 77 is in an OFF state.

After the selection period over which the row-selection signal lines 71 of the I rows are selected ends, in the drive circuits 70 belonging to the I rows, (i) the row-selection signal Rol transmitted to the drive circuits 70 of the I rows is OFF, (ii) the source-drain of the row-selection transistor 75 is in an OFF state, and (iii) the voltage holding capacitor 76 enables the gate terminal of the drive transistor 77 to hold a voltage when the column signal CS is applied, until the next selection period (during a non-selection period). Thus, the ON state or OFF state in the preceding selection period can be held between the source and drain of the drive transistor 77.

A switch may be added to the power supply line 73 or the GND line 74 in FIG. 7. After a selection period, the added switch is kept in an ON state only during a part of a non-selection period and is kept in an OFF state during the rest of the period, thereby making the light emission time of the light emitting unit 31 shorter than the total length of the selection period and the non-selection period. As a result of shortening the light emission time of the light emitting unit 31, the visual brightness of the entire LED display chip 1 can be decreased.

In addition, with the circuit configuration illustrated in FIG. 7, it is possible to set whether or not to cause a drive current to flow through the mounted light emitting unit 31 by using the nonvolatile memory transistor 78. Specifically, by causing the source-drain of the nonvolatile memory transistor 78 to be in an OFF state, it is possible to cause the drive current I not to flow through the test transistor 80 and the light emitting unit 31. Supplying a writing control gate voltage from the gate control signal line 79 makes it possible to inject electrons to the floating gate of the nonvolatile memory transistor 78 so that the threshold voltage of the nonvolatile memory transistor 78 increases and to write a signal so that the nonvolatile memory transistor 78 holds an OFF state. The nonvolatile memory transistor 78 in which a signal is written to hold an OFF state has a high threshold voltage. Thus, even when an operating control gate voltage is supplied from the gate control signal line 79, the source-drain of the nonvolatile memory transistor 78 holds an OFF state.

With the circuit configuration illustrated in FIG. 7, the operation of the drive circuit 70 can be tested by using the test transistor 80 and the test terminal 81 in a state where the light emitting array 30 including the light emitting units 31 is not mounted on the IC chip 20. Normally, manufactured IC chips 20 include a defective product. Thus, the IC chips 20 are tested before mounting the light emitting arrays 30 thereon, and only non-defective products are subjected to assembly steps. In this test, an operation unrelated to the drive circuit 70 can be tested by using an ordinary circuit test technique. However, if the test transistor 80 and the test terminal 81 are not provided, an operation related to the drive circuit 70 cannot be tested by using the ordinary circuit test technique because the P-side electrode 46 is connected to only the source terminal of the nonvolatile memory transistor 78. When the P-side electrode 46 is connected to the GND line via the test transistor 80, an operation related to the drive circuit 70 can be tested by using the ordinary circuit test technique.

Specifically, the drive current I flowing from the power supply line 73 to the GND line 74 is measured with the nonvolatile memory transistor 78 and the test transistor 80 being in an ON state and with the row-selection signal Rol and the column signal CS being switched between ON and OFF. Accordingly, the most part of defective operations related to the drive circuit 70 can be detected.

In addition, it is preferable to also perform a write test of the nonvolatile memory transistor 78. Specifically, with use of the gate control signal line 79, a signal is written so that the nonvolatile memory transistor 78 holds an OFF state. Subsequently, (i) an operating control gate voltage (a control gate voltage that is able to turn ON the nonvolatile memory transistor 78 in which a signal to hold an OFF state is not written) is supplied through the gate control signal line 79, and (ii) the row-selection transistor 75, the drive transistor 77, and the test transistor 80 are turned ON. In this state, the drive current I flowing from the power supply line 73 to the GND line 74 is measured, and accordingly a write test can be performed on the nonvolatile memory transistor 78. In a case where the write test is performed, a written signal needs to be erased by irradiation with ultraviolet rays or the like after the write test ends, which requires an additional facility therefor and a longer test time. For this reason, the write test may be omitted.

Furthermore, the circuit configuration illustrated in FIG. 7 makes it possible to perform a light emission test of the light emitting units 31 after mounting the light emitting array 30 on the IC chip 20 and to cut off power supply to a defective light emitting unit 31. Specifically, the row-selection transistors 75 and the drive transistors 77 for the individual light emitting units 31 are sequentially turned ON with the test transistors 80 being in an OFF state and with the nonvolatile memory transistors 78 being in an ON state, and the luminous characteristics of the individual light emitting units 31 are sequentially evaluated. In this stage, all the nonvolatile memory transistors 78 have no signal written therein and have a low threshold voltage at which the state shifts from an OFF state to an ON state. Thus, when the LED display chip 1 operates normally, all the nonvolatile memory transistors 78 can be turned ON by an operating control gate voltage supplied through the gate control signal lines 79.

After the luminous characteristics of all the light emitting units 31 have been evaluated, in the pixel 40 including a defective light emitting unit 31, a signal is written in the nonvolatile memory transistor 78 so that the nonvolatile memory transistor 78 remains in an OFF state at an operating control gate voltage. Accordingly, power supply to the defective light emitting unit 31 is stopped, and the pixel 40 including the defective light emitting unit 31 becomes a completely black pixel (a pixel that emits no light, a pixel that consumes no current). The LED display chip 1 in which the plurality of pixels 40 include a black pixel can be used for application in which a black pixel is allowed, and thus yield can be increased.

The configuration in which each light emitting unit 31 includes one LED as in the present first embodiment is suitable for reducing the size of pixels and is suitable for a display device including a large number of pixels. Since the importance of each pixel decreases as the number of pixels of the display device increases, the allowance for a black pixel increases, which is suitable for a configuration in which the plurality of pixels 40 include a black pixel as in the present first embodiment.

(Manufacturing Steps)

Hereinafter, manufacturing steps of LED display chips 1 will be described in detail with reference to FIG. 8 to FIG. 24.

FIG. 8 is a diagram for describing an example of assembling the LED display chips 1 according to the first embodiment.

As illustrated in part (a) of FIG. 8, a plurality of light emitting arrays 30 are monolithically formed on a sapphire wafer W2 (first heterogeneous substrate, second heterogeneous substrate). The wafer on which the light emitting arrays 30 are formed is not limited to a sapphire substrate, and may be a gallium arsenide substrate, a silicon substrate, a silicon carbide substrate, an aluminum nitride substrate, a spinel substrate, or the like. Any type of so-called heterogeneous substrate may be used as long as the compound semiconductor layer 51 constituting the light emitting arrays 30 can be grown thereon and the substrate can be selectively peeled off (separated) from the light emitting arrays 30. A selectable heterogeneous substrate varies according to the material of the compound semiconductor layer 51.

Subsequently, as illustrated in part (b) of FIG. 8, the sapphire wafer W2 is diced into the light emitting arrays 30.

On the other hand, as illustrated in part (c) of FIG. 8, a plurality of IC chips 20 are monolithically formed on the silicon wafer W1. Subsequently, as illustrated in part (d) of FIG. 8, the light emitting arrays 30 are mounted on the individual IC chips 20. In part (d) of FIG. 8, every IC chip 20 has a light emitting array 30 thereon. Actually, however, whether each IC chip 20 is defective or non-defective is tested before mounting, and no light emitting array 30 may be mounted on a defective IC chip 20. In the case of not mounting the light emitting array 30, it is preferable to mount a dummy of a light emitting array 30 on the defective IC chip 20 to keep the flatness of the surface of the silicon wafer W1.

Subsequently, the silicon wafer W1 is diced into LED display chips 1. Each LED display chip 1 is mounted on a lead frame, is resin sealed, or the like. Although it is inefficient, the sapphire wafer W2 may be bounded to the silicon wafer W1 without being diced and may be diced together with the silicon wafer W1. The reason for the inefficiency is that the IC chip 20 is usually larger than the light emitting array 30. To bond a plurality of light emitting arrays 30 connected to each other to the corresponding plurality of IC chips 20, it is necessary to space the light emitting arrays 30 by providing a useless region therebetween. Thus, the sapphire wafer W2 and various layers grown thereon are wasted, which is inefficient. To prevent a useless region from being provided, the IC chip 20 and the light emitting array 30 may have the same size. However, the area of the drive circuits 70 in the pixel drive circuit array portion 24 is equivalent to the area of the light emitting units 31 in the light emitting array 30, and the IC chip 20 needs to include the image processing circuit portion 21, the row-selection circuit portion 22, and the column signal output circuit portion 23. Thus, it is very difficult to make the size of the IC chip 20 identical to the size of the light emitting array 30.

(Manufacturing of Light Emitting Array)

Hereinafter, manufacturing steps of manufacturing the light emitting array 30 will be described in detail with reference to FIG. 9 to FIG. 15. FIG. 9 to FIG. 15 illustrate an exemplary sequence of steps in order. Thus, reference numerals in a figure illustrating a preceding step will appropriately be omitted in a figure illustrating a subsequent step for the sake of simplicity.

FIG. 9 to FIG. 15 are diagrams illustrating exemplary manufacturing steps of manufacturing the light emitting array 30 according to the present first embodiment in order.

Figure 9:
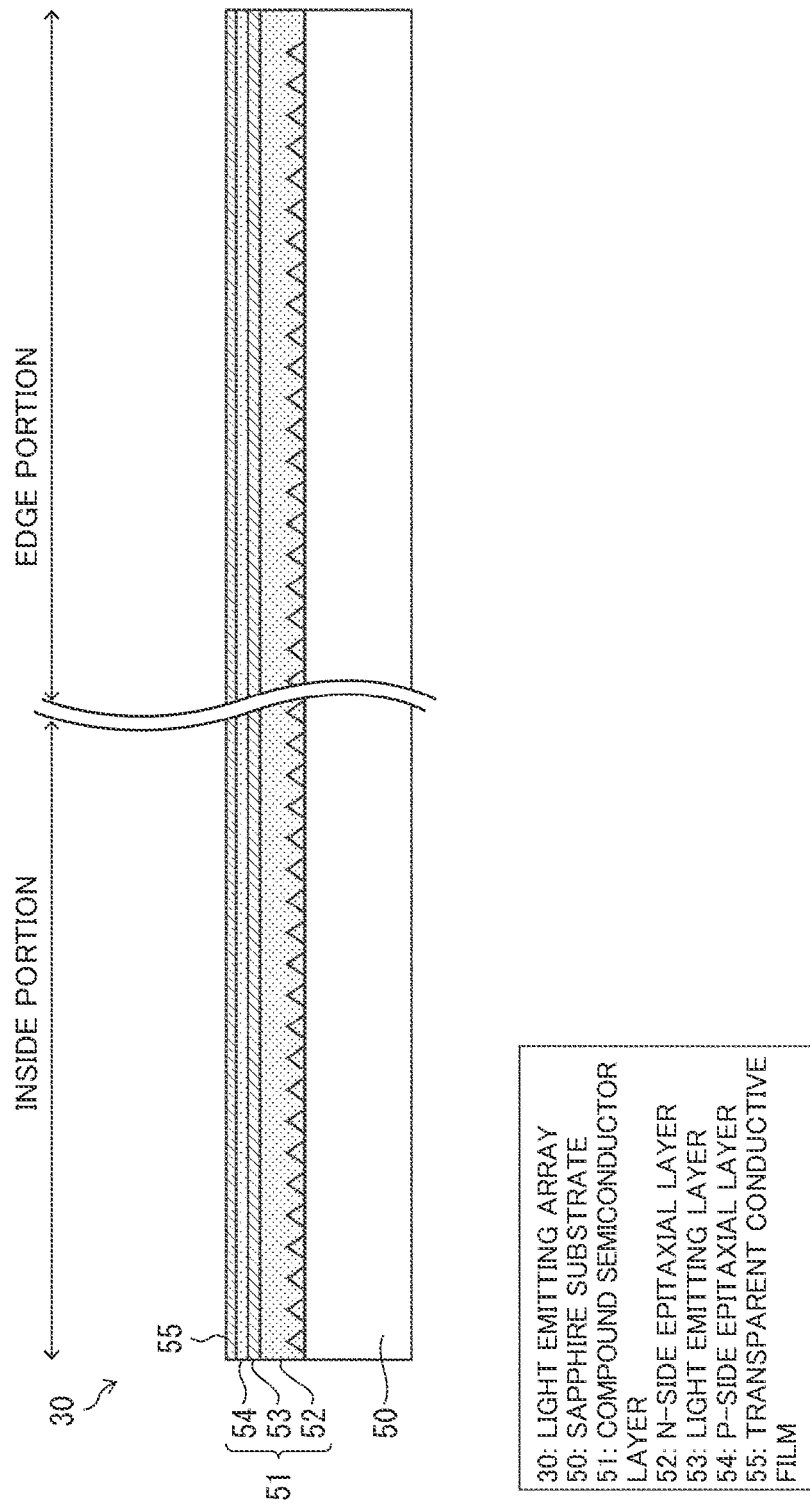
FIG. 9 is a cross-sectional view for describing part of exemplary manufacturing steps of the light emitting array according to the one embodiment of the present invention.

First, as illustrated in FIG. 9, an uneven pattern is formed on the upper surface of a sapphire substrate 50. The uneven pattern increases the area in which the N-side epitaxial layer 52 is in contact with the N-side common electrode 33 that is formed in a subsequent step, and thus the electric resistance therebetween can be reduced. The uneven pattern need not necessarily be formed although it is preferable to form it.

Subsequently, with use of a metal organic chemical vapor deposition (MOCVD) device, for example, the N-side epitaxial layer 52 is epitaxially grown on the upper surface of the sapphire substrate 50, the light emitting layer 53 is epitaxially grown on the upper surface of the N-side epitaxial layer 52, and the P-side epitaxial layer 54 is epitaxially grown on the upper surface of the light emitting layer 53. Accordingly, the compound semiconductor layer 51 including the N-side epitaxial layer 52, the light emitting layer 53, and the P-side epitaxial layer 54 that are stacked in this order is formed on the sapphire substrate 50 having the uneven pattern. The N-side epitaxial layer 52 needs to conduct in the layer thickness direction, and thus preferably does not include a high resistance layer in its inside and is preferably an N-type good conductor throughout the body in the layer thickness direction.

An arbitrary compound semiconductor layer may be used as the compound semiconductor layer 51. For example, in the case of emitting red light, AlInGaP may be used as in PTL 1. In the case of emitting green light, blue light, or blue-violet light, InGaN may be used as in PTL 2. In the present first embodiment, the compound semiconductor layer 51 of a single type is evenly formed on the sapphire substrate 50. Alternatively, a plurality of types of compound semiconductor layers may be formed.

When the compound semiconductor layer 51 is made of InGaN for emitting blue light, for example, the N-side epitaxial layer 52 has a complex multilayer structure (not illustrated) including a buffer layer, an undoped GaN layer, an N-type contact layer (n-GaN layer), and an N-side buffer layer constituted by a multilayer film such as a superlattice layer that are stacked in order from the sapphire substrate 50 side. In addition, for example, the light emitting layer 53 is a multiquantum well layer including a quantum well layer (not illustrated) made of InGaN and a barrier layer (not illustrated) made of GaN that are repeatedly stacked. In addition, for example, the P-side epitaxial layer 54 has a complex multilayer structure (not illustrated) including a GaN layer, a P-type AlGaN layer, a P-type GaN layer, and a P-type contact layer (p-GaN) that are stacked in order from the sapphire substrate 50 side.

Subsequently, a transparent conductive material such as indium tin oxide (ITO) is deposited on the upper surface of the compound semiconductor layer 51 to form the transparent conductive film 55. To increase light extraction efficiency, it is preferable to form the transparent conductive film 55 and the protective layer 57 (see FIG. 11) which will be described below between the P-side epitaxial layer 54 and the P-side individual electrode 42 to separate both of them from each other, thereby increasing the shortest distance therebetween. The transparent conductive film 55 may be replaced with a metallic multilayer film including a metallic thin film that is in contact with the compound semiconductor layer 51 and has high interface reflectivity, for example, a thin film made of aluminum, silver, or the like. When the size of each light emitting unit 31 is small, for example, several μm, the transparent conductive film 55 may be omitted. Thus, for example, when the transparent conductive film 55 can be processed only by wet etching and fine patterning is difficult to perform, the transparent conductive film 55 may be omitted.

Figure 10:
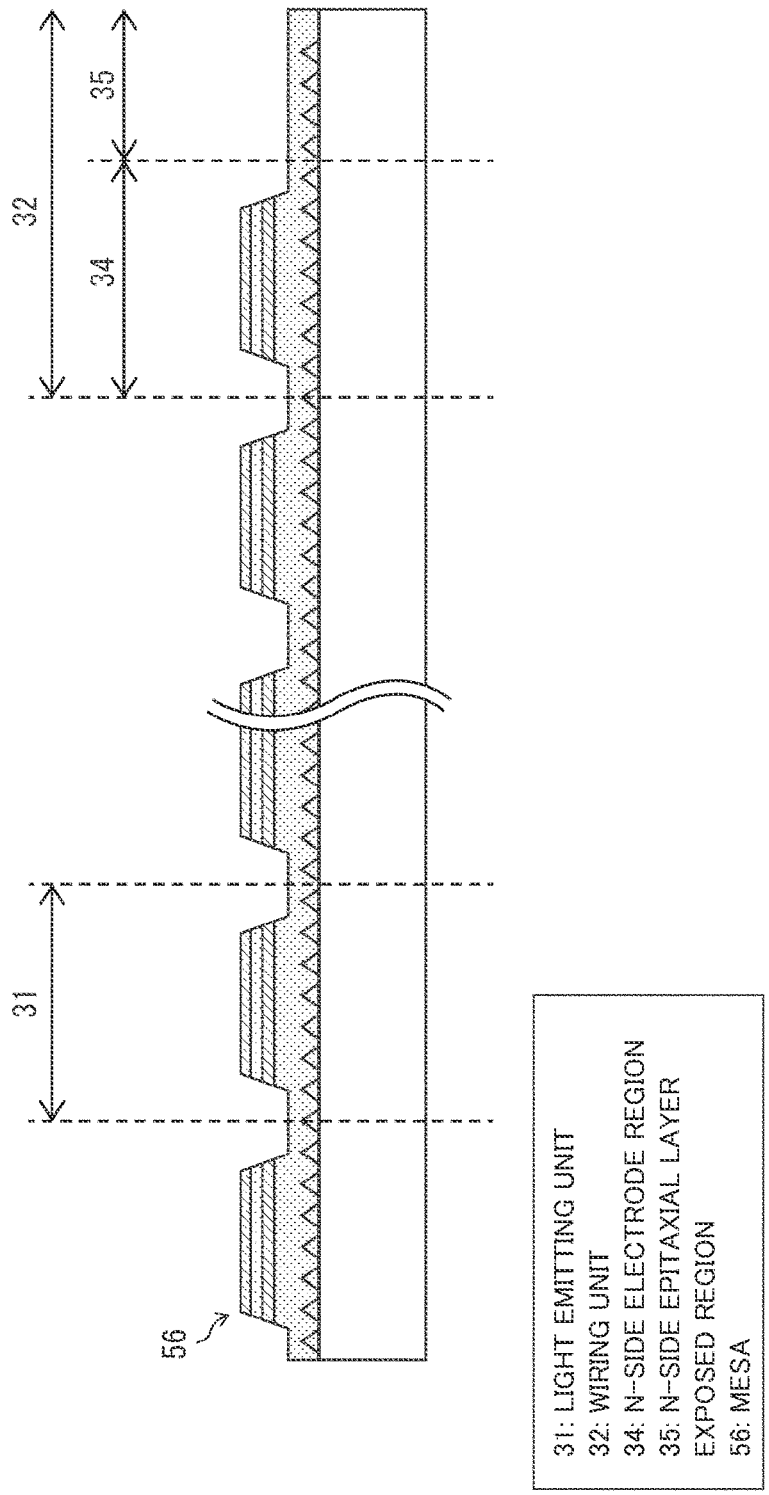
FIG. 10 is a cross-sectional view for describing part of the exemplary manufacturing steps of the light emitting array according to the one embodiment of the present invention.

Subsequently, as illustrated in FIG. 10, the transparent conductive film 55 is partially removed by, for example, photolithography, to perform patterning, and the N-side epitaxial layer 52, the light emitting layer 53, and the P-side epitaxial layer 54 are partially removed by etching. Accordingly, mesas 56, each corresponding to a unit (light emitting unit 31, wiring unit 32) can be formed in the compound semiconductor layer 51. In the wiring unit 32, the mesa 56 is formed only in the N-side electrode region 34. In the N-side epitaxial layer exposed region 35, the light emitting layer 53 and the P-side epitaxial layer 54 are completely removed to expose the N-side epitaxial layer 52. The multilayer structure of the mesa 56 is the same in the light emitting unit 31 and the wiring unit 32, but the size and shape thereof may be different. Preferably, the sloped side surfaces of the mesas 56 are oriented toward the display surface of the LED display chip 1, that is, the lower side of FIG. 10. With this orientation, the light emitted from the light emitting layer 53 substantially in parallel to the display surface of the LED display chip 1 can be reflected in the direction of the N-side epitaxial layer 52, and the light extraction efficiency can be increased. Furthermore, the sloped side surfaces of the mesas 56 are preferably sloped 35 degrees or more and 55 degrees or less with respect to the display surface of the LED display chip 1, and are more preferably sloped about 45 degrees. With this slope angle, the light emitted from the light emitting layer 53 substantially in parallel to the display surface of the LED display chip 1 can be reflected substantially orthogonally to the display surface of the LED display chip 1, and the light extraction efficiency can further be increased.

Figure 11:
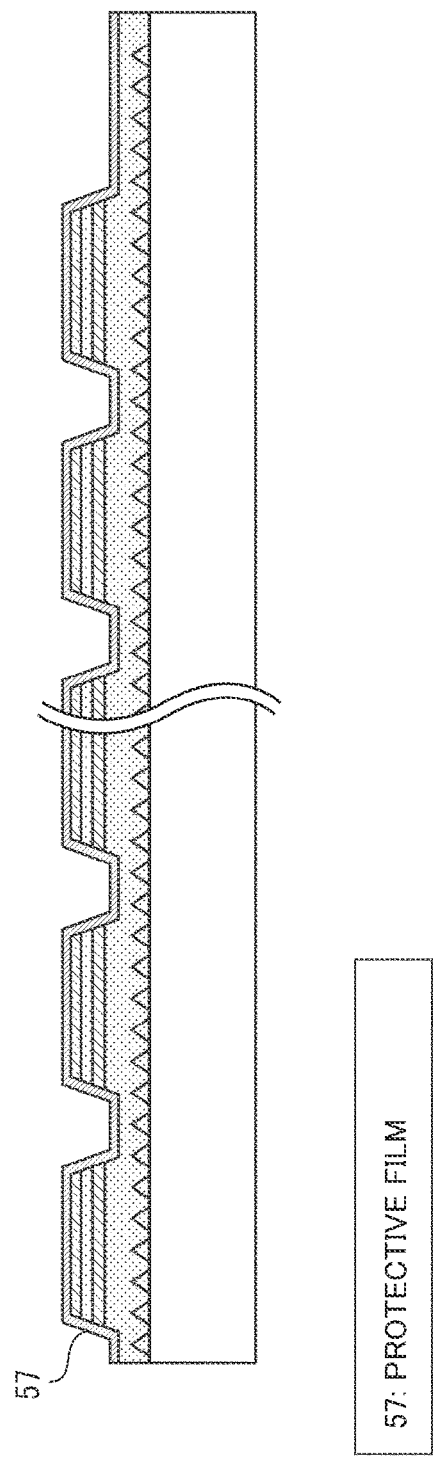
FIG. 11 is a cross-sectional view for describing part of the exemplary manufacturing steps of the light emitting array according to the one embodiment of the present invention.

Subsequently, as illustrated in FIG. 11, the protective film 57 is formed by using, for example, an insulating material such as silicon dioxide, so as to entirely cover the exposed surface of the compound semiconductor layer 51 and the transparent conductive film 55. The protective film 57 covers the side wall portions of the individual mesas 56, which makes it possible to prevent leakage from the PN junction (PN junction between the N-side epitaxial layer 52 and the P-side epitaxial layer 54) exposed in the side wall portions.

Figure 12:
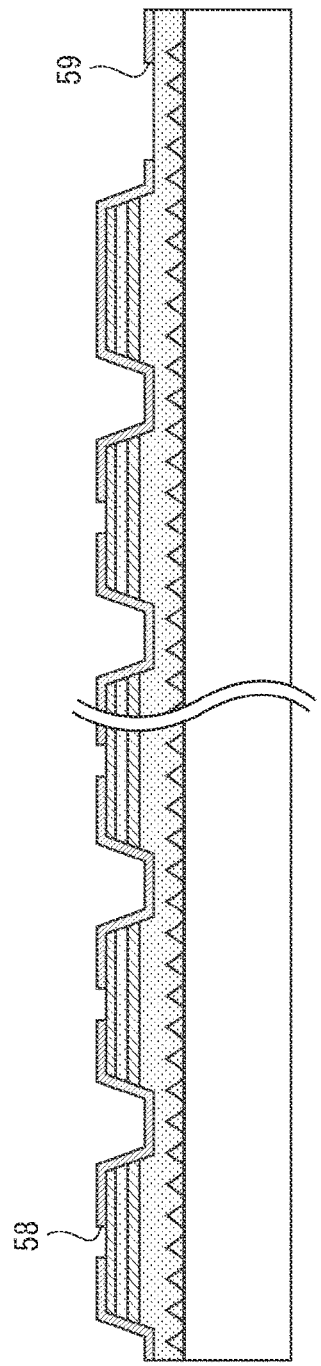
FIG. 12 is a cross-sectional view for describing part of the exemplary manufacturing steps of the light emitting array according to the one embodiment of the present invention.

Subsequently, as illustrated in FIG. 12, the protective film 57 is partially removed by, for example, photolithography, to make the P-side contact holes 58 and the N-side contact holes 59 in the protective film 57. Accordingly, the transparent conductive film 55 is partially exposed through the P-side contact hole 58 in each light emitting unit 31. The N-side epitaxial layer 52 is partially exposed through the N-side contact hole 59 in the N-side epitaxial layer exposed region 35 of each wiring unit 32.

If the transparent conductive film 55 is not formed, the P-side epitaxial layer 54 is partially exposed through the P-side contact hole 58 in each light emitting unit 31. In this case, it is preferable to make the P-side contact hole 58 large to increase the area in which the P-side individual electrode 42 is in direct contact with the P-side epitaxial layer 54.

Figure 13:
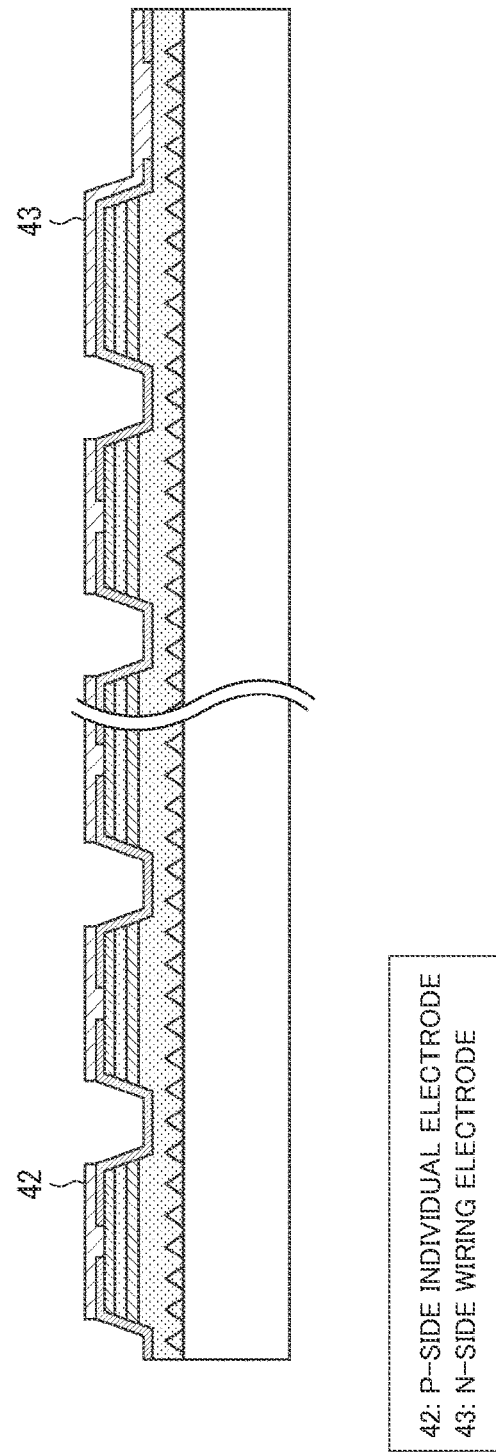
FIG. 13 is a cross-sectional view for describing part of the exemplary manufacturing steps of the light emitting array according to the one embodiment of the present invention.

Subsequently, as illustrated in FIG. 13, an electrode film is formed by, for example, metallic vapor evaporation, on (i) the protective film 57, (ii) the transparent conductive film 55 or the P-side epitaxial layer 54 exposed from the protective film 57, and (iii) the N-side epitaxial layer 52 exposed from the protective film 57. The electrode film is formed to have a multilayer structure of, for example, Al, Ni, Pt, Ni, Au, and the like. To increase the brightness of the pixels 40 including the light emitting units 31, it is preferable that the electrode film reflect the light emitted by the light emitting units 31.

Subsequently, the electrode film is partially removed by, for example, photolithography, to form the P-side individual electrodes 42 and the N-side wiring electrodes 43. The P-side individual electrodes 42 are formed for the individual light emitting units 31 and are in contact with the P-side epitaxial layer 54 through the P-side contact holes 58. The N-side wiring electrodes 43 are formed for the individual wiring units 32 and are in contact with the N-side epitaxial layer 52 through the N-side contact holes 59.

Figure 14:
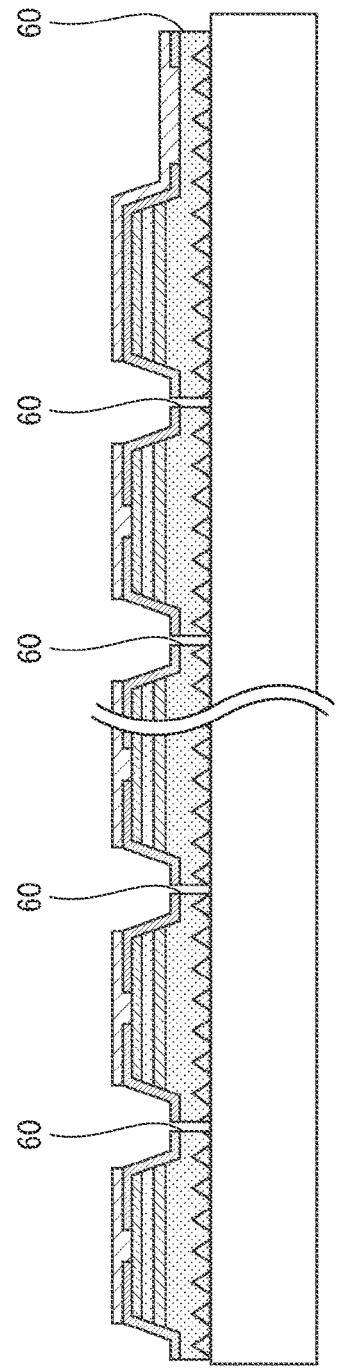
FIG. 14 is a cross-sectional view for describing part of the exemplary manufacturing steps of the light emitting array according to the one embodiment of the present invention.

Subsequently, as illustrated in FIG. 14, the unit separation grooves 60 that reach the upper surface of the sapphire substrate 50 are formed in bottom portions of recessed portions between the mesas 56 (light emitting unit separation step and connection unit separation step). Accordingly, the portions of the compound semiconductor layer 51 corresponding to the individual units (light emitting units 31 and wiring units 32) are completely separated from each other, and thus the individual units are separated from each other. At the same time, the portion of the compound semiconductor layer 51 outside the outer periphery of the light emitting array 30 is removed to make the outer periphery of the light emitting array 30 clear.

Figure 15:
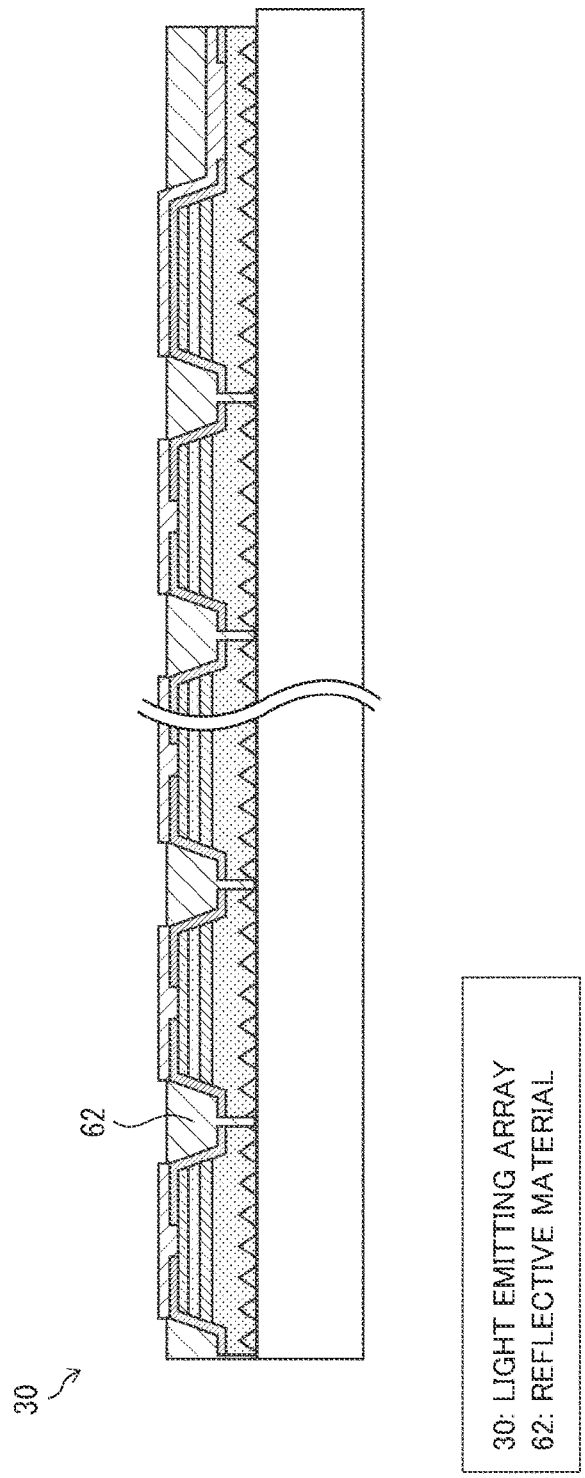
FIG. 15 is a cross-sectional view for describing part of the exemplary manufacturing steps of the light emitting array according to the one embodiment of the present invention.

Subsequently, as illustrated in FIG. 15, at least the recessed portions between the mesas 56 and the unit separation grooves 60 are filled with the reflective material 62 (filling-with-reflective-material step). Preferably, the reflective material 62 is provided such that the P-side individual electrodes 42 and the portions on the tops of the mesas 56 of the N-side wiring electrodes 43 are exposed. To expose the portions, the reflective material 62 may be applied over the entire surface and then the portions of the reflective material 62 covering the P-side individual electrodes 42 may be removed by etch-back or the like. Alternatively, the reflective material 62 may be made of a photo-curable resin material, at least the recessed portions between the mesas 56 and the unit separation grooves 60 may be filled with the reflective material 62 in a liquid state, and the reflective material 62 may be cured in a desired pattern by using a light exposure technique.

Preferably, the reflective material 62 is formed so as to cover at least the N-side epitaxial layer exposed region 35 so that no gap is formed when being reversed and mounted on the integrated circuit chip 20. Preferably, the reflective material 62 is formed within the light emitting array 30. If the reflective material 62 is outside the light emitting array 30, the reflective material 62 may be broken when dicing the sapphire wafer W2 illustrated in parts (a) and (b) of FIG. 8, which may deform the edge portion of the light emitting array 30 or may generate dust to be adhered.

The reflective material 62 is a material that reflects the light emitted by the light emitting units 31 and is, for example, a composite material obtained by mixing silicone resin and white pigment.

In the above-described manner, through the steps illustrated in FIG. 9 to FIG. 15, the sapphire wafer W2 illustrated in part (a) of FIG. 8 on which the light emitting arrays 30 are monolithically formed is completed. In the exemplary steps illustrated in FIG. 9 to FIG. 15, the light emitting units 31 and the wiring units 32 are formed on the same sapphire substrate 50, but the present invention is not limited thereto. For example, the light emitting units 31 and the wiring units 32 may be formed on different substrates and the substrates may be combined. This is advantageous in that the size of each light emitting array 30 can be changed, specifically the number of light emitting units 31 included in each light emitting array 30 can be changed, but the step of mounting the light emitting arrays 30 on the IC chips 20 is complicated. Alternatively, the plurality of light emitting units 31 included in each light emitting array 30 may be formed on a plurality of different substrates. This is advantageous in that different types of light emitting units 31 can be mounted in the same IC chip 20, but variation in the luminous characteristics of the light emitting units 31 is likely to increase, which makes the assembly step more complicated. Thus, to economically provide the LED display chip 1 capable of evenly displaying an image, it is preferable to monolithically form the light emitting arrays 30 each including the light emitting units 31 in N rows and M columns and the wiring units 32 that are arranged.

(Mounting of Light Emitting Array)

Hereinafter, assembly steps of mounting the light emitting array 30 on the IC chip 20 will be described in detail with reference to FIG. 8 and FIG. 16 to FIG. 20. FIG. 16 to FIG. 20 illustrate an exemplary sequence of assembly steps in order. Thus, reference numerals in a figure illustrating a preceding step will appropriately be omitted in a figure illustrating a subsequent step for the sake of simplicity.

FIG. 16 to FIG. 20 are diagrams illustrating exemplary assembly steps of mounting the light emitting array 30 on the IC chip 20 according to the present first embodiment in order. The light emitting array 30 illustrated in FIG. 16 to FIG. 20 is the light emitting array 30 manufactured in the manner illustrated in FIG. 9 to FIG. 15. Alternatively, the light emitting array 30 may be a light emitting array manufactured in other steps or with another structure.

Figure 16:
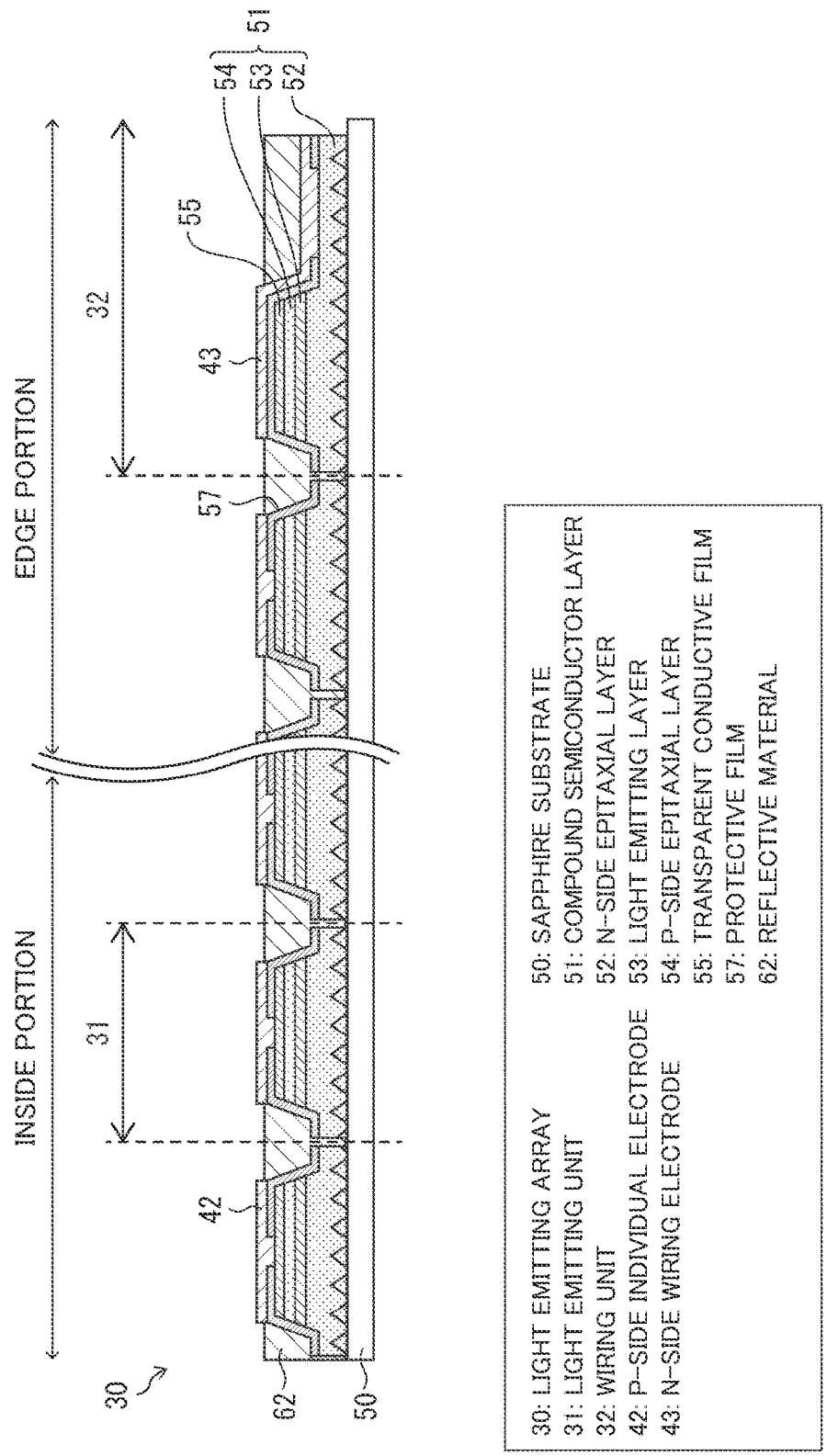
FIG. 16 is a cross-sectional view for describing part of exemplary assembly steps of the LED display chip according to the one embodiment of the present invention.

First, as illustrated in FIG. 16, the sapphire substrate 50 of the light emitting array 30 is grinded to reduce the thickness. After the grinding, the sapphire substrate 50 typically has a thickness of 30 µm or more and 200 µm or less, although it depends on the application or the like.

Subsequently, as in the steps illustrated in parts (a) and (b) of FIG. 8, the sapphire wafer W2 is diced into light emitting arrays 30 by using, for example, a laser stealth dicing device. The dicing into light emitting arrays 30 can be performed similarly to normal dicing into LEDs.

Figure 17:
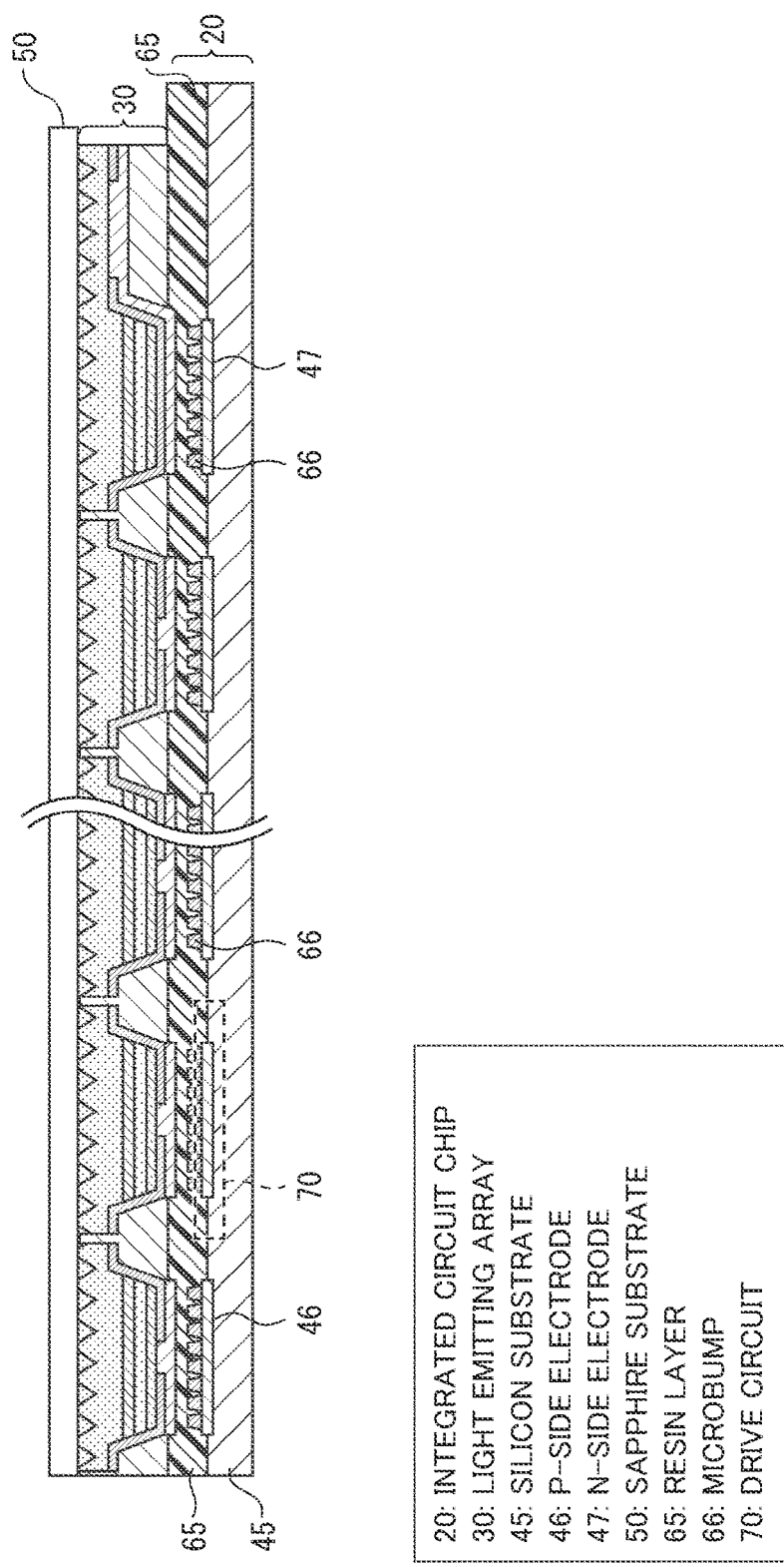
FIG. 17 is a cross-sectional view for describing part of the exemplary assembly steps of the LED display chip according to the one embodiment of the present invention.

Subsequently, as illustrated in FIG. 17, the light emitting array 30 is flipped upside down and is arranged on the IC chip 20. Accordingly, the surface of the light emitting array 30 opposite to the sapphire substrate 50 faces the mounting surface of the IC chip 20. In addition, the light emitting array 30 is accurately aligned on the IC chip 20 such that the P-side individual electrode 42 of each light emitting unit 31 faces the P-side electrode 46 of the corresponding drive circuit 70 and that the portion on the top of the mesa 56 of the N-side wiring electrode 43 of the wiring unit 32 faces the N-side electrode 47.

In the example illustrated in FIG. 17, the resin layer 65 is provided on the mounting surface side of the IC chip 20, and the microbumps 66 are provided on the P-side electrodes 46 and the N-side electrode 47, but the present invention is not limited thereto. The combination of the resin layer 65 and the microbumps 66 may be replaced with an anisotropic conductive resin or an anisotropic conductive tape. The anisotropic conductive resin is a resin material in which conductive particles are dispersed. At a portion that is pressed and bonded, a conductive path can be formed by proximity or contact between conductive particles, whereas at a portion that is not pressed and bonded, no conductive path is formed and electrical insulation is maintained. The anisotropic conductive tape is an anisotropic conductive film processed into a tape.

Subsequently, the light emitting array 30 is bonded to the IC chip 20. At this time, the resin layer 65 functions as an adhesive, and the light emitting array 30 is bonded to and fixed to the IC chip 20. At this time, the light emitting array 30 has the sapphire substrate 50 and thus has sufficient mechanical strength resistant to the bonding. If there is not the sapphire substrate 50, the light emitting array 30 is difficult to handle. Thus, it is preferable to peel off the sapphire substrate 50 after bonding the light emitting array 30 to the IC chip 20.

In the step illustrated in FIG. 17, the temperature at which the light emitting array 30 and the IC chip 20 are bonded to each other is preferably as close as possible to room temperature (about 20° C.), for example, 125° C. or less is preferable. The thermal expansion coefficient of the sapphire substrate 50 (heterogeneous substrate) is significantly different from that of the silicon substrate 45 constituting the IC chip 20. A change in temperature causes relative misalignment, and thus bonding with high temperature causes (i) a problem that electrodes to be bonded are misaligned, and (ii) a problem that large distortion occurs inside the light emitting array 30 when the sapphire substrate 50 is brought back to room temperature after bonding. For example, it is assumed that the size of the light emitting array 30 is about 10 mm and that the size of each electrode of the light emitting array 30 (the P-side individual electrode 42 and the portion of the N-side wiring electrode 43 facing the N-side electrode 47) is about 3 µm. In this case, when the misalignment of each electrode is allowed up to 1.5 µm, an allowable increase in temperature is up to about 100° C. (The thermal expansion coefficients of silicon and sapphire are 2.6 ppm/K and 7.5 ppm/K, respectively.) Thus, about 125° C. or less is preferable.

As illustrated in FIG. 16, the reflective material 62 can be formed such that the P-side individual electrodes 42 and the N-side wiring electrode 43 are slightly protruded from the surface of the light emitting array 30. Thus, only the anisotropic conductive film between the P-side individual electrode 42 of each light emitting unit 31 and the P-side electrode 46 of each drive circuit 70 and between the portion of the N-side wiring electrode 43 of the wiring unit 32 and the N-side electrode 47 can be pressed.

Preferably, the thickness of the resin layer 65 is adjusted (i) such that the resin layer 65 has an adhesion force for bonding the light emitting array 30 to the IC chip 20, (ii) such that, in thermal compression bonding performed in a subsequent step, poor contact does not occur between the microbumps 66 and the P-side individual electrodes 42 and the portion of the N-side wiring electrode 43, and (iii) such that no large void is formed between the IC chip 20 and the light emitting array 30 in the thermal compression bonding. A small void between the IC chip 20 and the light emitting array 30 is allowable because it does not have a negative influence on the luminous characteristics and reliability of the light emitting units 31.

The microbumps 66 are formed of, for example, gold, and are truncated cones or truncated pyramids each having a bottom surface whose diameter or one side is 0.5 µm or more and 5 µm or less and having a height of 0.3 µm or more and 3 µm or less. The microbumps 66 having desired bottom surfaces and heights can be formed by, for example, (i) forming a resist pattern on the silicon substrate 45, the resist pattern having openings corresponding to the desired bottom surfaces on the P-side electrodes 46 and the N-side electrodes 47, (ii) forming, on the resist pattern, a thin film made of gold or the like and having a thickness corresponding to the desired heights by using vapor deposition, electroplating, electroless plating, or the like, and (iii) lifting off the resist pattern. Alternatively, the microbumps 66 can be formed by using, for example, self-assembly of block copolymers.

One method of using self-assembly of block copolymers is as follows. For example, (i) the upper surface of the silicon substrate 45 is spin-coated with polystyrene-block-poly (2-vinylpyridine), which is a kind of block copolymer, (ii) the spin-coat film is soaked in an aqueous solution of sodium tetrachloropalladate ($Na_2PdCl_4$) to selectively precipitate palladium ions to a 2-vinylpyridine core in polystyrene-block-poly (2-vinylpyridine), and (iii) polystyrene-block-poly (2-vinylpyridine) is removed by plasma treatment. In this method, palladium nanoparticles with a size of several tens of nm are precipitated at intervals of about 100 nm to 300 nm, and thereby the microbumps 66 can be obtained. In this method, the resin layer 65 can be omitted because the palladium nanoparticles have an adhesion force derived from the Van der Waals force. In addition, there is an advantage that an expensive device is unnecessary, and that the P-side electrodes 46 and the N-side electrodes 47 of the IC chip 20 can be connected to the P-side individual electrodes 42 and the N-side wiring electrodes 43 of the light emitting array 30 at room temperature, which is very favorable.

Figure 18:
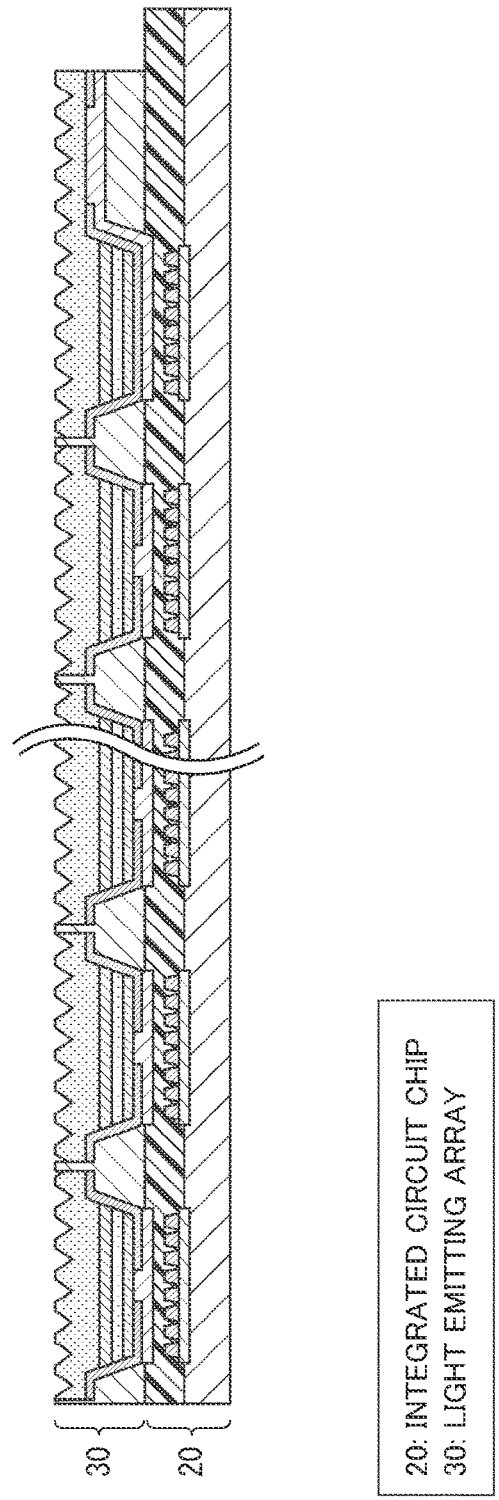
FIG. 18 is a cross-sectional view for describing part of the exemplary assembly steps of the LED display chip according to the one embodiment of the present invention.

Subsequently, as illustrated in FIG. 18, the sapphire substrate 50 is selectively peeled off from the compound semiconductor layer 51 by using a laser lift-off method or the like (first heterogeneous substrate separation step and second heterogeneous substrate separation step). Preferably, the peeling is performed before dicing the silicon wafer W1. This is because, since the light emitting array 30 is aligned on the pixel drive circuit array portion 24, the position to be irradiated with laser for peeling is specified in the silicon wafer W1, and the position of laser irradiation can be determined easily and highly efficiently in each silicon wafer W1. Conversely, if the peeling is performed after dicing the silicon wafer W1, laser irradiation is performed for each IC chip 20, which decreases working efficiency. Besides the laser lift-off method, for example, when the substrate on which the light emitting array 30 is formed is a silicon substrate, wet etching and plasma etching can be used. When the substrate is a gallium arsenide substrate, the compound semiconductor layer 51 can be chemically lifted off by using an epitaxial layer that can be dissolved by hydrogen fluoride HF or the like as a sacrificial layer between the N-side epitaxial layer 52 and the substrate.

Figure 19:
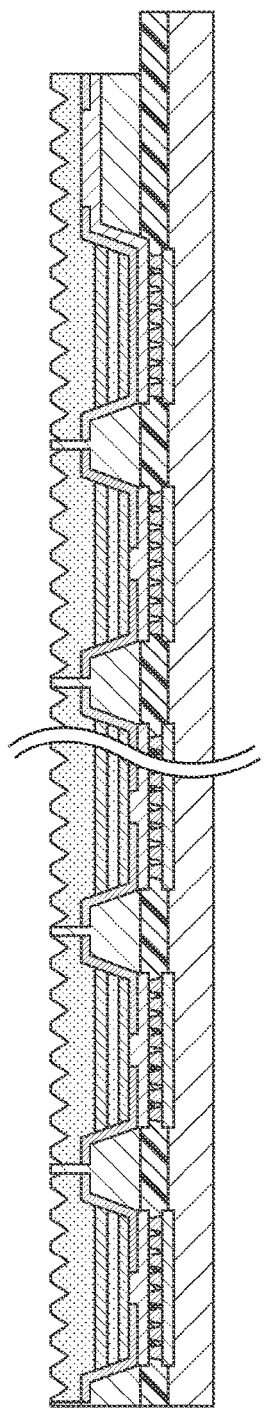
FIG. 19 is a cross-sectional view for describing part of the exemplary assembly steps of the LED display chip according to the one embodiment of the present invention.

Subsequently, as illustrated in FIG. 19, the microbumps 66 on the P-side electrodes 46 are brought into close contact with the P-side individual electrodes 42 and the microbumps 66 on the N-side electrode 47 are brought into close contact with the N-side wiring electrode 43 by applying heat and pressure (thermal compression bonding), thereby forming a metal-to-metal bond. Accordingly, the P-side individual electrode 42 of each light emitting unit 31 is connected to the P-side electrode 46 of the IC chip 20, and the N-side wiring electrode 43 of each wiring unit 32 is connected to the N-side electrode 47 of the IC chip 20. The P-side individual electrode 42 of the light emitting unit 31 and the portion on the top of the mesa 56 of the N-side wiring electrode 43 of the wiring unit 32 are at the same height (the position in the thickness direction of the light emitting array 30), and thus the connections can be easily established at the same time. In this step, the temperature may be high at about 300° C., unlike in the bonding step in FIG. 17. The sapphire substrate 50 has already been peeled off from the light emitting array 30, and the compound semiconductor layer 51 has been divided into the light emitting units 31 in this configuration in accordance with unit separation, and thus the influence of the difference in thermal expansion coefficient between materials is limited. The reflective material 62 between the light emitting units 31 is softer than the sapphire substrate 50 and the compound semiconductor layer 51, and a major problem does not arise.

The flip chip die bonding illustrated in FIG. 17 to FIG. 19 described above can be performed by a flip chip die bonding device. Alternatively, after the dicing to form light emitting arrays 30, the light emitting arrays 30 can be mounted on the IC chips 20 by using an ordinary die bonding device in a state where the sapphire substrate 50 is facing upward. In laser stealth dicing, the sapphire substrate 50 facing upward is bonded onto a sheet. Thus, in the case of separating the light emitting arrays 30 from each other, bonding the light emitting arrays 30 to another sheet, testing and washing the light emitting arrays 30, and then performing the mounting step illustrated in FIG. 17, the flip chip die bonding device is better in terms of reducing dust adhered to the connection surfaces of the light emitting arrays 30 and simplifying the steps. However, the flip chip die bonding device is expensive and its operation speed is low. Thus, the mounting step can be performed by using an ordinary die bonding device after once bonding the light emitting arrays 30 to another sheet.

Figure 20:
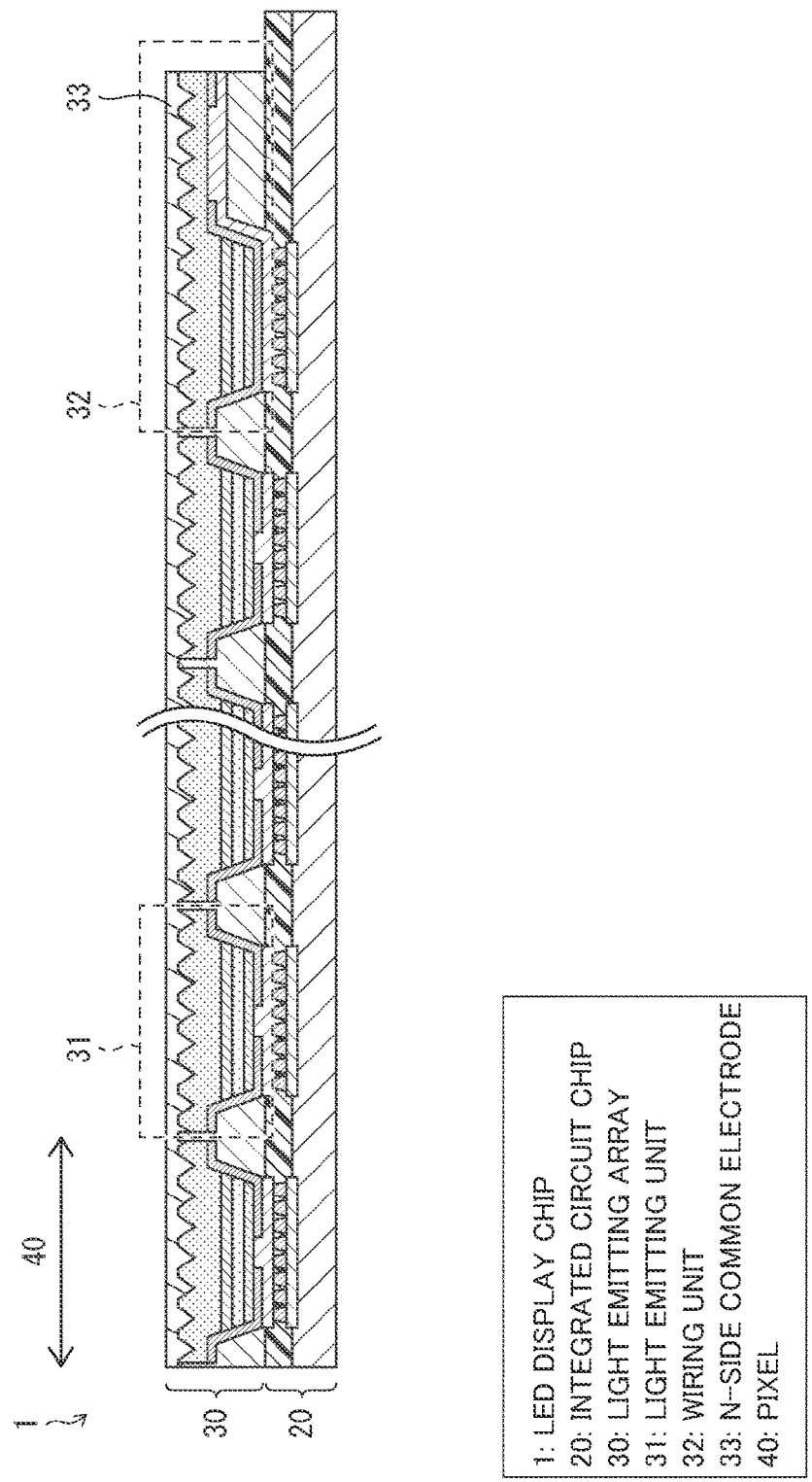
FIG. 20 is a cross-sectional view for describing part of the exemplary assembly steps of the LED display chip according to the one embodiment of the present invention.

Subsequently, as illustrated in FIG. 20, the N-side common electrode 33 is formed on the N-side epitaxial layer 52 of the light emitting array 30 (unit-to-unit connection step). Preferably, the N-side common electrode 33 is a film made of a transparent conductive material such as ITO so that the light from the light emitting layer 53 can pass therethrough. Alternatively, it is preferable that the N-side common electrode 33 be lattice-like metallic electrode meshes covering only the outer peripheral portions of the light emitting units 31 or a combination of a transparent conductive film and metal electrode meshes. Accordingly, the N-side epitaxial layer 52 of each light emitting unit 31 is connected to the N-side electrode 47 of the IC chip 20 via the N-side common electrode 33, the N-side epitaxial layer 52 of the wiring unit 32, the N-side wiring electrode 43, and the microbumps 66 in this order. Thus, the light emitting unit 31 is connected to the drive circuit 70 in the manner illustrated in FIG. 7 substantially only by flip chip bonding. Accordingly, the current path between the light emitting array 30 and the IC chip 20 is completed, and it becomes possible to perform light emission test of the light emitting array 30.

As described above, the light emitting units 31 and the wiring units 32 are monolithically formed in the steps illustrated in FIG. 9 to FIG. 15 (light emitting unit formation step and connection unit formation step). In addition, the light emitting units 31 and the wiring units 32 are mounted on the IC chip 20 in the steps illustrated in FIG. 17 and FIG. 19 (light emitting unit mounting step and connection unit mounting step).

FIRST MODIFICATION EXAMPLE

Figure 21:
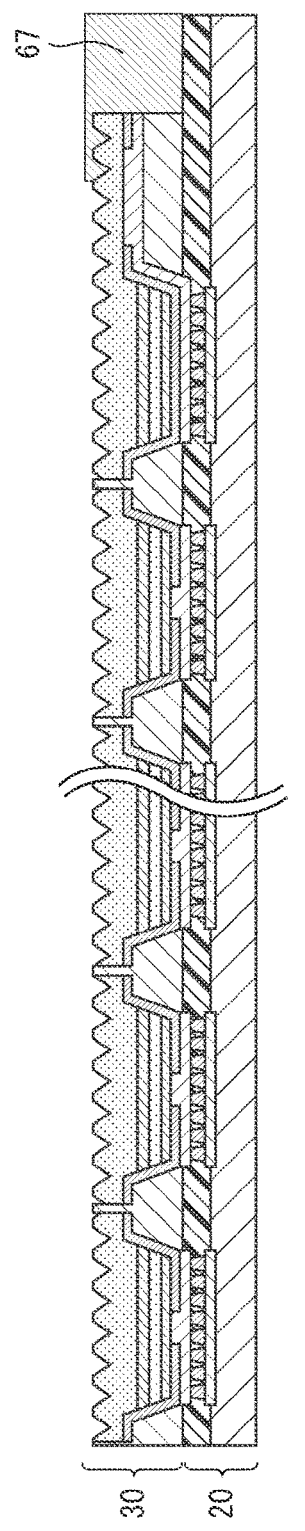
FIG. 21 is a cross-sectional view for describing part of one modification example of assembly steps of the LED display chip according to the one embodiment of the present invention.
Figure 22:
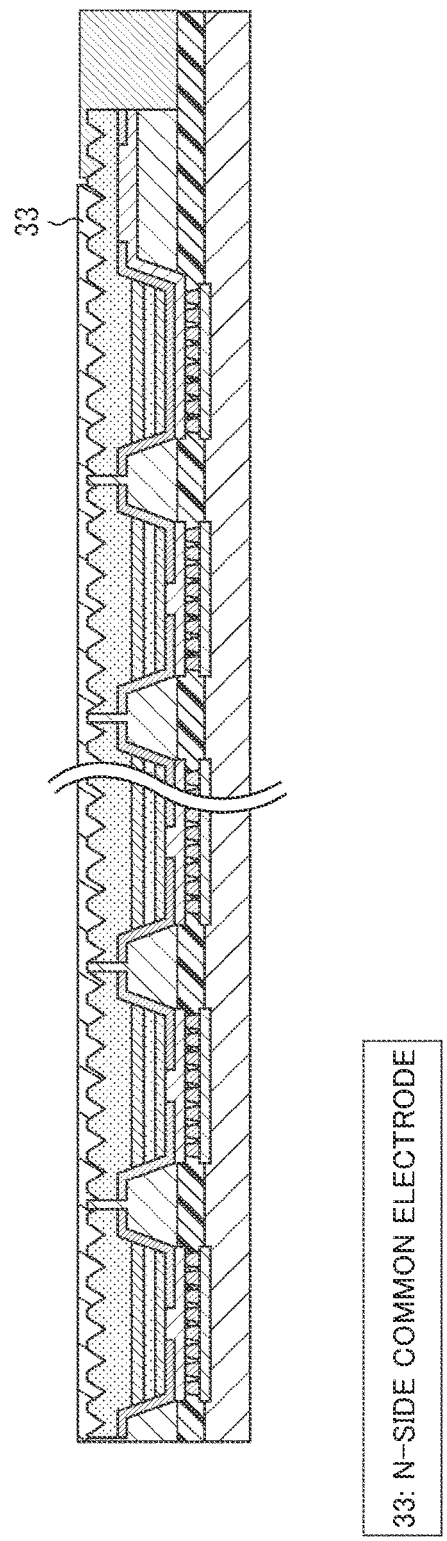
FIG. 22 is a cross-sectional view for describing part of the one modification example of the assembly steps of the LED display chip according to the one embodiment of the present invention.
Figure 23:
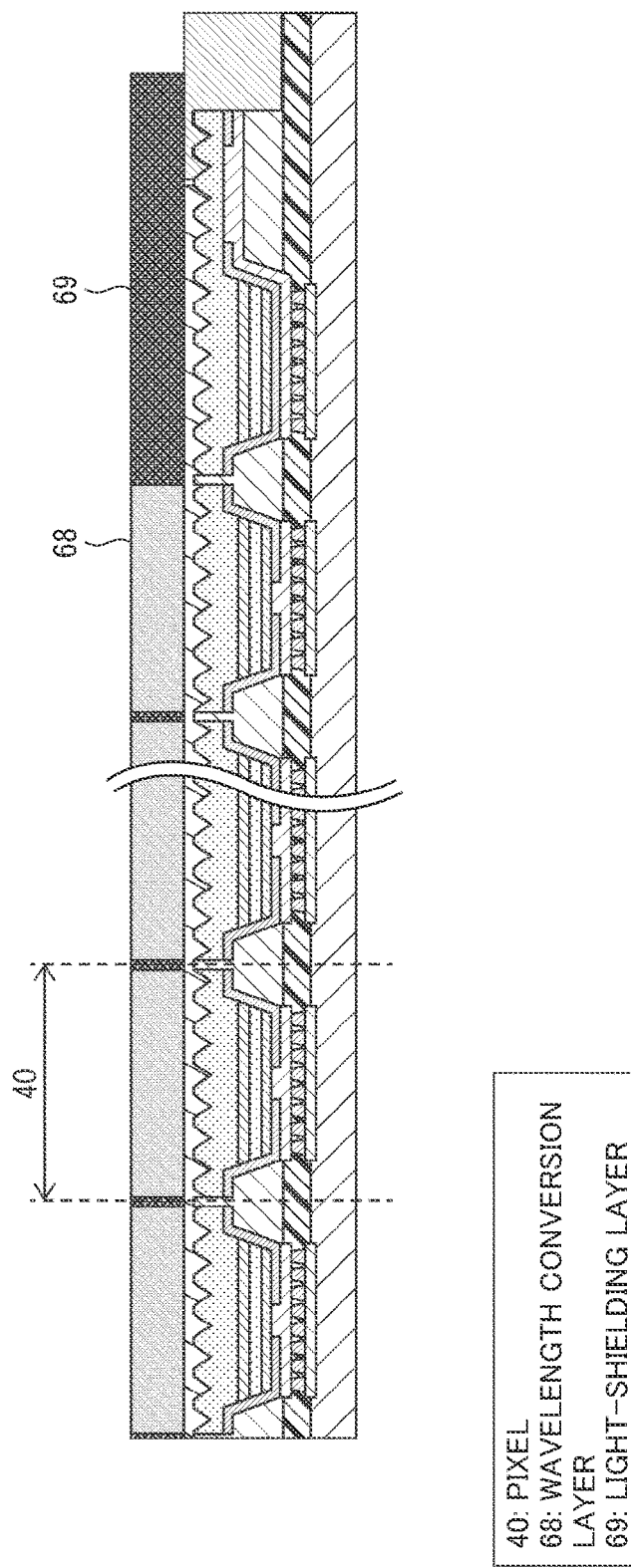
FIG. 23 is a cross-sectional view for describing part of the one modification example of the assembly steps of the LED display chip according to the one embodiment of the present invention.

Hereinafter, a detailed description will be given of a modification example of manufacturing steps of manufacturing the LED display chip 1 in the case of providing a wavelength conversion layer 68 in the LED display chip 1, with reference to FIG. 21 to FIG. 23. FIG. 21 to FIG. 23 illustrate an exemplary sequence of manufacturing steps subsequent to the steps illustrated in FIG. 16 to FIG. 19 in order. Thus, reference numerals in a figure illustrating a preceding step will appropriately be omitted in a figure illustrating a subsequent step for the sake of simplicity.

FIG. 21 to FIG. 23 are diagrams illustrating exemplary steps that are performed after the steps illustrated in FIG. 16 to FIG. 19 in the case of providing the wavelength conversion layer 68.

Subsequently to the step illustrated in FIG. 19, a difference in level between the IC chip 20 and the light emitting array 30 is reduced by using a planarizing layer 67, as illustrated in FIG. 21. The planarizing layer 67 is formed in a space where the light emitting array 30 is not mounted on the silicon wafer W1 with reference to part (d) of FIG. 8. When the planarizing layer 67 is not formed, a difference in level corresponding to a thickness of about 2 μm to 10 μm of the light emitting array 30 is on the silicon wafer W1. This generates a streak pattern called striation extending from the center of the wafer in a radial direction when applying the wavelength conversion layer 68, which causes a large difference in film thickness distribution. As a result of forming the planarizing layer 67 having substantially the same thickness as that of the light emitting array 30 in the space between the light emitting arrays 30, the difference in level is eliminated and thus the difference in film thickness distribution can be avoided. Preferably, the difference in thickness between the light emitting array 30 and the planarizing layer 67 is within ±0.3 μm, and more preferably within ±0.1 μm.

Preferably, the planarizing layer 67 is left only in the space between the light emitting arrays 30 by using a photosensitive resin and is baked. For example, with use of a photocurable resin, a space portion where the light emitting array 30 is not mounted may be irradiated with light to cure the resin. Alternatively, with use of a photodegradable resin, the light emitting array 30 portion may be irradiated with light and the resin in the light emitting array portion may be removed. Preferably, the planarizing layer 67 is made of a light-shielding resin at least capable of blocking the light emitted by the light emitting units 31. When a light-shielding resin is used, the planarizing layer 67 is able to function as a light-shielding layer preventing external light from entering the LED display chip 1 after the LED display chip 1 is completed. When there is not such a light-shielding layer, the light absorbed in the silicon substrate 45 may cause malfunction of the IC chip 20. Thus, it is preferable that the planarizing layer 67 have light-shielding characteristics. In the case of providing an external connection terminal (an electrode pad or the like) of the IC chip 20 on the mounting surface side of the IC chip 20, it is necessary to provide the planarizing layer 67 with an opening for the external connection terminal.

Subsequently, as illustrated in FIG. 22, the N-side common electrode 33 is formed on the N-side epitaxial layer 52 of the light emitting array 30.

Subsequently, as illustrated in FIG. 23, the wavelength conversion layer 68 is formed on each light emitting unit 31. As the wavelength conversion layer 68, various types of phosphor layers, a quantum dot wavelength conversion layer, a wavelength conversion layer formed of a quantum well layer thin film, or the like can be used. Phosphor is advantageous in that the cost is relatively low and the performance is stable over a long period. A quantum dot wavelength conversion layer is advantageous in that the half width of the emission spectrum is narrow and the color gamut can be extended. The wavelength conversion layer 68 need not be made of a single material. For example, a phosphor layer may be formed of a phosphor emitting white light, and a color filter of a desired color may be disposed on the phosphor layer so that each pixel 40 emits light of the desired color. In this case, the wavelength conversion layer 68 has a two-layer structure including a white light emitting phosphor layer and a color filter layer.

Furthermore, it is preferable that the spaces between the wavelength conversion layers 68 be filled with a light-shielding layer 69 and that the light-shielding layer 69 be formed also on the wiring unit 32. In addition, it is preferable that the reflective material 62 be able to reflect the light whose wavelength has been converted by the wavelength conversion layer 68.

Such a configuration including the wavelength conversion layer 68 is preferable because, for example, a blue-violet LED can be used. The blue-violet LED emits, for example, near-ultraviolet light with a wavelength of around 405 nm, and has high light emission efficiency and a high excitation light rate of the wavelength conversion layer 68. Thus, use of the blue-violet LED enables the power consumption of the LED display chip 1 to be reduced. Furthermore, since human visual sensitivity to near-ultraviolet light is low, there is an advantage that an effect of decreasing the color purity of the pixel 40 is small even if there are some near-ultraviolet light components emitted to the outside through the wavelength conversion layer 68.

Furthermore, the configuration including the wavelength conversion layer 68 is particularly preferable to the LED display chip 1 for red monochromatic display. In the configuration not including the wavelength conversion layer 68, the light emitting unit 31 needs to emit red monochromatic light, and thus the light emitting unit 31 is an AlInGaP-based red LED. In the AlInGaP-based red LED, the emission wavelength and the emission intensity are more temperature-dependent than in an InGaN-based LED, and it is necessary to suppress variation in color tone and brightness caused by a temperature rise. On the other hand, in the configuration including the wavelength conversion layer 68, an LED that emits another color, for example, an InGaN-based blue-violet LED can be used. In the InGaN-based blue-violet LED, the emission peak wavelength is around 405 nm, the emission wavelength and the emission intensity are less temperature-dependent, and it is easy to handle. Thus, the combination of the blue-violet LED and the wavelength conversion layer 68 makes it possible to produce the LED display chip 1 for red monochromatic display, which is easy to handle like the LED display chip 1 using a blue-violet LED.

The InGaN-based blue-violet LED has a configuration equivalent to that of the InGaN-based blue LED, and a major difference from the blue LED is that the emission wavelength is shorter because of low In concentration of an InGaN layer constituting a multiquantum well layer which is the light emitting layer 53. Thus, the light emitting array 30 including a blue-violet LED can be manufactured by exemplary steps illustrated in FIG. 9 to FIG. 19 similarly to the light emitting array 30 including a blue LED.

SECOND MODIFICATION EXAMPLE

Figure 24:
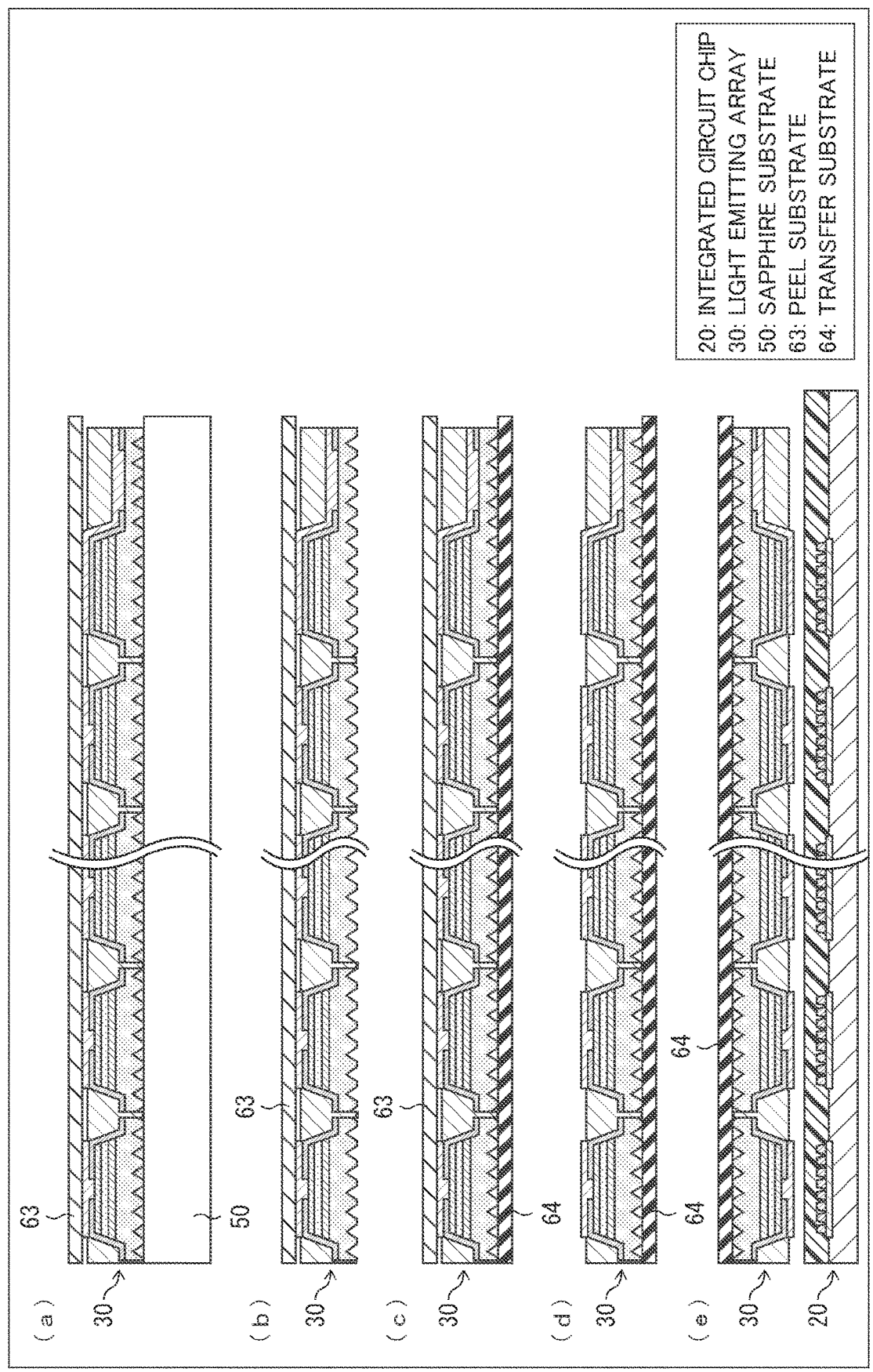
FIG. 24 is a cross-sectional view for describing part of another modification example of assembly steps of the LED display chip according to the one embodiment of the present invention.

Hereinafter, a detailed description will be given of a modification example of manufacturing steps of manufacturing the LED display chip 1 in the case of moving the light emitting array 30 onto a peel substrate 63 and a transfer substrate 64, with reference to FIG. 24. Parts (a) to (e) of FIG. 24 illustrate an exemplary sequence of manufacturing steps subsequent to the steps illustrated in FIG. 9 to FIG. 15 in order. Thus, reference numerals in a figure illustrating a preceding step will appropriately be omitted in a figure illustrating a subsequent step for the sake of simplicity.

FIG. 24 is a diagram illustrating exemplary steps that are performed subsequently to the steps illustrated in FIG. 9 to FIG. 15 in the case of moving the light emitting array 30 onto the peel substrate 63 and the transfer substrate 64.

The method for mounting the light emitting array 30 on the IC chip 20 may be a method for moving the light emitting array 30 onto the peel substrate 63 and the transfer substrate 64 as illustrated in FIG. 24 as well as a method for placing the light emitting array 30 on the IC chip 20 with the light emitting array 30 having the sapphire substrate 50 as illustrated in FIG. 17.

After the step illustrated in FIG. 15, the light emitting array 30 is bonded to the peel substrate 63 as illustrated in part (a) of FIG. 24, and then the sapphire substrate 50 is selectively peeled off from the light emitting array 30 as illustrated in part (b) of FIG. 24. Subsequently, the light emitting array 30 is bonded to the transfer substrate 64 as illustrated in part (c) of FIG. 24, and then the peel substrate 63 is peeled off from the light emitting array 30 as illustrated in part (d) of FIG. 24. Subsequently, as illustrated in part (e) of FIG. 24, the light emitting array 30 including the transfer substrate 64 is flipped upside down, placed on the IC chip 20, and then aligned and bonded to the IC chip 20.

When being bonded in the steps illustrated in FIG. 24, the light emitting array 30 has the transfer substrate 64 and thus has a sufficient mechanical strength as in the case of the steps illustrated in FIG. 16 and FIG. 17. Alternatively, the combination of the resin layer 65 and the microbumps 66 may be replaced with an anisotropic conductive resin or an anisotropic conductive tape.

Subsequently, the transfer substrate 64 is selectively peeled off from the light emitting array 30, and then the configuration illustrated in FIG. 18 can be obtained.

(Display System)

Hereinafter, a display system 7 will be described in detail with reference to FIG. 25.

Figure 25:
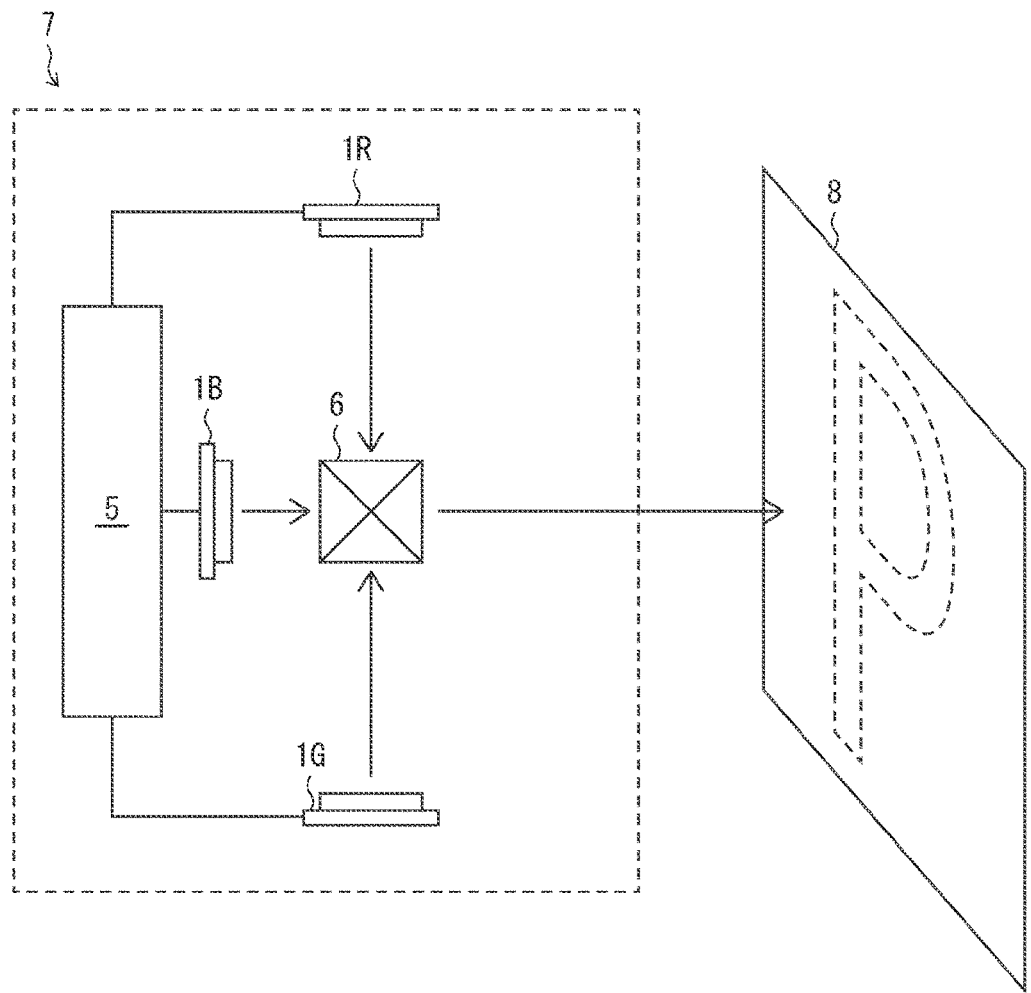
FIG. 25 is a diagram illustrating a schematic configuration of a display system including LED display chips according to some embodiments of the present invention.

FIG. 25 is a diagram illustrating a schematic configuration of the display system 7 including the LED display chips 1 (1B, 1G, and 1R) according to the present first embodiment.

As illustrated in FIG. 25, the display system 7 includes a blue LED display chip 1B, a green LED display chip 1G, a red LED display chip 1R, a center control device 5, and a prism 6, and arbitrarily includes an optical system or the like which is not illustrated. The display system 7 projects an image ("P" in FIG. 25) on a projection surface 8.

Each of the blue LED display chip 1B, the green LED display chip 1G, and the red LED display chip 1R is the LED display chip 1 described above with reference to FIG. 1 to FIG. 24.

The blue LED display chip 1B, whose pixels 40 emit blue light, is able to project a blue monochromatic image. Each pixel 40 may have a configuration in which the light emitting unit 31 directly emits blue light without the wavelength conversion layer 68, or may have a configuration in which the wavelength conversion layer 68 converts the light emitted by the light emitting unit 31 into blue light.

Likewise, the green LED display chip 1G, whose pixels 40 emit green light, is able of project a green monochromatic image. Likewise, the red LED display chip 1R, whose pixels 40 emit red light, is able to project a red monochromatic image.

The center control device 5 divides color image data into pieces of monochromatic image data of blue, green, and red, and supplies the pieces of monochromatic image data to the blue LED display chip 1B, the green LED display chip 1G, and the red LED display chip 1R, respectively.

The prism 6 combines the monochromatic images projected by the blue LED display chip 1B, the green LED display chip 1G, and the red LED display chip 1R. Accordingly, the display system 7 is able to project, onto the projection surface, a color image obtained by combining the red, green, and blue monochromatic images. The individual light emitting units 31 of the blue LED display chip 1B, the green LED display chip 1G, and the red LED display chip 1R correspond to, in a one-to-one relationship, the pixels constituting the color image that is projected and displayed.

The display system 7 is able to project a lighter image than a display system using a conventional optical switch and is thus more suitable for projection and display on a large screen.

Second Embodiment

A second embodiment of the present invention will be described below with reference to FIG. 26 to FIG. 36. For convenience of description, the elements having the same functions as those of the elements described in the foregoing embodiment will be denoted by the same reference numerals, and the description thereof will be omitted.

FIG. 26 corresponds to a cross-sectional view taken along line A-A of the LED display chip 1 illustrated in FIG. 1, and is a cross-sectional view of the LED display chip 1 according to the present second embodiment.

As illustrated in FIG. 26, the light emitting array 30 according to the present second embodiment includes, like the light emitting array 30 according to the foregoing first embodiment, the compound semiconductor layer 51 including the N-side epitaxial layer 52, the light emitting layer 53, and the P-side epitaxial layer 54 that are stacked in this order; the protective film 57 for protecting the compound semiconductor layer 51 and the transparent conductive film 55; the N-side wiring electrodes 43 that are in contact with the N-side epitaxial layer 52 through the N-side contact holes 59 provided in the protective film 57; the reflective material 62 that fills the spaces between portions of the compound semiconductor layer 51 that is divided into units (light emitting units 31 and wiring units 32); and the N-side common electrode 33 that is in contact with the N-side epitaxial layer 52.

Unlike the light emitting array 30 according to the foregoing first embodiment, the light emitting array 30 according to the present second embodiment further includes a first transparent conductive film pattern 55a and a second transparent conductive film pattern 55b that are in contact with the P-side epitaxial layer 54, first P-side individual electrodes 42a that are in contact with the first transparent conductive film pattern 55a through first P-side contact holes 58a provided in the protective film 57, and second P-side individual electrodes 42b that are in contact with the second transparent conductive film pattern 55b through second P-side contact holes 58b provided in the protective film 57.

The light emitting array 30 according to the present second embodiment is constituted by a plurality of light emitting units 31 and a plurality of wiring units 32, like the light emitting array 30 according to the foregoing first embodiment. Each light emitting unit 31 according to the present second embodiment includes a first LED 41a and a second LED 41b (two light emitting elements) unlike the light emitting unit 31 according to the foregoing first embodiment.

As illustrated in FIG. 26, the IC chip 20 according to the present second embodiment includes the silicon substrate 45, the microbumps 66, and the resin layer 65, like the IC chip 20 according to the foregoing first embodiment. The IC chip 20 according to the present second embodiment includes, unlike the IC chip 20 according to the foregoing first embodiment, first P-side electrodes 46a, second P-side electrodes 46b, and N-side electrodes 47 each formed of two portions, which are disposed on the uppermost surface of the silicon substrate 45. The drive circuits 70 for driving the light emitting units 31 of the light emitting array 30 are disposed on the silicon substrate 45, and each drive circuit 70 includes the P-side electrodes 46.

The drive circuits 70 for driving the light emitting units 31 of the light emitting array 30 are disposed on the silicon substrate 45. Each drive circuit 70 includes the first P-side electrode 46a and the second P-side electrode 46b, unlike in the foregoing first embodiment.

Thus, the LED display chip 1 according to the present second embodiment is different from the LED display chip 1 according to the foregoing first embodiment in the following two points, but is equivalent thereto in terms of the other points.

The light emitting unit 31 is changed from a configuration including one LED to a configuration including two LEDs (first LED 41a and second LED 41b).

The drive circuit 70 is changed from a circuit configuration for driving one LED to a circuit configuration for driving two LEDs.

(Light Emitting Array)

Hereinafter, the light emitting array 30 according to the present second embodiment will be described in detail with reference to FIG. 27.

FIG. 27 corresponds to an enlarged view of the portion B defined by the broken line in FIG. 3, and is a plan view of the light emitting array 30 according to the present second embodiment viewed from a side where the first P-side individual electrodes 42a, the second P-side individual electrodes 42b, and the N-side wiring electrode 43 illustrated in FIG. 26 exist. For convenience of illustration, an inside portion of the light emitting array 30 is illustrated on the left in FIG. 27, and an edge portion of the light emitting array 30 is illustrated on the right in FIG. 27, with the other portion not being illustrated.

As illustrated in FIG. 27, in each light emitting unit 31, the first P-side individual electrode 42a is in contact with the first transparent conductive film pattern 55a through the first P-side contact hole 58a represented by a broken line. Also, the second P-side individual electrode 42b is in contact with the second transparent conductive film pattern 55b through the second P-side contact hole 58b represented by a broken line. In this way, the configuration of the light emitting unit 31 according to the present second embodiment illustrated in FIG. 27 has two portions corresponding to the two LEDs (first LED 41a and second LED 41b) compared with the configuration according to the foregoing first embodiment illustrated in FIG. 4.

The compound semiconductor layer 51 is not divided into two portions, and is a single body in each light emitting unit 31. In an InGaN-based compound semiconductor constituting a blue LED, the resistivity of the P-side epitaxial layer 54 is very high and the current flowing in a lateral direction (an in-plane direction of the light emitting array 30) through the P-side epitaxial layer 54 can be ignored, and thus the compound semiconductor layer 51 may be a single body. When the current in the lateral direction flowing through the P-side epitaxial layer 54 is not negligible, it is necessary to divide the P-side epitaxial layer 54 into two portions. For example, each of the two LEDs (first LED 41a and second LED 41b) may be formed as an independent mesa. Also in this case, the N-side epitaxial layer 52 may be a single body and may be shared.

Also in the wiring unit 32, the transparent conductive film 55 is divided into the first transparent conductive film pattern 55a and the second transparent conductive film pattern 55b. This is merely resulted from the similarity between the structure of the wiring unit 32 and the structure of the light emitting unit 31. Alternatively, in the wiring unit 32, the transparent conductive film 55 may be a single body as in FIG. 4.

(IC Chip)

Hereinafter, the IC chip 20 according to the present second embodiment will be described in detail with reference to FIG. 28.

Figure 28:
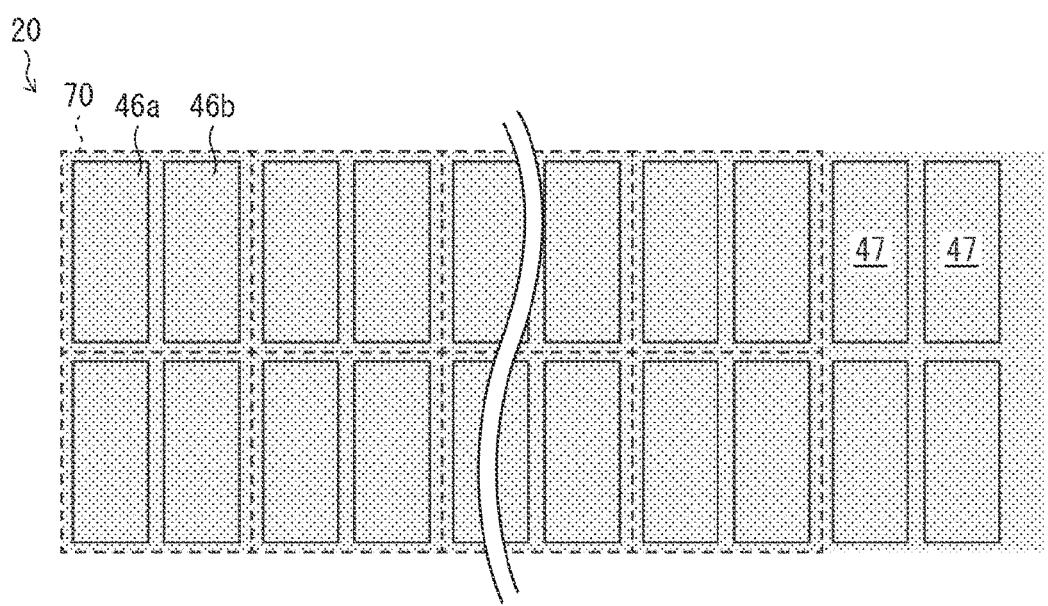
FIG. 28 corresponds to an enlarged view of the portion C defined by the broken line in FIG. 5, and is a plan view illustrating a schematic configuration of an IC chip according to the other embodiment of the present invention.

FIG. 28 corresponds to an enlarged view of the portion C defined by the broken line in FIG. 5, and is a plan view of the IC chip 20 according to the present second embodiment viewed from the side where the first P-side electrodes 46a, the second P-side electrodes 46b, and the N-side electrode 47 illustrated in FIG. 26 exist. For convenience of illustration, an inside portion of the IC chip 20 is illustrated on the left in FIG. 28, and an edge portion of the IC chip 20 is illustrated on the right in FIG. 28, with the other portion not being illustrated.

As illustrated in FIG. 28, each drive circuit 70 includes the first P-side electrode 46a corresponding to the first P-side individual electrode 42a of the light emitting array 30, and includes the second P-side electrode 46b corresponding to the second P-side individual electrode 42b of the light emitting array 30.

The N-side electrode 47 of the IC chip 20 corresponding to the N-side wiring electrode 43 of the wiring unit 32 is divided into two portions, compared to FIG. 6. This is merely a result of the similarity between the structure of the N-side electrode 47 and the structure of the first P-side electrode 46a and the second P-side electrode 46b. Alternatively, the N-side electrode 47 may be a single body as in FIG. 6.

(Drive Circuit)

Hereinafter, the drive circuit 70 according to the present second embodiment will be described in detail with reference to FIG. 29.

FIG. 29 is a circuit diagram illustrating an example of the drive circuit 70 according to the second embodiment.

The drive circuit 70 according to the present second embodiment illustrated in FIG. 29 is connected to the row-selection signal line 71, the column signal line 72, the power supply line 73, the N-side electrode 47, and the GND line 74 and includes the row-selection transistor 75, the voltage holding capacitor 76, and the drive transistor 77, like the drive circuit 70 according to the foregoing first embodiment illustrated in FIG. 7.

Unlike the drive circuit 70 illustrated in FIG. 7, the drive circuit 70 illustrated in FIG. 29 is connected to a first gate control signal line 79a for supplying a first control gate voltage and a second gate control signal line 79b for supplying a second control gate voltage, and includes a first nonvolatile memory transistor 78a, a second nonvolatile memory transistor 78b, a first test transistor 80a, a second test transistor 80b, a first test terminal 81a, a second test terminal 81b, the first P-side electrode 46a, and the second P-side electrode 46b. In addition, when the light emitting array 30 is mounted on the IC chip 20, the drive circuit 70 is connected to the first LED 41a and the second LED 41b of the light emitting unit 31. The first test terminal 81*a* and the second test terminal 81*b* may be connected to each other.

In FIG. 29, the portion constituted by the first nonvolatile memory transistor 78*a*, the first test transistor 80*a*, the first test terminal 81*a*, and the first P-side electrode 46*a* and the portion constituted by the second nonvolatile memory transistor 78*b*, the second test transistor 80*b*, the second test terminal 81*b*, and the second P-side electrode 46*b* have the same configuration as the portion constituted by the nonvolatile memory transistor 78, the test transistor 80, the test terminal 81, and the P-side electrode 46 illustrated in FIG. 7, and are connected in parallel between the source terminal of the drive transistor 77 and the GND line 74. Thus, the drive circuit 70 illustrated in FIG. 29 is able to independently control current supply to the first LED 41*a* and the second LED 41*b* of the light emitting unit 31 and to perform a test similarly to the drive circuit 70 illustrated in FIG. 7. The number of circuit portions each constituted by a nonvolatile memory transistor, a test transistor, a test terminal, and a P-side electrode is not limited thereto and may correspond to the number of LEDs included in the light emitting unit 31.

With the circuit configuration illustrated in FIG. 29, a light emission test can be performed on each of the first LEDs 41*a* and the second LEDs 41*b* of the light emitting units 31 after the light emitting array 30 is mounted on the IC chip 20, and power supply to a defective first LED 41*a* or second LED 41*b* can be blocked so that the defective LED does not emit light.

First, a light emission test is performed on the first LEDs 41*a*. Specifically, the row-selection transistors 75 and the drive transistors 77 for the individual light emitting units 31 are sequentially turned ON, with the first test transistors 80*a* and the second nonvolatile memory transistors 78*b* being in an OFF state and with the first nonvolatile memory transistors 78*a* being in an ON state, and the luminous characteristics of the first LEDs 41*a* of the individual light emitting units 31 are sequentially evaluated.

After the luminous characteristics of the first LEDs 41*a* of all the light emitting units 31 are evaluated, in the pixel 40 including a defective first LED 41*a*, a signal is written in the first nonvolatile memory transistor 78*a* so that the first nonvolatile memory transistor 78*a* remains in an OFF state at an operating first control gate voltage. In the pixel 40 including a non-defective first LED 41*a*, a signal is written in the second nonvolatile memory transistor 78*b* so that the second nonvolatile memory transistor 78*b* remains in an OFF state at an operating second control gate voltage.

Subsequently, a light emission test is performed on the second LEDs 41*b* of the light emitting units 31 whose first LED 41*a* is defective. Specifically, the row-selection transistors 75 and the drive transistors 77 for the individual light emitting units 31 whose first LED 41*a* is defective are sequentially turned ON, with the second test transistors 80*b* and the first nonvolatile memory transistors 78*a* being in an OFF state and with the second nonvolatile memory transistors 78*b* being in an ON state, and the luminous characteristics of the second LEDs 41*b* are sequentially evaluated.

After the luminous characteristics of the second LEDs 41*b* are evaluated, in the pixel 40 including a defective second LED 41*b*, a signal is written in the second nonvolatile memory transistor 78*b* so that the second nonvolatile memory transistor 78*b* remains in an OFF state at an operating second control gate voltage.

In most cases, a defect in LEDs occurs locally, and the possibility that both the two LEDs (first LED 41*a* and second LED 41*b*) included in one light emitting unit 31 are defective is below low. Thus, in the light emitting unit 31 including two or more LEDs, use of a non-defective LED prevents the light emitting unit 31 from being defective even if one or some of the LEDs included therein are defective. In this way, the manufacturing yield of the light emitting array 30 can be increased by making the defective rate of the light emitting units 31 very low.

When both the first LED 41*a* and the second LED 41*b* are defective, the light emitting unit 31 is defective, and accordingly there is a black pixel among the plurality of pixels 40 included in the LED display chip 1. In this case, the LED display chip 1 can be used for an application in which a black pixel is allowed, as in the case of the LED display chip 1 according to the foregoing first embodiment.

As an example, a light emitting array 30 was manufactured in which light emitting units 31 were arranged such that the number of effective pixels of the VGA standard was 480×640. In this case, the number of light emitting units 31 whose first LED 41*a* was defective was 31 in average per light emitting array 30. Among the light emitting units 31 whose first LED 41*a* was defective, thirty light emitting units 31 were non-defective products with use of the second LED 41*b*. As a result of operating the LED display chip 1, the maximum brightness was 2000 [lm]. The contrast was equal to or more than the limit of measurement, and the power consumption was 50 [W] at maximum. The NTSC ratio was 103%, and a favorable result was obtained regarding the color gamut.

(Manufacturing of Light Emitting Array)

Hereinafter, manufacturing steps of manufacturing the light emitting array 30 according to the present second embodiment will be described in detail with reference to FIG. 30 to FIG. 36. FIG. 30 to FIG. 36 illustrate an exemplary sequence of steps in order. Thus, reference numerals in a figure illustrating a preceding step will appropriately be omitted in a figure illustrating a subsequent step for the sake of simplicity.

FIG. 30 to FIG. 36 are diagrams illustrating exemplary manufacturing steps of manufacturing the light emitting array 30 according to the present second embodiment in order.

The exemplary steps illustrated in FIG. 30 to FIG. 36 are equivalent to the exemplary steps illustrated in FIG. 9 to FIG. 15 except for the steps related to the first P-side individual electrode 42*a* and the second P-side individual electrode 42*b*, and the first transparent conductive film pattern 55*a* and the second transparent conductive film pattern 55*b*. Thus, the same points as those described above with reference to FIG. 9 to FIG. 15 in the foregoing first embodiment will not be described for convenience of description.

First, as illustrated in FIG. 30, an uneven pattern is formed on the upper surface of the sapphire substrate 50, the compound semiconductor layer 51 including the N-side epitaxial layer 52, the light emitting layer 53, and the P-side epitaxial layer 54 that are stacked in this order is formed on the sapphire substrate 50, and the transparent conductive film 55 is formed on the upper surface of the compound semiconductor layer 51.

Subsequently, as illustrated in FIG. 31, the transparent conductive film 55 is partially removed by, for example, photolithography, to perform patterning for forming the first transparent conductive film pattern 55*a* and the second transparent conductive film pattern 55*b*. Subsequently, the N-side epitaxial layer 52, the light emitting layer 53, and the P-side epitaxial layer 54 are partially removed by etching. Accordingly, the mesas 56, each corresponding to a unit, are formed, and the N-side epitaxial layer 52 is exposed in the N-side epitaxial layer exposed region 35 of the wiring unit 32.

Figure 32:
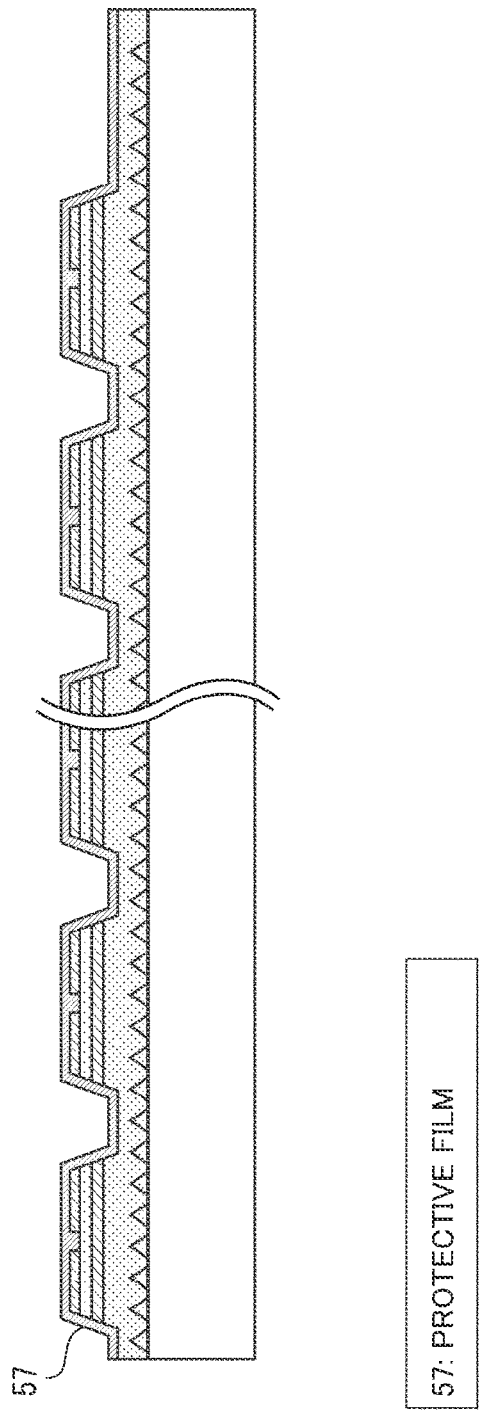
FIG. 32 is a cross-sectional view for describing part of the exemplary manufacturing steps of the light emitting array according to the other embodiment of the present invention.

Subsequently, as illustrated in FIG. 32, the protective film 57 is formed. In the present second embodiment, the protective film 57 is disposed between the first transparent conductive film pattern 55a and the second transparent conductive film pattern 55b, which makes it possible to prevent leakage from a portion therebetween.

Figure 33:
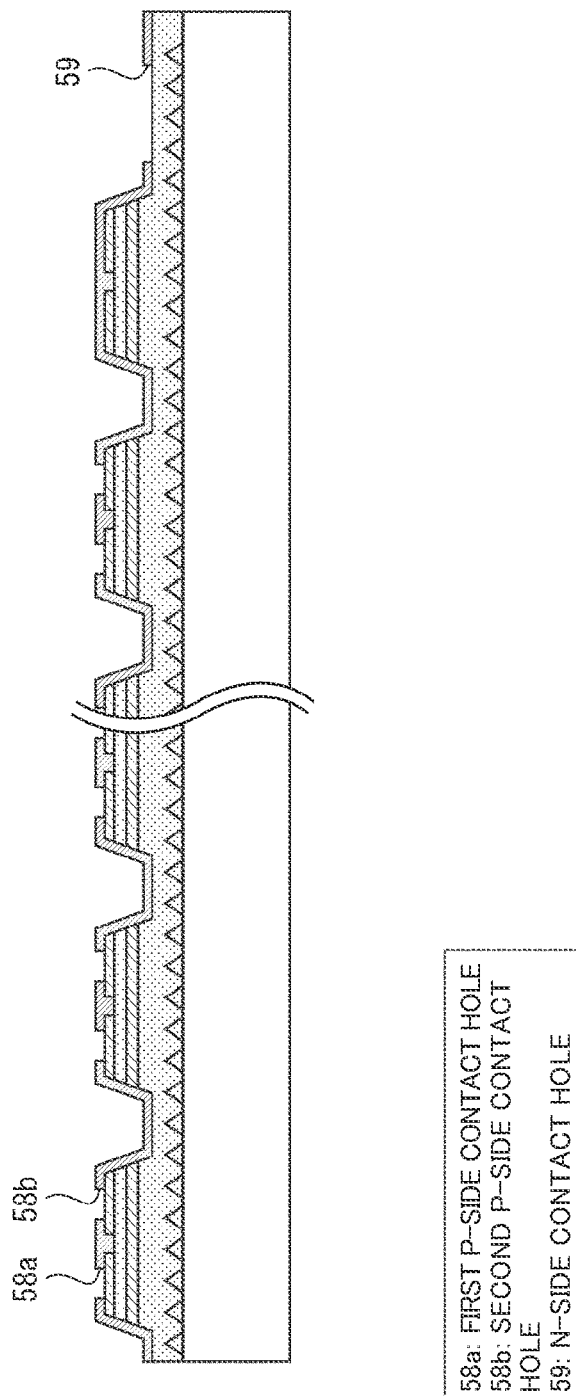
FIG. 33 is a cross-sectional view for describing part of the exemplary manufacturing steps of the light emitting array according to the other embodiment of the present invention.

Subsequently, as illustrated in FIG. 33, the first P-side contact holes 58a, the second P-side contact holes 58b, and the N-side contact holes 59 are formed in the protective film 57.

Figure 34:
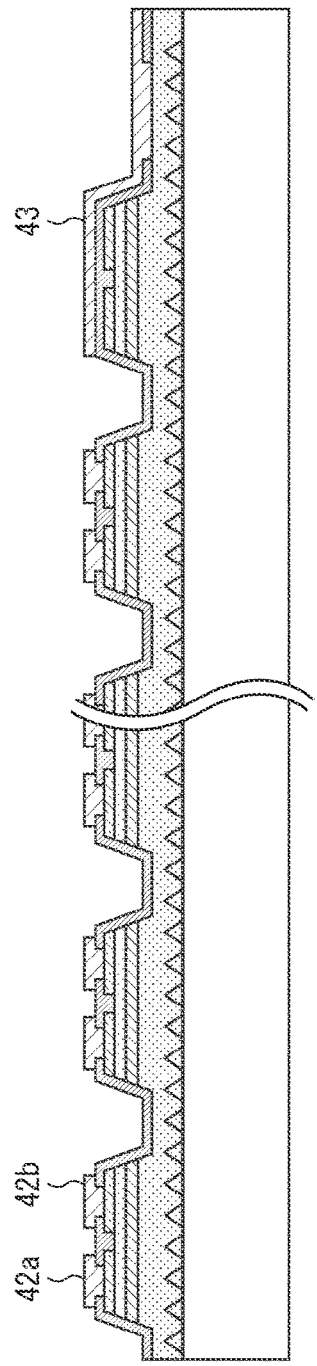
FIG. 34 is a cross-sectional view for describing part of the exemplary manufacturing steps of the light emitting array according to the other embodiment of the present invention.

Subsequently, as illustrated in FIG. 34, an electrode film is formed and partially removed to form the first P-side individual electrodes 42a, the second P-side individual electrodes 42b, and the N-side wiring electrodes 43.

Figure 35:
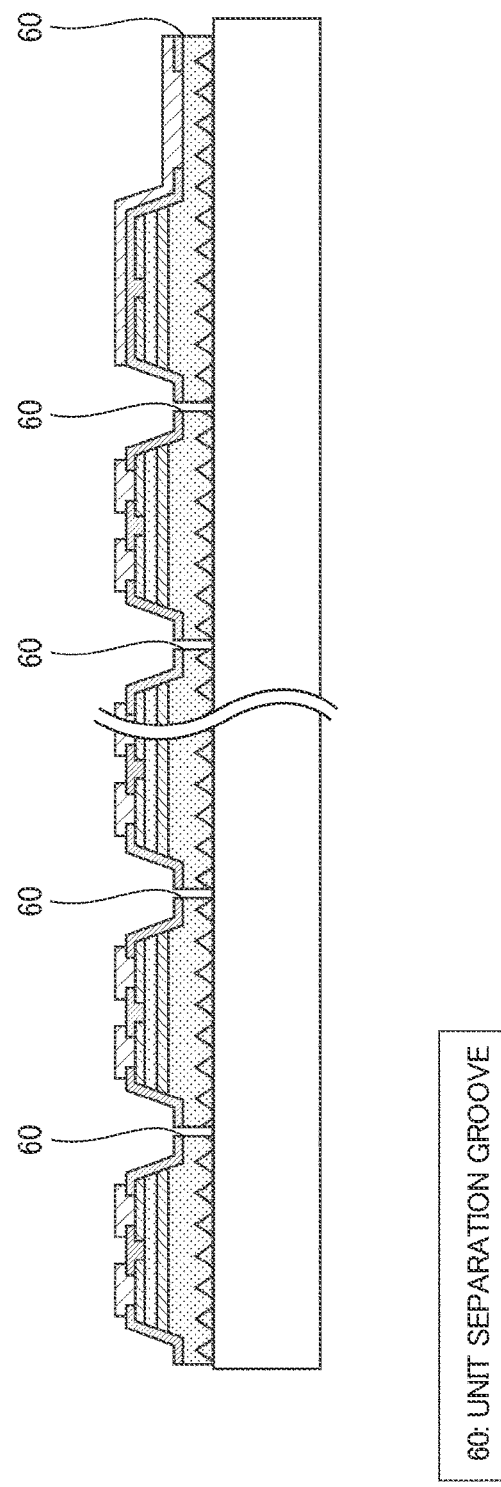
FIG. 35 is a cross-sectional view for describing part of the exemplary manufacturing steps of the light emitting array according to the other embodiment of the present invention.

Subsequently, as illustrated in FIG. 35, the unit separation grooves 60 are formed on bottom surfaces of recessed portions between the mesas 56. At the same time, the portion of the compound semiconductor layer 51 outside the outer periphery of the light emitting array 30 is removed.

Figure 36:
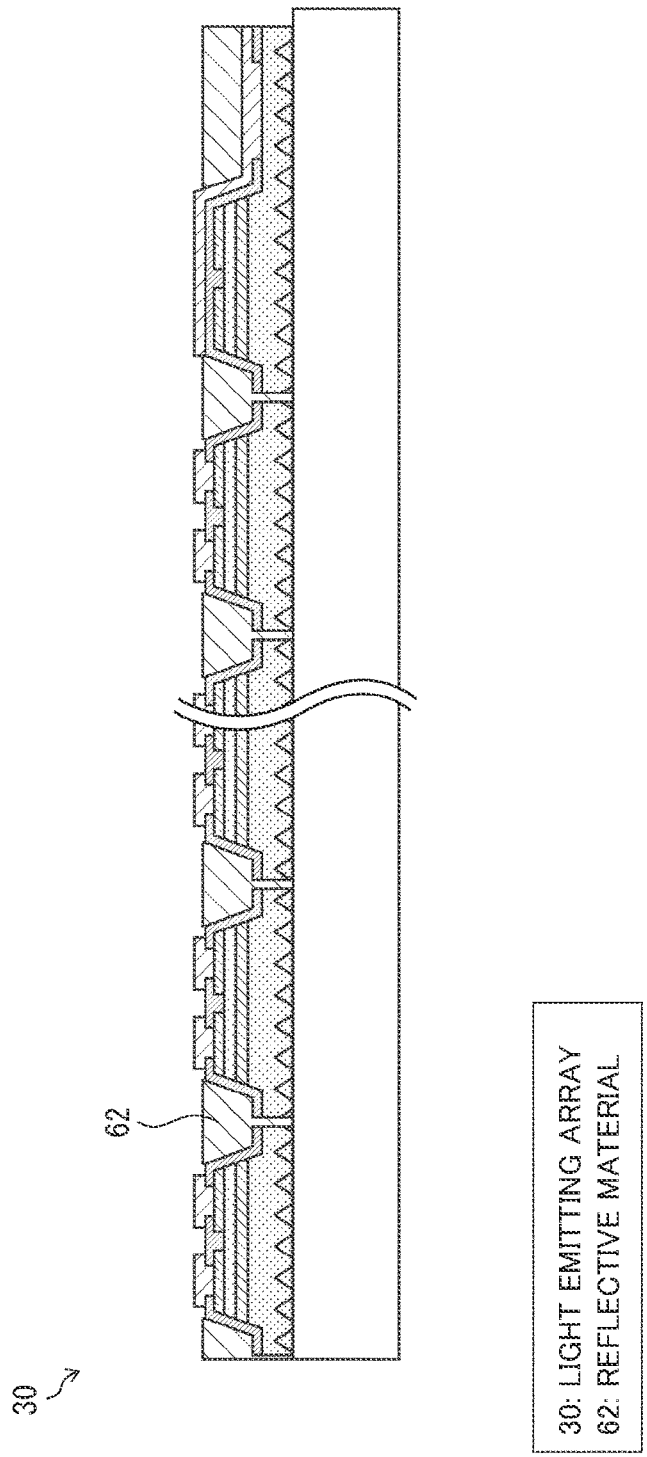
FIG. 36 is a cross-sectional view for describing part of the exemplary manufacturing steps of the light emitting array according to the other embodiment of the present invention.

Subsequently, as illustrated in FIG. 36, at least the recessed portions between the mesas 56 and the unit separation grooves 60 are filed with the reflective material 62.

In the above-described manner, through the steps illustrated in FIG. 30 to FIG. 36, the sapphire wafer W2 illustrated in part (a) of FIG. 8 on which the light emitting arrays 30 are monolithically formed is completed.

The assembly steps of mounting the light emitting array 30 on the IC chip 20 according to the present second embodiment is similar to that of the foregoing first embodiment, and thus the description thereof is omitted. In the foregoing first embodiment, it is also possible to provide the wavelength conversion layer 68 as described with reference to FIG. 21 to FIG. 23 and to move the light emitting array 30 onto the peel substrate 63 and the transfer substrate 64 as described with reference to FIG. 24.

Third Embodiment

A third embodiment of the present invention will be described below with reference to FIG. 37 to FIG. 39. For convenience of description, the elements having the same functions as those of the elements described in the foregoing embodiments will be denoted by the same reference numerals, and the description thereof will be omitted.

Figure 37:
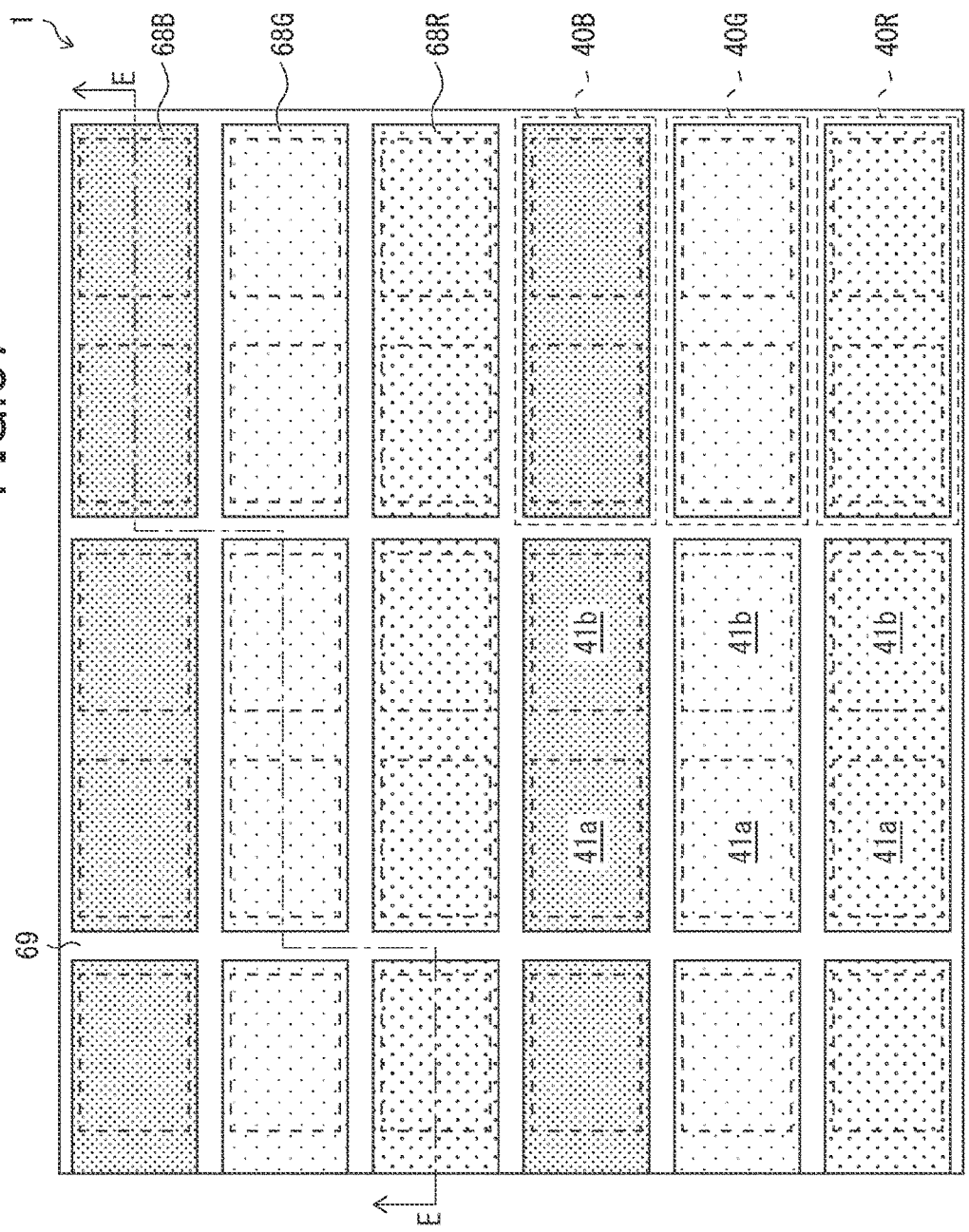
FIG. 37 is a partial plan view illustrating a schematic configuration of a LED display chip according to still another embodiment of the present invention.

FIG. 37 is a partial plan view of the LED display chip 1 according to the third embodiment.

The LED display chip 1 according to the present third embodiment has a configuration in which a blue wavelength conversion layer 68B, a green wavelength conversion layer 68G, a red wavelength conversion layer 68R, the light-shielding layer 69, and the planarizing layer 67 which is not illustrated are provided in the LED display chip 1 according to the foregoing second embodiment. Thus, the LED display chip 1 according to the present third embodiment alone is able to project and display a color image.

Figure 38:
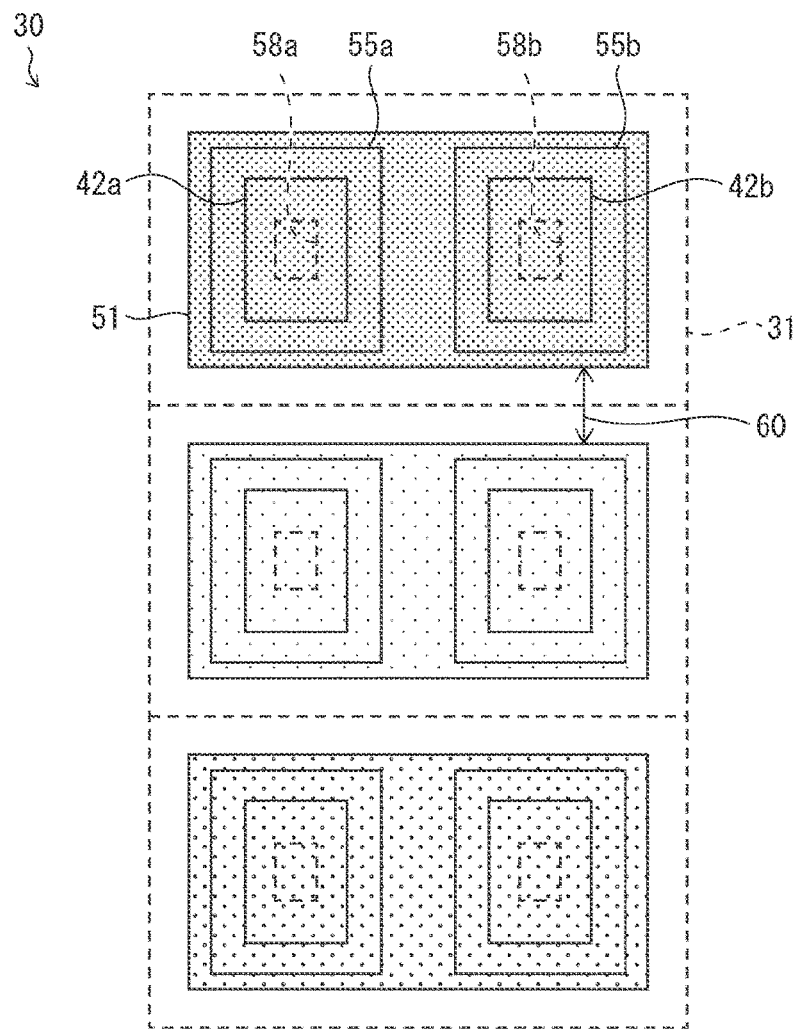
FIG. 38 is a plan view illustrating a schematic configuration of a light emitting array according to the still another embodiment of the present invention.

FIG. 38 is a plan view of the light emitting array 30 according to the present third embodiment viewed from the side where the P-side individual electrodes 42 and the N-side wiring electrode 43 illustrated in FIG. 2 exist. The light emitting unit 31 illustrated in FIG. 38 has the same configuration as that of the light emitting unit 31 illustrated in FIG. 27 and thus the description thereof is omitted.

Figure 39:
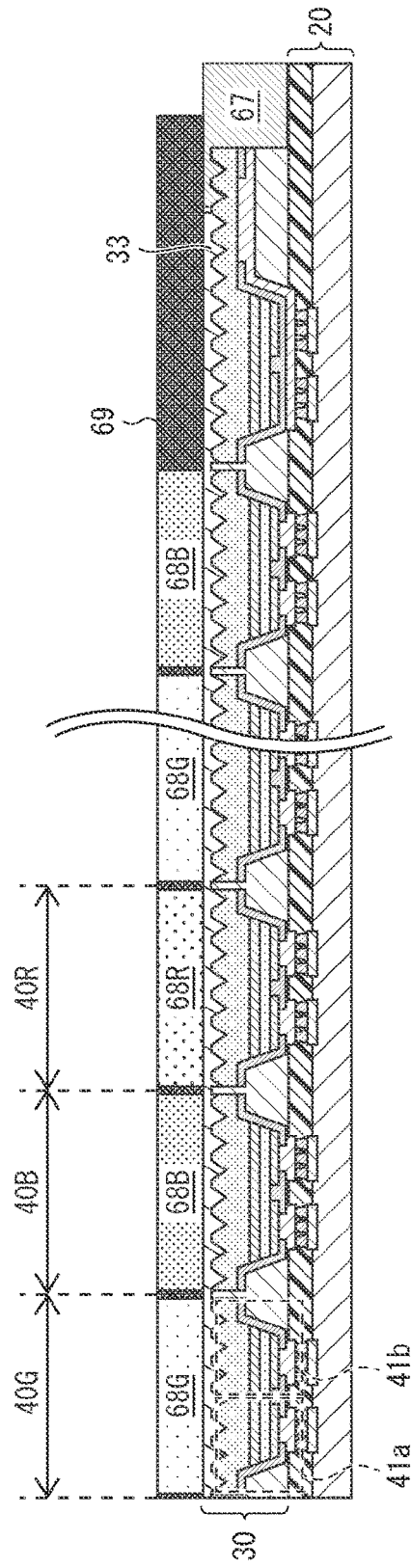
FIG. 39 corresponds to a cross-sectional view taken along line E-E in FIG. 37, and is a cross-sectional view of an LED display chip according to the still another embodiment of the present invention.

FIG. 39 corresponds to a cross-sectional view taken along line E-E of the LED display chip 1 illustrated in FIG. 37, and is a cross-sectional view of the LED display chip 1 according to the third embodiment.

The wavelength conversion layers 68B, 68G, and 68R of individual colors, the light-shielding layer 69, and the planarizing layer 67 according to the present third embodiment illustrated in FIG. 39 are similar to the wavelength layer 68, the light-shielding layer 69, and the planarizing layer 67 illustrated in FIG. 21 to FIG. 23.

In the present third embodiment, the light emitted by the light emitting unit 31 is subjected to wavelength conversion by the blue wavelength conversion layer 68B, the green wavelength conversion layer 68G, or the red wavelength conversion layer 68R disposed thereon. Thus, the first LED 41a and the second LED 41b of the light emitting unit 31 are, for example, blue-violet LEDs to emit light with a shorter wavelength.

In the LED display chip 1 according to the present third embodiment, the area of red sub-pixels 40R is one third of the area of an effective portion of the light emitting array 30. Also, each of the area of blue sub-pixels 40B and the area of green sub-pixels 40G is one third of the area of the effective portion of the light emitting array 30. Thus, it is necessary to highly accurately form the wavelength conversion layers 68B, 68G, and 68R of individual colors on the corresponding light emitting units 31, and thus the manufacturing yield may be lower than that in the foregoing first and second embodiments for projecting and displaying a monochromatic image. On the other hand, the LED display chip 1 according to the present third embodiment alone is able to project and display a color image, and thus has a major advantage that the optical system (prism 6) illustrated in FIG. 25 for combining a plurality of monochromatic images is not necessary and the optical system of the display system 7 can be simplified.

The area and brightness of each of the blue sub-pixels 40B, the green sub-pixels 40G, and the red sub-pixels 40R are adjusted such that the overall emitted light is white. Normally, the wavelength conversion layers 68B, 68G, and 68R of individual colors are different in efficiency, and thus the areas of the first LEDs 41a and the second LEDs 41b of the light emitting units 31 thereunder and the drive current I supplied thereto are adjusted.

The area of a pixel constituted by one blue sub-pixel 40B, one green sub-pixel 40G, and one red sub-pixel 40R (not illustrated) is 20 μm×20 μm when the light emitting units 31 each having a size of 19 μm×5.67 μm are arranged at a pitch of about 1 μm. In this case, when the pixels 40 are arranged such that the number of effective pixels of the VGA standard is 480×640, the area of the effective portion of the light emitting array 30 is 9.6 mm×12.8 mm. The area of the IC chip 20 including the pixel drive circuit array portion 24, the image processing circuit portion 21, the row-selection circuit portion 22, and the column signal output circuit portion 23 is, for example, 15 mm×18 mm.

The LED display chip 1 according to the present third embodiment is not limited to the configuration illustrated in FIG. 37 to FIG. 39. For example, the LED display chip 1 according to the foregoing first embodiment in which each light emitting unit 31 is one LED may be provided with the blue wavelength conversion layer 68B, the green wavelength conversion layer 68G, the red wavelength conversion layer 68R, the light-shielding layer 69, and the planarizing layer 67.

Fourth Embodiment

A fourth embodiment of the present invention will be described below with reference to FIG. 29. For convenience of description, the elements having the same functions as those of the elements described in the foregoing embodiments will be denoted by the same reference numerals, and the description thereof will be omitted.

The LED display chip 1 according to the present fourth embodiment is similar to the LED display chip 1 according to the foregoing second embodiment except that the drive transistor 77 in the drive circuit 70 of the LED display chip 1 according to the foregoing second embodiment is changed from a P-type MOS transistor to an N-type MOS transistor.

Thus, similarly to the LED display chip 1 according to the foregoing second embodiment, the LED display chip 1 according to the present fourth embodiment is able to perform a light emission test on each of the first LEDs 41a and the second LEDs 41b of the light emitting units 31 and to block power supply to a defective first LED 41a or second LED 41b.

In addition, the LED display chip 1 according to the present fourth embodiment is able to change the amount of the drive current I to be supplied to the first LED 41a or the second LED 41b of each light emitting unit 31. This makes it possible to adjust light emission intensity when there is variation in luminous characteristics of the first LED 41a or the second LED 41b to emit light in each light emitting unit 31. Thus, the allowable range of the luminous characteristics of the first LED 41a and the second LED 41b evaluated as a non-defective product can be extended, and the number of defective light emitting units 31 can be reduced. In addition, the light emission intensities of the light emitting units 31 of the light emitting array 30 can be made uniform.

First, a light emission test is performed on the first LEDs 41a as in the foregoing second embodiment. Subsequently, light emitting units 31 in which the light emission intensity of the first LED 41a is beyond the range required for the LED display chip 1 are specified. Subsequently, the light emission intensity of the first LED 41a of each of the specified light emitting units 31 is reduced to be within the range required for the LED display chip 1. The reduction of the light emission intensity is realized by reducing the amount of the drive current I flowing through the drive transistor 77 (by changing the amount to reduce it).

After the light emission intensity of the first LED 41a is reduced, if the light emission intensity is not within the range required for the LED display chip 1, a light emission test of the second LED 41b is performed on the light emitting unit 31 including the first LED 41a, and the light emission intensity of the second LED 41b is performed similarly. The adjustment of the light emission intensity is also applicable to the light emitting unit 31 including one LED as in the foregoing first embodiment.

The reduction of the amount of the drive current I flowing through the drive transistor 77 is realized by increasing the threshold value of the first nonvolatile memory transistor 78a (the second nonvolatile memory transistor 78b in the case of reducing the light emission intensity of the second LED 41b). As a result of increasing the threshold value of the first nonvolatile memory transistor 78a within the range in which the first nonvolatile memory transistor 78a is turned ON at an operating first control gate voltage, the conductance between the source and drain of the first nonvolatile memory transistor 78a can be decreased to increase the difference in voltage between the source and drain of the first nonvolatile memory transistor 78a. This makes it possible to decrease the difference in voltage between the source and drain of the drive transistor 77 when the drive transistor 77 and the first nonvolatile memory transistor 78a are in an ON state and the second nonvolatile memory transistor 78b is in an OFF state. The gate terminal of the drive transistor 77 is connected to the drain terminal of the drive transistor 77 and the power supply line 73 via the voltage holding capacitor 76, and thus the gate voltage of the drive transistor 77 is written based on the drain voltage of the drive transistor 77 (that is, the power supply voltage Vcc). Thus, reducing the difference in voltage between the source and drain of the drive transistor 77 reduces the difference in voltage between the source and gate. The amount of the drive current I, which is the source-drain current of the drive transistor 77, is determined mainly by the difference in voltage between the source and gate. Thus, increasing the threshold value of the first nonvolatile memory transistor 78a enables the amount of the drive current I to be reduced (changed to be reduced).

The threshold value of the first nonvolatile memory transistor 78a (the second nonvolatile memory transistor 78b in the case of reducing the light emission intensity of the second LED 41b) is adjusted in the following manner. First, the first test transistor 80a, the first nonvolatile memory transistor 78a, and the drive transistor 77 are turned ON to enable a current to flow to the first nonvolatile memory transistor 78a. Subsequently, in this state, a writing first gate control voltage is applied to the control gate of the first nonvolatile memory transistor 78a by using the first gate control signal line 79a to inject electrons to the floating gate.

At the time of causing the first LED 41a to emit light, a driving first control voltage that is sufficiently higher than the threshold value is applied to the control gate of the first nonvolatile memory transistor 78a to cause the first nonvolatile memory transistor 78a to operate in a linear operation region. Accordingly, the first nonvolatile memory transistor 78a functions as a resistor, and a voltage difference substantially proportional to the amount of current flowing through the first LED 41a occurs between the source and drain. As the threshold value of the first nonvolatile memory transistor 78a increases, the electric resistance between the source and drain increases, and the voltage difference between the source and drain also increases. Thus, the source voltage of the drive transistor 77 increases and the amount of the drive current I decreases.

When the first nonvolatile memory transistor 78a and the second nonvolatile memory transistor 78b are stacked gate transistors, the source-drain voltage is typically 3 V or more and the source-control gate voltage is typically 4 V or more although it depends on the size, structure, and so forth of the stacked gate transistors. In the stacked gate transistor, the threshold values of the first nonvolatile memory transistor 78a and the second nonvolatile memory transistor 78b can be adjusted highly accurately and continuously by adjusting the writing first gate control voltage and second gate control voltage to be applied. Accordingly, variation in light emission intensity among the light emitting units 31 can be decreased, and the LED display chip 1 having high uniformity in light emission intensity can be manufactured with high yield.

Preferably, the first gate control voltage and the second gate control voltage are pulsed voltages. By adjusting the number of pulses to be applied in addition to or instead of the voltage to be applied, the threshold value of the first nonvolatile memory transistor 78a can be continuously adjusted.

When both the first LED 41a and the second LED 41b are defective, the light emitting unit 31 is defective, and accordingly there is a black pixel among the plurality of pixels 40 included in the LED display chip 1. In this case, the LED display chip 1 can be used for an application in which a black pixel is allowed, as in the case of the LED display chip 1 according to the foregoing first embodiment.

In addition, the configuration for reducing the light emission intensity of the LED according to the present fourth embodiment is also applicable to the configuration in which the light emitting unit 31 is one LED, the configuration in which the LED display chip 1 is provided with the wavelength conversion layer 68, the configuration in which the LED display chip 1 includes sub-pixels 40R, 40G, and 40B of a plurality of colors, and the like according to the foregoing first to third embodiments.

MODIFICATION EXAMPLE

A modification example of the present fourth embodiment will be described below with reference to FIG. 40.

In the above, variation in light emission intensity is reduced by using one of the two LEDs (first LED 41*a* and second LED 41*b*) of the light emitting unit 31. In the present first modification example, variation in light emission intensity is reduced by using two LEDs. When the number of LEDs included in the light emitting unit 31 is three or more, the number of LEDs used to reduce variation in light emission intensity may be two or more.

In a minority of the plurality of light emitting units 31 included in the light emitting array 30, both or one of the first LED 41*a* and the second LED 41*b* is defective, but in a majority of the plurality of light emitting units 31, both LEDs are non-defective. In the light emitting unit 31 in which both the first LED 41*a* and the second LED 41*b* are non-defective, both can be caused to emit light by adjusting the light emission intensities of both.

Figure 40:
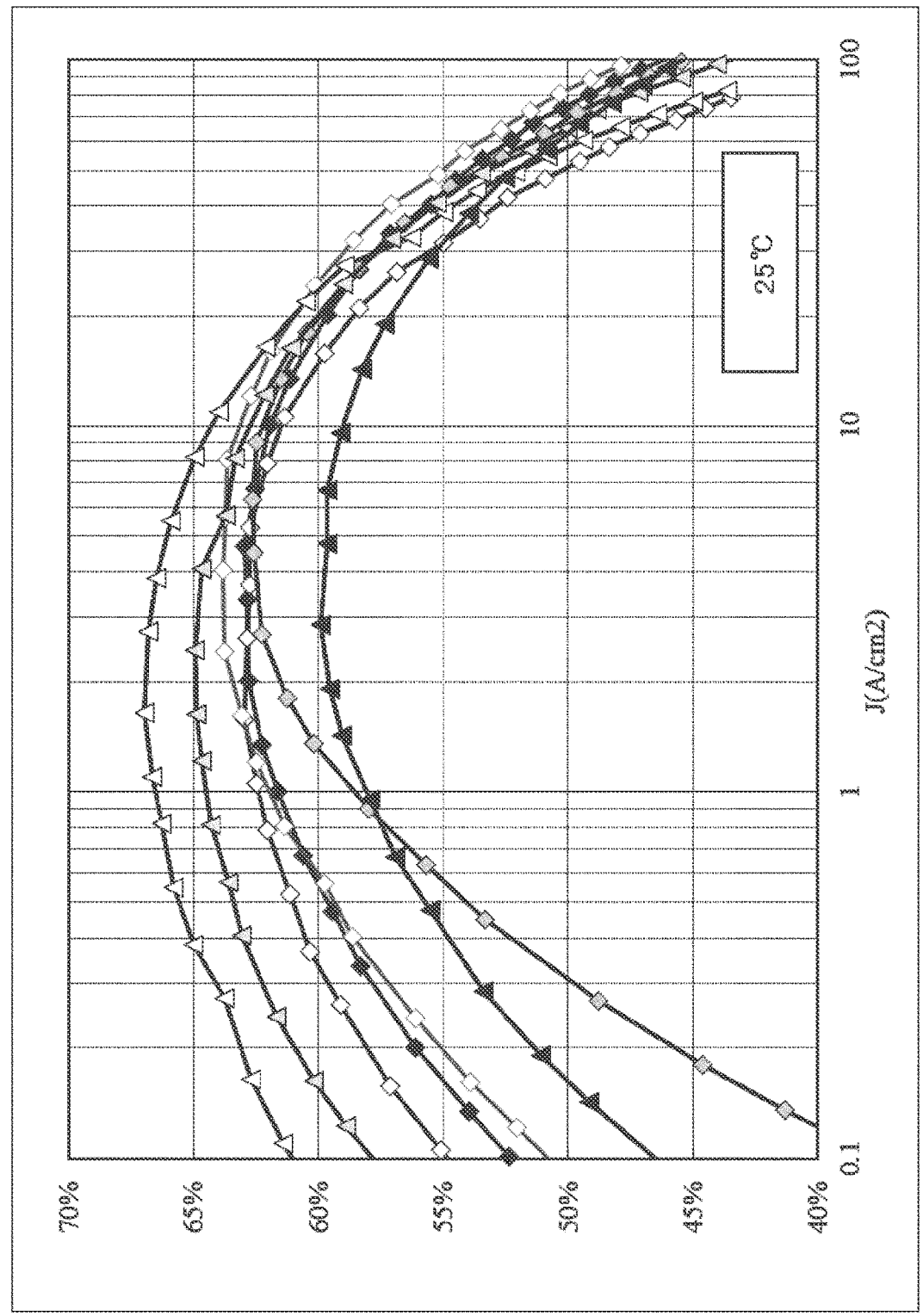
FIG. 40 is a diagram illustrating the characteristics of the light emission efficiencies of LEDs.

FIG. 40 is a diagram illustrating the characteristics of the light emission efficiencies of the first LEDs 41*a*. In FIG. 40, the vertical axis represents the emission efficiencies of the first LEDs 41*a*, and the horizontal axis represents the densities of currents supplied to the first LEDs 41*a*. The light emission efficiencies of the second LEDs 41*b* exhibit characteristics similar to those of the first LEDs 41*a*, and thus the illustration thereof is omitted.

As illustrated in FIG. 40, the light emission efficiencies of the first LEDs 41*a* and the second LEDs 41*b* vary among the individuals, but tend to decrease when the current density becomes too high. Normally, the light emitting unit 31 is used at high current density that decreases light emission efficiency in most cases. Thus, when current is supplied to both the first LED 41*a* and the second LED 41*b*, the current density in each LED is reduced to half compared to the case where current is supplied to only one of the LEDs, and thus the light emission efficiency increases. Thus, the total light emission intensity of both the first LED 41*a* and the second LED 41*b* is larger than the emission intensity of one of the LEDs under the condition where the amount of the drive current I flowing between the drain and source of the drive transistor 77 of the corresponding drive circuit 70 is the same.

For example, in FIG. 40, the light emission efficiency peaks when the current density is 1 A/cm$^2$ to 10 A/cm$^2$, the light emission efficiency is about 58% when the current density is 30 A/cm$^2$, and the light emission efficiency is about 62% when the current density is 15 A/cm$^2$. Thus, when the state changes from the state where current is supplied to only the first LED 41*a* at a current density of 30 A/cm$^2$ to the state where current is supplied to both the first LED 41*a* and the second LED 41*b* at a current density of 15 A/cm$^2$, the light emission efficiency increases by about 7%, and the light emission intensity also increases by 7%.

Thus, in the present modification example, it is possible to (i) reduce the drive current by causing the first nonvolatile memory transistor 78*a* or the second nonvolatile memory transistor 78*b* of the corresponding drive circuit 70 to function as a resistor and decrease the light emission intensities of the first LED 41*a* and the second LED 41*b*, and (ii) increase the light emission efficiency and increase the light emission intensity of the light emitting unit 31 by causing both the first LED 41*a* and the second LED 41*b* to emit light. Thus, according to the present modification example, an allowable range of determining the light emitting unit 31 to be non-defective is widened, and the manufacturing yield of the light emitting units 31 can be increased. Since the light emission efficiency of the light emitting units 31 can be increased, the power efficiency of the LED display chip 1 can be increased.

When the total light emission intensity of the first LED 41*a* and the second LED 41*b* exceeds the upper limit of the specified range required for the LED display chip 1 when both the LEDs are caused to emit light, the threshold values of the first nonvolatile memory transistor 78*a* and the second nonvolatile memory transistor 78*b* of the corresponding drive circuit 70 may be adjusted to decrease the total light emission intensity.

Hereinafter, examples of adjusting light emission intensity according to the present modification example will be described in order.

First, a light emission test is performed on the first LEDs 41*a* of the individual light emitting units 31. After all the light emitting units 31 are evaluated, the following three types of operations are performed.

In the light emitting unit 31 in which the light emission intensity of the first LED 41*a* is within the specified range required for the LED display chip 1, the second LED 41*b* need not be used, and thus a signal is written so that the second nonvolatile memory transistor 78*b* of the corresponding drive circuit 70 is held in an OFF state.

In the light emitting unit 31 in which the light emission intensity of the first LED 41*a* is higher than the upper limit of the specified range required for the LED display chip 1, the second LED 41*b* need not be used, and thus a signal is written so that the second nonvolatile memory transistor 78*b* of the corresponding drive circuit 70 is held in an OFF state. In addition, the threshold value of the first nonvolatile memory transistor 78*a* of the corresponding drive circuit 70 is adjusted so that the light emission intensity of the first LED 41*a* is within the specified range required for the LED display chip 1.

In the light emitting unit 31 in which the light emission intensity of the first LED 41*a* is lower than the lower limit of the specified range required for the LED display chip 1, the second LED 41*b* need be used, and thus no signal is written in the second nonvolatile memory transistor 78*b* of the corresponding drive circuit 70.

Subsequently, a light emission test is performed on the second LEDs 41*b* of the light emitting units 31 in which the light emission intensity of the first LED 41*a* is lower than the specified range required for the LED display chip 1. After all the target light emitting units 31 are evaluated, three types of operations are performed.

In the light emitting unit 31 in which the light emission intensity of the second LED 41*b* is within the specified range required for the LED display chip 1, the first LED 41*a* need not be used, and thus a signal is written so that the first nonvolatile memory transistor 78*a* of the corresponding drive circuit 70 is held in an OFF state.

In the light emitting unit 31 in which the light emission intensity of the second LED 41b is higher than the upper limit of the specified range required for the LED display chip 1, the first LED 41a need not be used, and thus a signal is written so that the first nonvolatile memory transistor 78a of the corresponding drive circuit 70 is held in an OFF state. In addition, the threshold value of the second nonvolatile memory transistor 78b of the corresponding drive circuit 70 is adjusted so that the light emission intensity of the second LED 41b is within the specified range required for the LED display chip 1.

In the light emitting unit 31 in which the light emission intensity of the second LED 41b is lower than the lower limit of the specified range required for the LED display chip 1, the first LED 41b need be used, and thus no signal is written in the first nonvolatile memory transistor 78a of the corresponding drive circuit 70.

Subsequently, a light emission test is performed on both the first LED 41a and the second LEDs 41b of the light emitting units 31 in which the light emission intensity of each of the first LED 41a and the second LED 41b is lower than the specified range required for the LED display chip 1. After all the target light emitting units 31 are evaluated, the following three types of operations are performed.

In the light emitting unit 31 in which the total light emission intensity of both the LEDs is within the specified range required for the LED display chip 1, adjustment need not be performed, and thus no signal is written in the first nonvolatile memory transistor 78a and the second nonvolatile memory transistor 78b of the corresponding drive circuit 70.

In the light emitting unit 31 in which the total light emission intensity of both the LEDs is higher than the upper limit of the specified range required for the LED display chip 1, the threshold value of one or both of the first nonvolatile memory transistor 78a and the second nonvolatile memory transistor 78b of the corresponding drive circuit 70 is adjusted so that the total light emission intensity is within the specified range required for the LED display chip 1.

In the light emitting unit 31 in which the total light emission intensity of both the LEDs is lower than the lower limit of the specified range required for the LED display chip 1, the light emitting unit 31 is determined to be defective, and thus a signal is written so that both the first nonvolatile memory transistor 78a and the second nonvolatile memory transistor 78b of the corresponding drive circuit 70 are held in an OFF state.

With the above three types of operations being performed, the LED display chip 1 may include (i) a pixel 40 in which only the first LED 41a emits light, (ii) a pixel 40 in which only the second LED 41b emits light, (iii) a pixel 40 in which the first LED 41a and the second LED 41b emit light, and (iv) a black pixel that does not emit light. The LED display chip 1 including a black pixel that does not emit light can be used for application allowing a black pixel, whereas the LED display chip 1 not including a black pixel that does not emit light can be used also for an application not allowing a black pixel.

Fifth Embodiment

A fifth embodiment of the present invention will be described below with reference to FIG. 41. For convenience of description, the elements having the same functions as those of the elements described in the foregoing embodiments will be denoted by the same reference numerals, and the description thereof will be omitted.

In the configuration according to the foregoing fourth embodiment, to reduce variation in light emission intensity of the light emitting units 31, the amount of the drive current I flowing through the first LED 41a or the second LED 41b of the light emitting units 31 is reduced to reduce the light emission intensity of the light emitting units 31. Furthermore, in the configuration according to the modification example of the foregoing fourth embodiment, both the first LED 41a and the second LED 41b are caused to emit light to increase the light emission intensity of the light emitting units 31.

However, among the plurality of light emitting units 31, there may be a light emitting unit 31 whose light emission intensity is significantly lower than that of the other light emitting units 31. In the light emitting unit 31 whose light emission intensity is significantly low, it is necessary to significantly increase the amount of the drive current I flowing through the light emitting unit 31 to increase the light emission intensity to be higher than the lower limit of the specified range required for the LED display chip 1.

The LED display chip 1 according to the present fifth embodiment includes the drive circuit 70 that is able to increase the amount of the drive current I flowing through the first LED 41a and/or the second LED 41b of the light emitting unit 31. The LED display chip 1 according to the present fifth embodiment is similar to the LED display chip 1 according to the foregoing fourth embodiment except for the circuit configuration of the drive circuit 70. The drive circuit 70 according to the present fifth embodiment capable of increasing the amount of the drive current I is also applicable to the configuration in which the light emitting unit 31 is one LED, the configuration in which the LED display chip 1 is provided with the wavelength conversion layer 68, the configuration in which the LED display chip 1 includes sub-pixels 40R, 40G, and 40B of a plurality of colors, and the like according to the foregoing first to third embodiments.

(Drive Circuit)

FIG. 41 is a circuit diagram illustrating an exemplary circuit configuration of the drive circuit 70 included in the LED display chip 1 according to the present fifth embodiment.

The drive circuit 70 according to the present fifth embodiment illustrated in FIG. 41 is connected to the row-selection signal line 71, the column signal line 72, the power supply line 73, the N-side electrode 47, the GND line 74, the first gate control signal line 79a for supplying a first control gate voltage, and the second gate control signal line 79b for supplying a second control gate voltage, similarly to the drive circuit 70 according to the foregoing second or third embodiment illustrated in FIG. 29. Also, the drive circuit 70 according to the present fifth embodiment includes the row-selection transistor 75, the voltage holding capacitor 76, the first nonvolatile memory transistor 78a, the second nonvolatile memory transistor 78b, the first test transistor 80a, the second test transistor 80b, the first test terminal 81a, the second test terminal 81b, the first P-side electrode 46a, and the second P-side electrode 46b. In addition, similarly, the drive circuit 70 is connected to the first LED 41a and the second LED 41b of the light emitting unit 31 when the light emitting array 30 is mounted on the IC chip 20.

Unlike the drive circuit 70 according to the foregoing second or third embodiment illustrated in FIG. 29, the drive circuit 70 according to the present fifth embodiment illustrated in FIG. 41 includes a first drive transistor 77a, a second drive transistor 77b, a third nonvolatile memory transistor 78c, and a fourth nonvolatile memory transistor 78d, and is connected to a third gate control signal line 79c and a fourth gate control signal line 79d.

In the row-selection transistor 75, the gate terminal is connected to the row-selection signal line 71 and the drain terminal is connected to the column signal line 72. The source terminal is connected to one of the electrodes of the voltage holding capacitor 76 and to the gate terminals of the first drive transistor 77a and the second drive transistor 77b. Accordingly, the gate terminals of the first drive transistor 77a and the second drive transistor 77b are connected to the column signal line 72 via the row-selection transistor 75.

In the voltage holding capacitor 76, the other electrode is connected to the power supply line 73 and the drain terminals of the first drive transistor 77a and the second drive transistor 77b. Accordingly, the gate terminals of the first drive transistor 77a and the second drive transistor 77b are connected to the power supply line 73 via the voltage holding capacitor 76.

The first drive transistor 77a is, for example, an N-type MOS transistor. The source terminal of the first drive transistor 77a is connected to the drain terminal of the third nonvolatile memory transistor 78c. Accordingly, the drain terminal of the third nonvolatile memory transistor 78c is connected to the power supply line 73 via the first drive transistor 77a.

The second drive transistor 77b is, for example, an N-type MOS transistor. The source terminal of the second drive transistor 77b is connected to the drain terminal of the fourth nonvolatile memory transistor 78d. Accordingly, the drain terminal of the fourth nonvolatile memory transistor 78d is connected to the power supply line 73 via the second drive transistor 77b.

The first to fourth nonvolatile memory transistors 78a to 78d are stacked gate transistors, including a floating gate, for example, but are not limited thereto.

In the third nonvolatile memory transistor 78c, the control gate terminal is connected to the third gate control signal line 79c, and the source terminal is connected to the drain terminals of the first nonvolatile memory transistor 78a and the second nonvolatile memory transistor 78b and the source terminal of the fourth nonvolatile memory transistor 78d. Accordingly, the drain-source currents of the third nonvolatile memory transistor 78c and the fourth nonvolatile memory transistor 78d can join together. In the drive circuit 70 illustrated in FIG. 41, the amount of the drive current I flowing from the power supply line 73 to the GND line 74 is the sum of the amount of drain-source current of the third nonvolatile memory transistor 78c and the amount of drain-source current of the fourth nonvolatile memory transistor 78d.

In the fourth nonvolatile memory transistor 78d, the control gate terminal is connected to the fourth gate control signal line 79d.

In the first nonvolatile memory transistor 78a, the control gate terminal is connected to the first gate control single line 79a, and the source terminal is connected to the first P-side electrode 46a and the drain terminal of the first test transistor 80a.

In the second nonvolatile memory transistor 78b, the control gate terminal is connected to the second gate control single line 79b, and the source terminal is connected to the second P-side electrode 46a and the drain terminal of the second test transistor 80b.

With this circuit configuration, in the light emitting unit 31 whose light intensity is significantly low, both the first drive transistor 77a and the second drive transistor 77b can be used by turning ON both the third nonvolatile memory transistor 78c and the fourth nonvolatile memory transistor 78d. In the other light emitting units 31, only one of the first drive transistor 77a and the second drive transistor 77b can be used by turning ON one of the third nonvolatile memory transistor 78c and the fourth nonvolatile memory transistor 78d and turning OFF the other.

Thus, the drive circuit 70 illustrated in FIG. 41 is different from the drive circuit 70 illustrated in FIG. 29 in that a plurality of drive transistors (first drive transistor 77a and second drive transistor 77b) are arranged in parallel and that nonvolatile memory transistors (third nonvolatile memory transistor 78c and fourth nonvolatile memory transistor 78d) are connected in series to the respective drive transistors, but the configurations of the drive circuits 70 are similar to each other in the other part.

The number of drive transistors arranged in parallel may be three or more, and the gate widths or gate lengths thereof may be different. For example, when the light emission intensities of almost all the light emitting units 31 whose light emission intensity is significantly low can be increased to be higher than the lower limit of the specified range required for the LED display chip 1 by increasing the amount of the drive current I 1.5 times, the drain-source current of the second drive transistor 77b can be reduced to about half of the drain-source current of the first drive transistor 77a. In this case, in the light emitting units 31 whose light emission intensity is significantly low, both the first drive transistor 77a and the second drive transistor 77b are used, whereas in the other light emitting units 31, only the first drive transistor 77a is used. As a result, the second drive transistor 77b has a drain-source current smaller than that of the first drive transistor 77a and the gate width thereof can be decreased. Thus, a small transistor can be used as the second drive transistor 77b. The small second drive transistor 77b enables the area of the drive circuit 70 to be decreased, which is preferable.

One or some of the nonvolatile memory transistors connected in series to the plurality of drive transistors can be replaced with normal transistors that are not nonvolatile memories or may not be provided. For example, when both the first drive transistor 77a and the second drive transistor 77b are used in the light emitting units 31 whose light emission intensity is significantly low and only the first drive transistor 77a is used in the other light emitting units 31, the third nonvolatile memory transistor 78c may be a normal transistor or may not be provided.

(Test of Drive Circuit)

In the drive circuit 70 according to the present fifth embodiment, the characteristics of the third nonvolatile memory transistor 78c and the fourth nonvolatile memory transistor 78d are also tested in the manufacturing stage of the IC chip 20 before the light emitting array 30 is mounted on the IC chip 20. For example, first, the first test transistor 80a and the second test transistor 80b are turned ON, and at least one of the first nonvolatile memory transistor 78a and the second nonvolatile memory transistor 78b is turned ON. Subsequently, the drive current I when only one of the third nonvolatile memory transistor 78c and the fourth nonvolatile memory transistor 78d is in an ON state is compared with the drive current I when both are in an ON state. When the first drive transistor 77a and the second drive transistor 77b have the same gate width and the same gate length, the drive current I is roughly doubled.

(Adjustment of Light Emission Intensity)

Hereinafter, examples of adjusting light emission intensity according to the present fifth embodiment will be described in order.

First, the third nonvolatile memory transistor 78c is turned ON and the fourth nonvolatile memory transistor 78d is turned OFF. In this state, (i) three types of operations after the light emission test and evaluation of the first LED 41a and (ii) three types of operations after the light emission test and evaluation of the second LED 41a are performed on each light emitting unit 31 as in the foregoing fourth embodiment. Subsequently, for the light emitting units 31 in which the light emission intensity of each of the first LED 41a and the second LED 41b is lower than the lower limit of the specified range required for the LED display chip 1, a light emission test of causing both the LEDs to emit light is performed. After all the target light emitting units 31 are evaluated, the same operation as in the foregoing fourth embodiment is performed on the light emitting unit 31 in which the total light emission intensity of both the LEDs is within the specified range required for the LED display chip 1 or is higher than the upper limit of the specified range.

Subsequently, for the light emitting unit 31 in which the total light emission intensity of both the first LED 41a and the second LED 41b is lower than the lower limit of the specified range required for the LED display chip 1 when only the third nonvolatile memory transistor 78c is in an ON state, both the third nonvolatile memory transistor 78c and the fourth nonvolatile memory transistor 78d of the corresponding drive circuit 70 are turned ON. For the other light emitting units 31, a signal is written so that the fourth nonvolatile memory transistor 78d is held in an OFF state.

Subsequently, in this state, for the light emitting unit 31 in which the total light emission intensity of both the first LED 41a and the second LED 41b is lower than the lower limit of the specified range required for the LED display chip 1 when only the third nonvolatile memory transistor 78c is in an ON state, (i) three types of operations after the light emission test and evaluation of the first LED 41a, (ii) three types of operations after the light emission test and evaluation of the second LED 41b, and (iii) three types of operations after the light emission test of causing both the first LED 41a and the second LED 41b to emit light and evaluation are performed as in the foregoing fourth embodiment.

With the above-described adjustment, the probability and the number of black pixels mixed in the LED display chip 1 according to the present fifth embodiment can be reduced compared to the foregoing fourth embodiment.

Sixth Embodiment

A sixth embodiment of the present invention will be described below with reference to FIG. 42 to FIG. 48. For convenience of description, the elements having the same functions as those of the elements described in the foregoing embodiments will be denoted by the same reference numerals, and the description thereof will be omitted.

The light emitting array 30 according to the present sixth embodiment is manufactured in manufacturing steps different from those of the light emitting array 30 according to the foregoing second embodiment. Except for the difference in structure resulting from the difference in manufacturing steps, the light emitting array 30 according to the present sixth embodiment has the same configuration as that of the light emitting array 30 according to the foregoing second embodiment and is applicable to the LED display chips 1 according to the foregoing third to fifth embodiments. In addition, the manufacturing steps of the light emitting array 30 according to the present sixth embodiment is also applicable to the light emitting array 30 according to the foregoing first embodiment.

The manufacturing steps of the light emitting array 30 according to the present sixth embodiment can increase the light emission efficiencies of the LEDs (first LED 41a and second LED 41b) and decrease the damage to the reflective material 62 that may occur when the sapphire substrate 50 is peeled off from the light emitting array 30. Accordingly, the power consumption of the LED display chip 1 can be decreased and manufacturing yield can be increased.

(Manufacturing of Light Emitting Array)

Hereinafter, the manufacturing steps of manufacturing the light emitting array 30 according to the present sixth embodiment will be described in detail with reference to FIG. 42 to FIG. 48. FIG. 42 to FIG. 48 illustrate an exemplary sequence of steps in order. Thus, reference numerals in a figure illustrating a preceding step will appropriately be omitted in a figure illustrating a subsequent step for the sake of simplicity.

The manufacturing steps of the light emitting array 30 according to the present sixth embodiment are equivalent to the manufacturing steps of the light emitting array 30 according to the foregoing second embodiment except that the order of steps is partially different and that a step of providing a cap layer 61 is included. Thus, the same points as those described in the foregoing first and second embodiments will not be described for convenience of description.

FIG. 42 to FIG. 48 are diagrams illustrating exemplary manufacturing steps of manufacturing the light emitting array 30 according to the present sixth embodiment in order.

First, as illustrated in FIG. 42, an uneven pattern is formed on the upper surface of the sapphire substrate 50, and the compound semiconductor layer 51 including the N-side epitaxial layer 52, the light emitting layer 53, and the P-side epitaxial layer 54 that are stacked in this order is formed on the sapphire substrate 50. Subsequently, unlike in the foregoing first and second embodiments, the transparent conductive film 55 is not formed, but the compound semiconductor layer 51 is etched to form the mesas 56 and the unit separation grooves 60, and the N-side epitaxial layer 52 is exposed in the N-side epitaxial layer exposed region 35 of the wiring unit 32.

Subsequently, as illustrated in FIG. 43, the cap layer 61 is epitaxially grown on at least the side wall portions of the mesas 56, bottom surfaces of recessed portions between the mesas 56, and the side wall portions and bottom portions of the unit separation grooves 60. For example, the cap layer 61 is grown over the entire surface. It is not preferable to leave the cap layer 61 at the tops of the mesas 56 of the light emitting units 31 and in the N-side electrode region 34 and the N-side epitaxial layer exposed region 35 of the wiring unit 32. Thus, in this case, the cap layer 61 is partially removed by photolithography or the like after forming the cap layer 61. Accordingly, the cap layer 61 that covers only the side wall portions of the mesas 56, the bottom surfaces of the recessed portions between the mesas 56, and the side wall portions and bottom portions of the unit separation grooves 60 can be formed.

Alternatively, for example, an epitaxy condition of the cap layer 61 is selected so that a film is hardly grown on a flat portion and is grown on a slope surface and a groove portion. In this case, only growing the cap layer 61 is necessary to form the cap layer 61 that covers only the side wall portions of the mesas 56, the bottom surfaces of the recessed portions between the mesas 56, and the side wall portions and bottom portions of the unit separation grooves 60.

The maximum epitaxial temperature of the cap layer 61 is preferably 700° C. or more and 1100° C. or less. This is because epitaxial growth of the cap layer 61 at such a high temperature after etching of the compound semiconductor layer 51 enables the light emitting layer 53 to be restored from etching damage caused by etching and the light emission efficiency of the light emitting layer 53 to be increased.

For example, etching of the compound semiconductor layer 51 is usually performed by using an inductively coupled plasma (ICP) etching device, but ions from plasma cause various point defects in the crystal structure forming the light emitting layer 53. The point defects become a nonradiative recombination centers and decrease the light emission efficiency of the light emitting layer 53. A nonradiative recombination center is not a big problem in a large LED or light emitting unit used in lighting or a liquid crystal backlight. However, in a minute light emitting unit such as the light emitting unit 31 according to the present embodiment, the area of the outer peripheral portion of the light emitting unit 31 exposed to etching is large relative to the area of the entire light emitting unit 31. Thus, a nonradiative recombination center remarkably affects the light emission efficiency of the light emitting unit 31.

Comparing the light emitting unit 31 according to the present sixth embodiment with the light emitting unit 31 according to the foregoing second embodiment, the external quantum efficiency is 20% in the former and 25% in the latter, with an improvement of 25%. The improvement of the light emission efficiency does not necessarily need epitaxial growth of the cap layer 61. A substantially equivalent improvement can be realized by annealing under an atmosphere including ammonia, hydrogen, or the like.

The cap layer 61 is a high-resistance film. The cap layer 61 covers the side wall portions of the mesas 56 of the light emitting units 31, but does not cause non-negligible leakage from the PN junction exposed on the wall surface (PN junction between the N-side epitaxial layer 52 and the P-side epitaxial layer 54) because the cap layer 61 is a high-resistance film.

The cap layer 61 is, for example, a semi-insulating thin GaN layer that is undoped or doped with some Mg (P-type impurities). The composition of the cap layer 61 is not limited to GaN, and may be InGaN, AlGaN, or the like.

For example, when the cap layer 61 is a GaN layer and the wavelength of ultraviolet laser light used for laser lift-off for peeling off the sapphire substrate 50 is 248 nm, it is preferable that the cap layer 61 have a thickness of 60 nm to 150 nm at the bottom portions of the unit separation grooves 60. This is because it is preferable that the cap layer 61 absorb the most part of ultraviolet laser light used for laser lift-off to reduce the ultraviolet laser light entering the reflective material 62. Thus, the cap layer 61 can be made thinner when using an InGaN layer with a large light absorption coefficient, and is preferably made thicker when using an AlGaN layer with a small light absorption coefficient.

Figure 44:
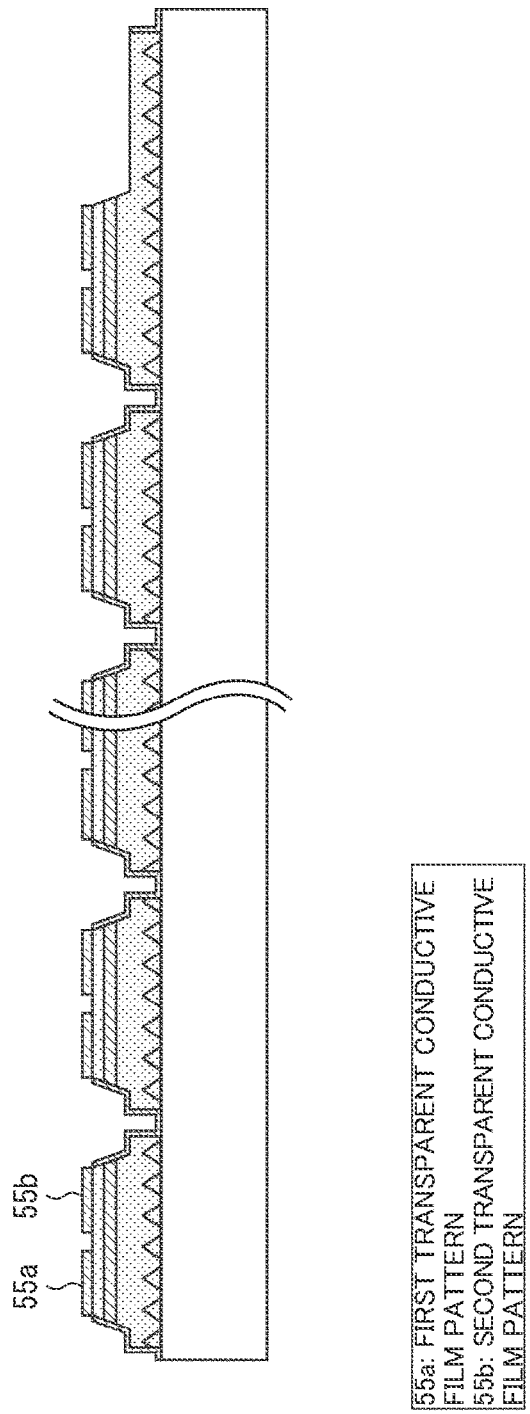
FIG. 44 is a cross-sectional view for describing part of the exemplary manufacturing steps of the light emitting array according to the still another embodiment of the present invention.

Subsequently, as illustrated in FIG. 44, the first transparent conductive film pattern 55a and the second transparent conductive film pattern 55b are formed.

Figure 45:
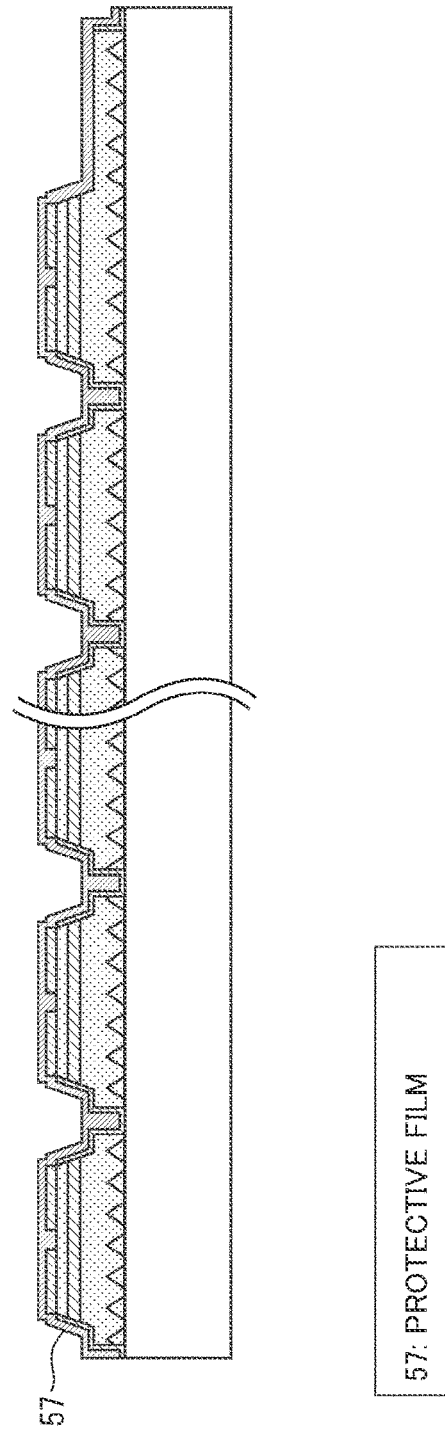
FIG. 45 is a cross-sectional view for describing part of the exemplary manufacturing steps of the light emitting array according to the still another embodiment of the present invention.

Subsequently, as illustrated in FIG. 45, the protective film 57 is formed. In FIG. 45, the unit separation grooves 60 are completely filled with the protective film 57, but alternatively there may be a space not provided with the protective film 57 in the unit separation grooves 60.

Figure 46:
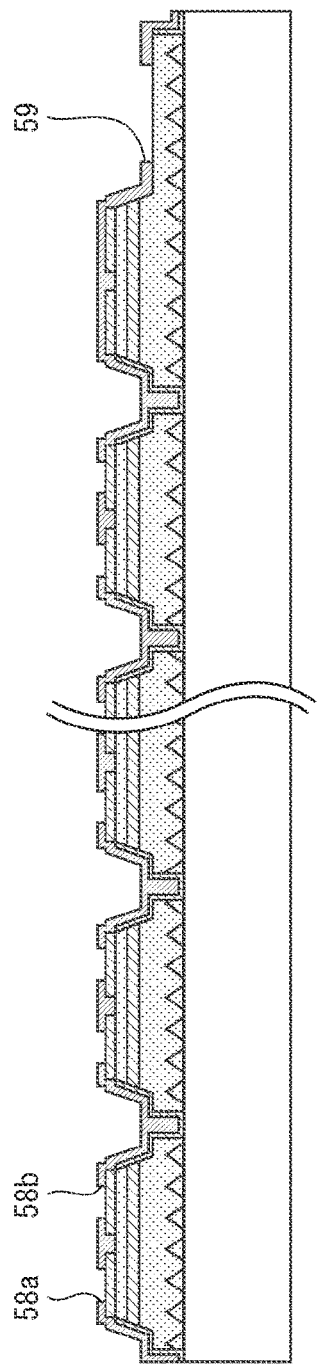
FIG. 46 is a cross-sectional view for describing part of the exemplary manufacturing steps of the light emitting array according to the still another embodiment of the present invention.

Subsequently, as illustrated in FIG. 46, the first P-side contact holes 58a, the second P-side contact holes 58b, and the N-side contact holes 59 are formed in the protective film 57.

Figure 47:
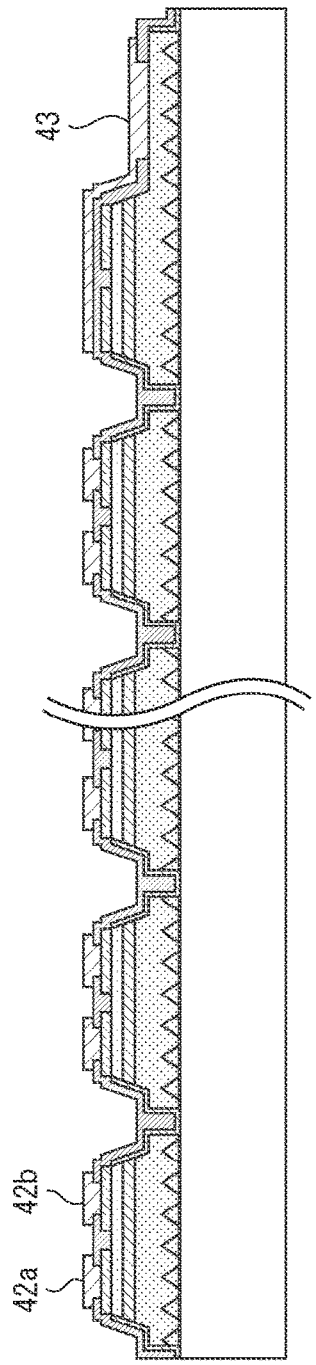
FIG. 47 is a cross-sectional view for describing part of the exemplary manufacturing steps of the light emitting array according to the still another embodiment of the present invention.

Subsequently, as illustrated in FIG. 47, the first P-side individual electrodes 42a, the second P-side individual electrodes 42b, and the N-side wiring electrodes 43 are formed.

Figure 48:
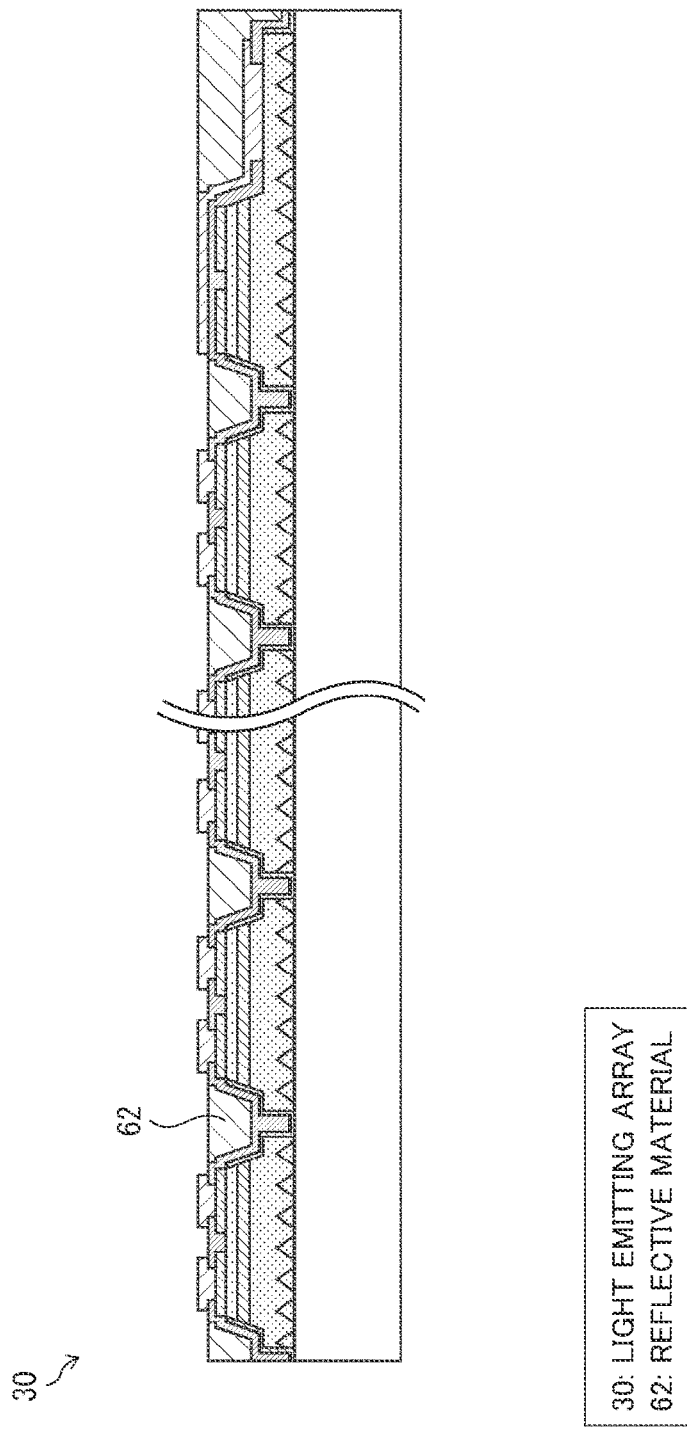
FIG. 48 is a cross-sectional view for describing part of the exemplary manufacturing steps of the light emitting array according to the still another embodiment of the present invention.

Subsequently, as illustrated in FIG. 48, the recessed portions between the mesas 56 are filled with the reflective material 62. When there is a space without the protective film 57 in the unit separation grooves 60, the space is filled with the reflective material 62. As illustrated in FIG. 48, the cap layer 61 exists between the reflective material 62 and the sapphire substrate 50. The cap layer 61 absorbs the most part of ultraviolet laser light used for laser lift-off, and thus the ultraviolet laser light entering the reflective material 62 is reduced. Thus, damage to the reflective material 62 resulting from the ultraviolet laser light is reduced, the occurrence of abnormality such as degradation or deformation of the reflective material 62 in a portion near the sapphire substrate 50 can be suppressed, and the ratio of non-defective products of the light emitting arrays 30 can be increased.

Seventh Embodiment

A seventh embodiment of the present invention will be described below with reference to FIG. 49 to FIG. 55. For convenience of description, the elements having the same functions as those of the elements described in the foregoing embodiments will be denoted by the same reference numerals, and the description thereof will be omitted.

In the LED display chip 1 according to the present seventh embodiment, the light emitting array 30 is mounted on the IC chip 20 in assembly steps different from those in the foregoing first and second embodiments. Except for the difference in structure resulting from a difference in assembly steps, the LED display chip 1 according to the present seventh embodiment has the same configuration as that of the LED display chip 1 according to the foregoing second embodiment and is applicable to the LED display chips 1 according to the foregoing third to fifth embodiments. In addition, the assembly steps of the light emitting array 30 according to the present seventh embodiment is also applicable to the light emitting array 30 according to the foregoing first embodiment.

The assembly steps of the light emitting array 30 according to the present seventh embodiment can reduce damage to the reflective material 62 that may be caused when peeling off the sapphire substrate 50 from the light emitting array 30 and can suppress the occurrence of void between the light emitting array 30 and the IC chip 20 and void inside the light emitting array 30 (between the light emitting units 31, between the light emitting unit 31 and the wiring unit 32, and between the wiring units 32). Accordingly, the manufacturing yield of the LED display chip 1 can be increased.

(Manufacturing of Light Emitting Array)

The light emitting array 30 according to the present seventh embodiment is bonded to the IC chip 20 with the reflective material 62 not being provided therein. Thus, the light emitting array 30 according to the present seventh embodiment is not subjected to the steps illustrated in FIG. 35 and FIG. 36 after being subjected to the steps illustrated in FIG. 30 to FIG. 34.

(Mounting of Light Emitting Array)

Hereinafter, the assembly steps of mounting the light emitting array 30 on the IC chip 20 according to the present seventh embodiment will be described in detail with reference to FIG. 49 to FIG. 55. FIG. 49 to FIG. 55 illustrate an exemplary sequence of steps in order. Thus, reference numerals in a figure illustrating a preceding step will appropriately be omitted in a figure illustrating a subsequent step for the sake of simplicity.

The manufacturing steps of the light emitting array 30 according to the present seventh embodiment are equivalent to the manufacturing steps of the light emitting array 30 according to the foregoing first and second embodiment except that the order of the steps is partially different. Thus, the same points as those described in the foregoing first and second embodiments will not be described for convenience of description.

FIG. 49 to FIG. 55 are diagrams illustrating exemplary assembly steps of mounting the light emitting array 30 according to the present seventh embodiment in order.

Figure 49:
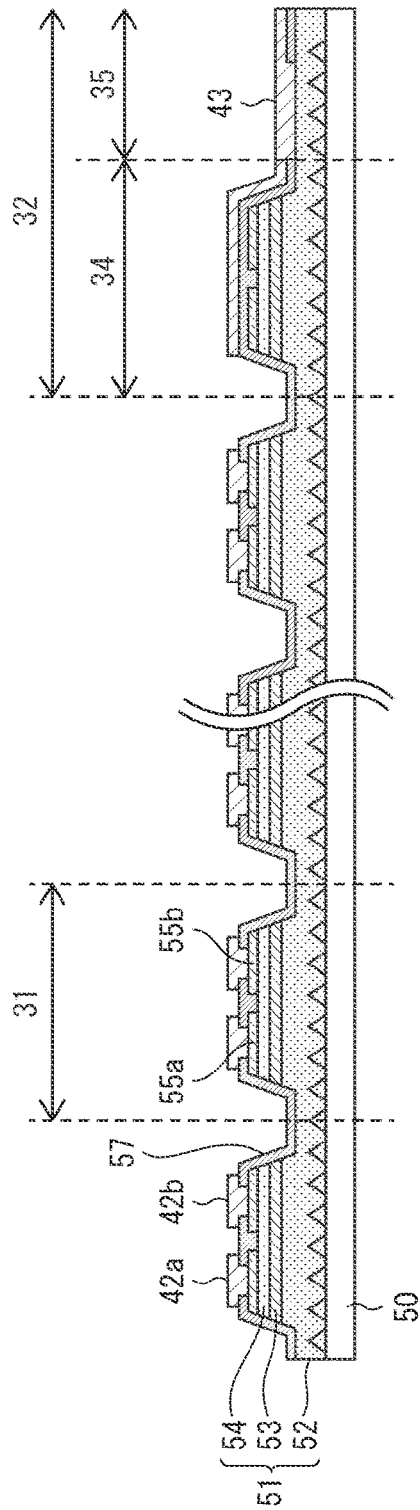
FIG. 49 is a cross-sectional view for describing part of exemplary assembly steps of an LED display chip according to still another embodiment of the present invention.

As illustrated in FIG. 49, in the light emitting array 30 that has been subjected to the steps illustrated in FIG. 30 to FIG. 34, the sapphire substrate 50 is grinded to reduce the thickness. In the case of moving the light emitting array 30 onto the peel substrate 63 and the transfer substrate 64 as in FIG. 24, the sapphire substrate 50 need not be grinded.

Figure 50:
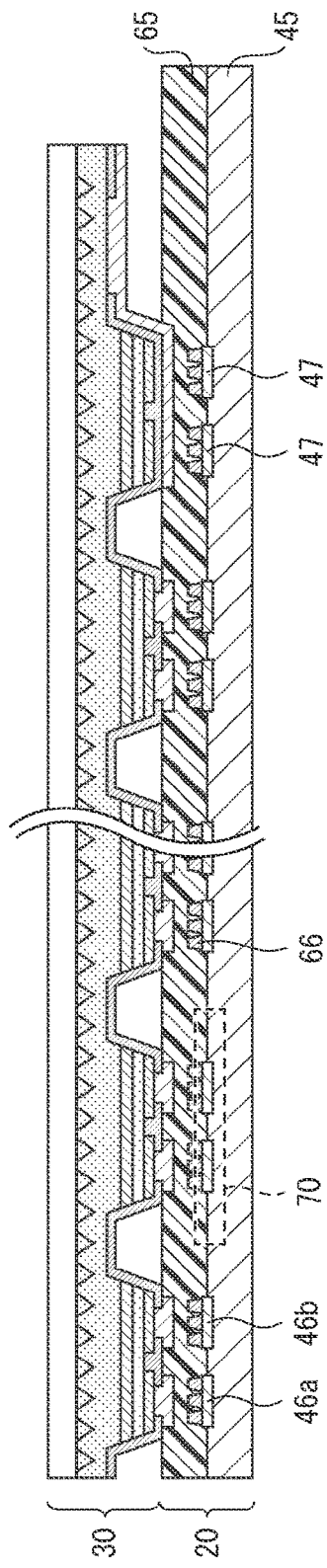
FIG. 50 is a cross-sectional view for describing part of the exemplary assembly steps of the LED display chip according to the still another embodiment of the present invention.

Subsequently, as illustrated in FIG. 50, the light emitting array 30 is flipped upside down, aligned, and arranged on the IC chip 20. Subsequently, the light emitting array 30 is bonded to the IC chip 20 by using the resin layer 65. This step is similar to the step illustrated in FIG. 17.

Figure 51:
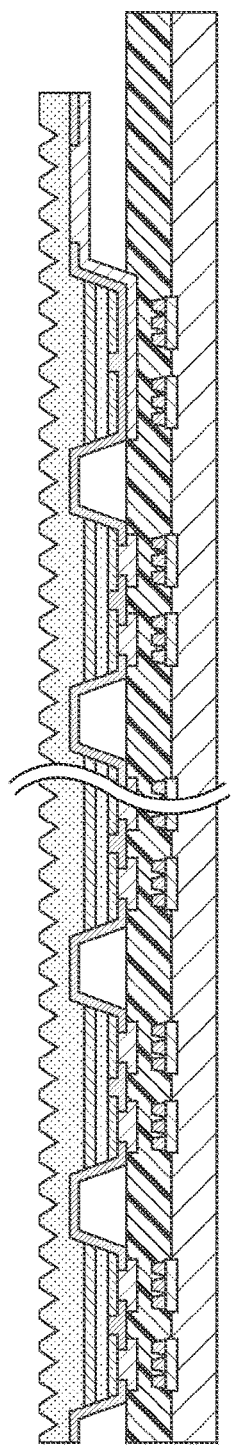
FIG. 51 is a cross-sectional view for describing part of the exemplary assembly steps of the LED display chip according to the still another embodiment of the present invention.

Subsequently, as illustrated in FIG. 51, the sapphire substrate 50 is peeled off from the light emitting array 30. In the case of moving the light emitting array 30 onto the peel substrate 63 and the transfer substrate 64 as in FIG. 24, the transfer substrate 64 is peeled off from the light emitting array 30.

Figure 52:
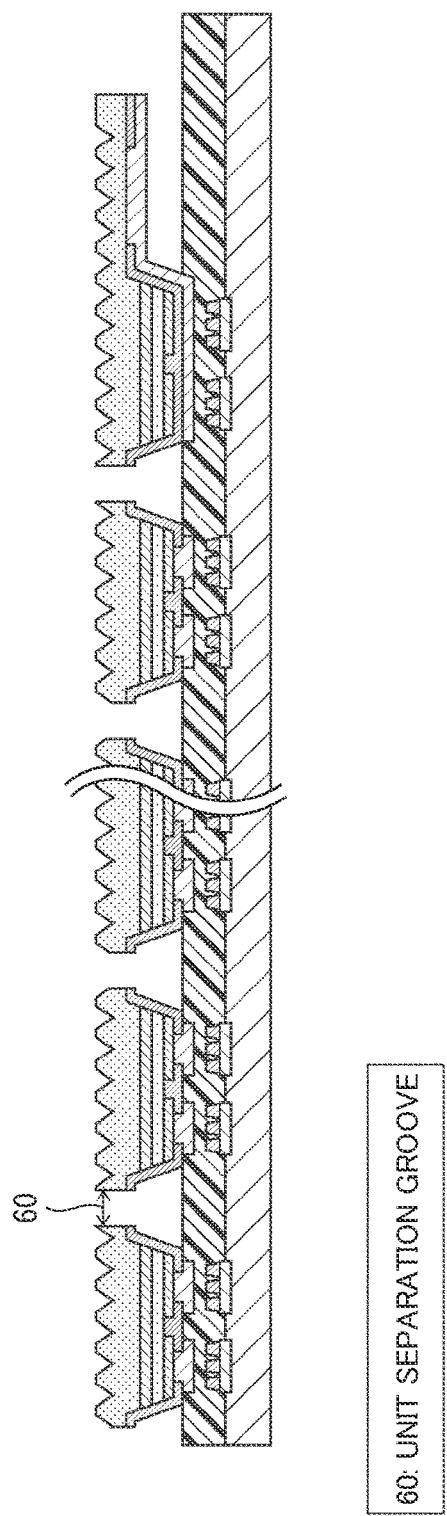
FIG. 52 is a cross-sectional view for describing part of the exemplary assembly steps of the LED display chip according to the still another embodiment of the present invention.

Subsequently, as illustrated in FIG. 52, the unit separation grooves 60 are formed on the IC chip 20, and the light emitting units 31 and the wiring units 32 are separated from each other. In the case of forming the unit separation grooves 60 before bonding the light emitting array 30 to the IC chip 20, there is a possibility that a difference in thermal expansion coefficient among (i) the light emitting array 30 mainly made of GaN, (ii) the IC chip 20, and (iii) the reflective material 62 between the light emitting units 31 may cause misalignment resulting from a change in temperature during thermal compression bonding. In the assembly steps according to the present seventh embodiment, the unit separation grooves 60 are formed and the reflective material 62 is placed in the unit separation grooves 60 after the light emitting array 30 is bonded to the IC chip 20, and thus the possibility of misalignment resulting from a change in temperature during thermal compression bonding can be reduced.

Figure 53:
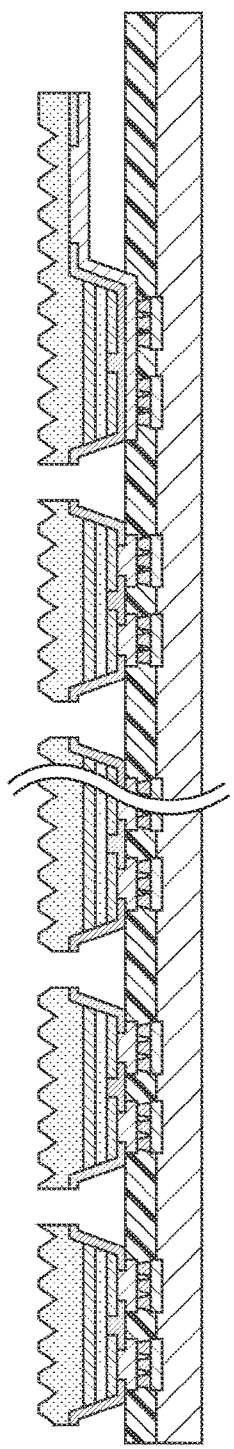
FIG. 53 is a cross-sectional view for describing part of the exemplary assembly steps of the LED display chip according to the still another embodiment of the present invention.

Subsequently, as illustrated in FIG. 53, the microbumps 66 on the P-side electrodes 46 are brought into close contact with the P-side individual electrodes 42 and the microbumps 66 on the N-side electrodes 47 are brought into close contact with the N-side wiring electrodes 43 by applying heat and pressure (thermal compression bonding). In the present embodiment, the individual light emitting units 31 and wiring units 32 are separated from each other at the time of thermal compression bonding. Thus, misalignment caused by a difference in thermal expansion coefficient between the light emitting array 30 mainly made of GaN and the IC chip 20 mainly made of Si does not matter at all.

Figure 54:
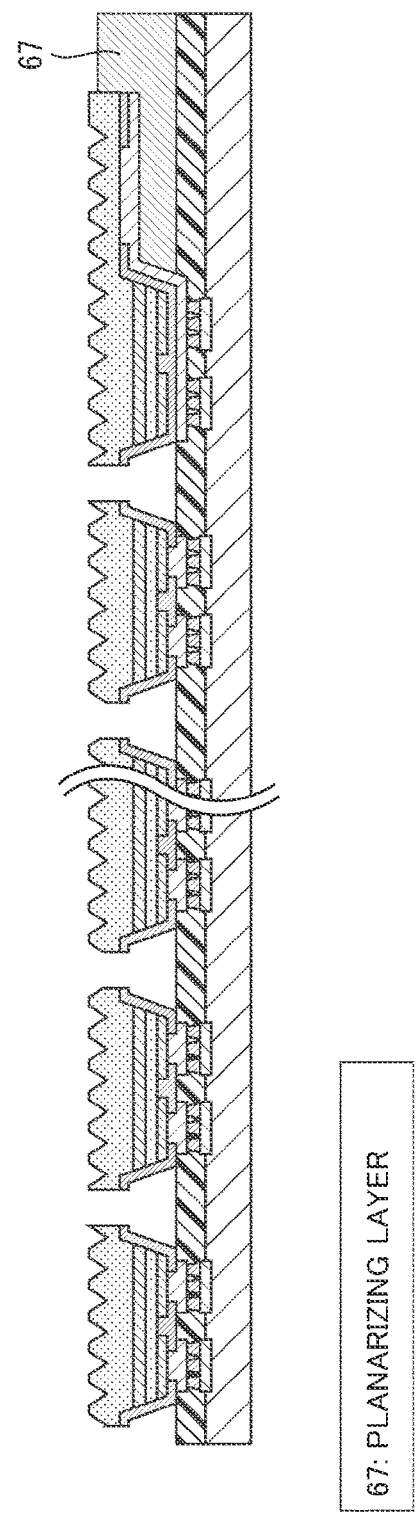
FIG. 54 is a cross-sectional view for describing part of the exemplary assembly steps of the LED display chip according to the still another embodiment of the present invention.

Subsequently, as illustrated in FIG. 54, the planarizing layer 67 is formed on the IC chip 20, outside the light emitting array 30. At this time, it is preferable to form the planarizing layer 67 between the wiring unit 32 and the IC chip 20. The planarizing layer 67 may be made of the same type of material as the reflective material 62. The planarizing layer 67 and the reflective material 62 can be formed in the same step.

Figure 55:
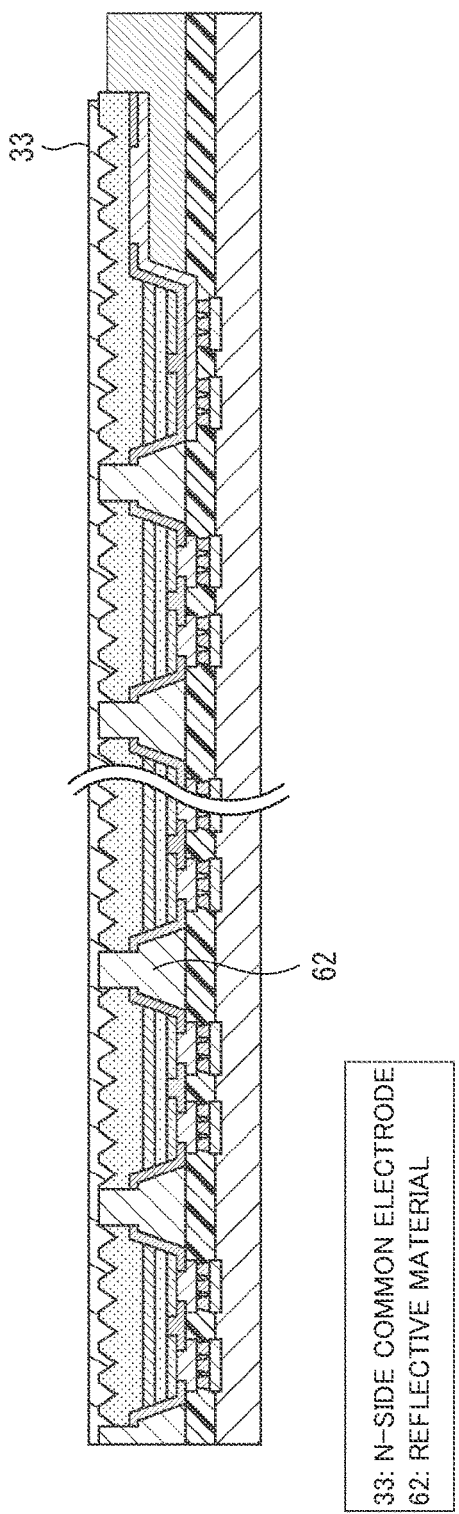
FIG. 55 is a cross-sectional view for describing part of the exemplary assembly steps of the LED display chip according to the still another embodiment of the present invention.

Subsequently, as illustrated in FIG. 55, the portions between the light emitting units 31 and between the light emitting unit 31 and the wiring unit 32 are filled with the reflective material 62. Since the reflective material 62 is provided after the thermal compression bonding has been completed, a void is less likely to occur in the reflective material 62. When there is a void in the reflective material 62, the reflection of the reflective material 62 changes, and thus the light emission intensities of the light emitting units 31 may vary. In the assembly steps according to the present seventh embodiment, a void is less likely to occur in the reflective material 62 and thus variation in light emission intensity among the light emitting units 31 can be reduced.

In the present embodiment, the light emitting array 30 and the IC chip 20 are bonded to each other in the manner illustrated in FIG. 50, the sapphire substrate 50 is removed in the manner illustrated in FIG. 51, and then the unit separation grooves 60 are formed in the manner illustrated in FIG. 52. However, the scope of the present invention is not limited thereto. For example, the unit separation grooves 60 may be formed in the manner illustrated in FIG. 35 in the second embodiment, the light emitting array 30 may be mounted on the IC chip 20 in the manner illustrated in FIG. 17 without forming the reflective material 62 (without performing the step illustrated in FIG. 36), and then the steps illustrated in FIG. 51 and FIG. 53 to FIG. 55 may be performed with the step illustrated in FIG. 52 being skipped. (The step illustrated in FIG. 52 is not necessary because the unit separation grooves 60 have already been formed in the light emitting array 30). In this case, it is not necessary to perform processing of the light emitting array 30, that is, formation of the unit separation grooves 60, on the silicon wafer W1 (silicon substrate 45). Thus, the silicon wafer W1 step can be performed without contamination with a compound semiconductor material, and thus investment in a dedicated device or the like is not required.

Eighth Embodiment

An eighth embodiment of the present invention will be described below with reference to FIG. 56 and FIG. 57. For convenience of description, the elements having the same functions as those of the elements described in the foregoing embodiments will be denoted by the same reference numerals, and the description thereof will be omitted. The present embodiment is different from the first embodiment in that a current adjusting circuit including a nonvolatile memory is provided separately from the drive circuit for each pixel.

In the present embodiment, as illustrated in FIG. 56, the IC chip 20 includes, separately from the pixel drive circuit array portion 24, a current adjusting circuit array portion 92 for adjusting the current to be supplied to the light emitting unit 31 of each pixel. Both the pixel drive circuit array portion 24 and the current adjusting circuit array portion 92 have a configuration of M rows and N columns. The array may be divided into a plurality of portions, and it is sufficient that the array electrically have a configuration of M rows and N columns. The pixel drive circuit array portion 24 may include a surplus (more than M×N) pixel drive circuit array portion so that a faulty cell in the array can be replaced. Also, it is desirable that the current adjusting circuit array portion 92 include the same number of circuits as the pixel drive circuit array portion 24 or a larger number of circuits than the pixel drive circuit array portion 24 for backup.

The current adjusting circuit array portion 92 is accompanied with a second row-selection circuit portion 94 for selecting second row-selection signal lines 97 (M lines) of the current adjusting circuit array portion 92, in addition to a row-selection circuit portion 95 for selecting row-selection signal lines 71 (M lines) of the pixel drive circuit array portion 24. In addition, a second column signal line control circuit portion 93 for controlling second column signal lines 96 is provided. A drive circuit 90 drives the light emitting unit 31 in accordance with the second column signal line 96, not the column signal line 72. For clear distinction, the row-selection circuit portion 22, the column signal output circuit portion 23, the row-selection signal line 71, the column signal line 72, the row-selection signal Rol, and the column signal CS will be referred to as, with "first", a first row-selection circuit portion 22, a first column signal output circuit portion 23, a first row-selection signal line 71, a first column signal line 72, a first row-selection signal Rol, and a first column signal CS, respectively, hereinafter in the present embodiment and the following ninth embodiment.

The output from the first column signal output circuit portion 23 is transmitted through the first column signal lines 72 (N lines) to current adjusting circuits 91, which are components of the current adjusting circuit array portion 92. Each current adjusting circuit 91 includes a nonvolatile memory and is able to adjust the amount of drive current in the corresponding pixel. The adjusted drive currents are transmitted through the second column signal lines 96 (N lines) to the drive circuits 90. The second column signal line control circuit portion 93 individually controls the second column signal lines 96.

FIG. 57 illustrates an example of the drive circuit 90 and the current adjusting circuit 91 according to the present embodiment. The drive circuit 90 is connected to the first row-selection signal line 71 for transmitting the first row-selection signal Rol output from the first row-selection circuit portion 95, the second column signal line 96 for transmitting a current signal output from the current adjusting circuit array portion 92, the power supply line 73 for supplying power, and the GND line 74 for providing a ground GND. The drive circuit 90 includes the row-selection transistor 75, the voltage holding capacitor 76, the drive transistor 77, and the P-side electrode 46. In addition, the drive circuit 90 is connected to the light emitting unit 31 when the light emitting array 30 is mounted on the IC chip 20. Compared to the drive circuit 70, the drive circuit 90 has a simplified simple circuit configuration without the test transistor 80, the nonvolatile memory transistor 78, the test terminal 81, and the gate control signal line 79. This configuration with a reduced number of elements and lines is very advantageous to reduce the sizes of pixels and LED display chips. For clear distinction from the components of the current adjusting circuit 91 which will be described below, the row-selection transistor 75 and the drive transistor 77 will be referred to as a first row-selection transistor 75 and a first drive transistor 77, respectively, hereinafter in the present embodiment and the following ninth embodiment.

On the other hand, the current adjusting circuit 91 forms a series circuit including a second drive transistor 100, a nonvolatile memory transistor 102, and a second row-selection transistor 101 that are arranged in series between a power supply line 99 and a GND line 98. The gate electrode of the second drive transistor 100 is connected to the second column signal line 96, the source electrode of the second drive transistor 100, and the drain electrode of the nonvolatile memory transistor 102. The gate electrode of the nonvolatile memory transistor 102 is connected to the column signal line 72. The gate electrode of the second row-selection transistor 101 is connected to the second row-selection signal lint 97. Preferably, the second drive transistor 100 has the same size and performance as those of the first drive transistor 77, and the voltage of the power supply line 99 connected to the current adjusting circuit 91 is same as the voltage of the power supply line 73 connected to the drive circuit 90. In FIG. 57, the second row-selection transistor 101 is closer than the nonvolatile memory transistor 102 to the GND. Alternatively, the nonvolatile memory transistor 102 may be closer than the second row-selection transistor 101 to the GND. When the second row-selection signal line 97 is activated, the first column signal CS output from the first column signal output circuit portion 23 is input to the gate electrode of the nonvolatile memory transistor 102 through the first column signal line 72, and a reference current Tref flowing through this series circuit is controlled in accordance with the voltage of the first column signal CS.

The gate potential of the second drive transistor 100 is determined in accordance with the amount of the reference current Tref, and the potential of the second column signal line 96 is at the same level as the gate potential of the second drive transistor 100. The potential of the second column signal line 96 is referred to as a second column signal CS2. At the time the second row-selection signal line 97 is activated, the potential of the second column signal line 96 is preferably at the same potential level as the power supply line 73. After the gate potential of the second drive transistor 100 is determined, the first row-selection signal line 71 connected to the corresponding drive circuit 90 is activated, the first row-selection transistor 75 is turned ON, and the second column signal CS2 is input to the gate electrode of the first drive transistor 77 through the second column signal line 96. Hereinafter, the process from the activation of the second row-selection signal line 97 to input to the gate electrode of the first drive transistor 77 will be referred to as "write".

Thus, the amount of the drive current I flowing through the light emitting unit 31 is determined in accordance with the potential of the second column signal CS2. The first row-selection transistor 75 is turned OFF when the gate potential of the first drive transistor 77 is determined. However, the voltage holding capacitor 76 causes the gate potential of the drive transistor to be held at the potential of the input second column signal CS2, and the drive current I determined in accordance with the voltage of the input second column signal CS2 continuously flows until the first row-selection transistor 75 is turned ON next time. The voltage holding capacitor 76 may be replaced with a capacitance between wiring lines or a gate capacitance of the drive transistor 77, instead of being incorporated as a special element.

The current adjusting circuit 91 and the drive circuit 90 constitute a so-called current mirror circuit, and the reference current Tref flowing through the current adjusting circuit 91 is equal to the drive current I flowing through the drive circuit 90. Thus, the following various adjustments are possible.

(Adjustment 1) If the light emitting unit 31 emits no light when a current of a certain magnitude is supplied thereto, the light emitting unit 31 may have a short-circuit failure. Thus, the threshold value of the nonvolatile memory transistor 102 is increased so that the reference current Tref does not flow within a normal range of the first column signal CS. Accordingly, the second column signal CS2 has a very high voltage, the first drive transistor 77 is turned OFF, and no drive current I flows.

(Adjustment 2) If the amount of light emitted by the light emitting unit 31 is insufficient when a current of a certain magnitude is supplied thereto, the threshold value of the nonvolatile memory transistor 102 is decreased to increase the reference current Tref. Accordingly, the second column signal CS2 has a low voltage, the drive current I flowing through the first drive transistor 77 increases, and a larger amount of light is emitted.

(Adjustment 3) If the amount of light emitted by the light emitting unit 31 is excessive when a current of a certain magnitude is supplied thereto, the threshold value of the nonvolatile memory transistor 102 is increased to decrease the reference current Tref. Accordingly, the second column signal CS2 has a high voltage, the drive current I flowing through the first drive transistor 77 decreases, and a smaller amount of light is emitted. That is, with the configuration according to the present embodiment, it is possible to increase/decrease the amount of the drive current I and to block the drive current I, and it is also possible to change a defective pixel to a black pixel and to reduce variation in gradation.

In this configuration, the drive current I of the drive circuits 90(i, j) (the drive circuits in i rows and j columns, the same applies hereinafter) is controlled in the following manner in each row.

The second row-selection circuit portion 94(i) activates the second row-selection signal line 97(i) in the row i, and the first column signal output circuit portion 23 outputs first column signals CS (i, j) of pixels (i, j) to the N first column signal lines 72(j). As described above, the current adjusting circuits 91(i, j) of individual pixels output adjusted second column signals CS2(i, j) to the second column signal lines 96(j).

Subsequently, the row-selection circuit portion 95 activates the first row-selection signal line 71(i) in the row i, and the second column signals CS2(i, j) are written in the individual drive circuits 90(i, j).

After that, the first row-selection signal line 71(i) is inactivated.

Thus, the second column signal line control circuit portion 93 sets the voltage level of the second column signal line 96(j) to be the same as that of the power supply line 73 and the power supply line 99 before the second row-selection signal line 97(i) is activated. In addition, the second column signal line control circuit portion 93 causes the second column signal line 96(j) to be in a floating state floating from the second column signal line control circuit portion 93 in a period from when the second row-selection signal line 97(i) is activated to when the first row-selection signal line 71(i) is activated and the second column signals CS2(i, j) are written in the individual drive circuits 90(i, j). In addition, the second column signal line control circuit portion 93 has a function of returning the level of the second column signal line 96(j) to the same level as the power supply line 73 when the first row-selection signal line 71(i) is inactivated. In the above-described manner, write in the drive circuits 90(i, j) is sequentially performed in each row. In the column direction, write is usually performed in parallel for a plurality of rows or all rows.

A procedure of controlling the threshold value of the nonvolatile memory transistor 102 is as follows, for example. In the stage before adjusting the threshold value of the nonvolatile memory transistor 102, the amounts of light emission of all the light emitting units are once recorded. As a result of comparison with a predetermined amount of light emission, the threshold value is adjusted in accordance with a case among adjustment 1 to adjustment 3. In the case of increasing the threshold value as in the case of adjustment 1 or 3, the second row-selection signal line 97 is activated, and a writing voltage is output from the second column signal line control circuit portion 93 to the second column signal line 96. In this state, a writing gate pulse is applied from the first column signal output circuit portion 23 to the first column signal line 72. Accordingly, the threshold value can be increased.

Typically, the width of increase in the threshold value can be adjusted by using the number of writing gate pulses to be applied. When it is necessary to decrease the threshold value as in the case of adjustment 2, an erasing voltage is applied from the second column signal line control circuit portion 93 to the second column signal line 96, and an erasing gate pulse (negative voltage) is applied from the first column signal output circuit portion 23 to the first column signal line 72. Likewise, the width of decrease in the threshold value can be adjusted by using the number of erasing gate pulses to be applied. In the above-described manner, the threshold value of the nonvolatile memory transistor 102 of each current adjusting circuit 91 may be adjusted, the amounts of light emission of all the light emitting units may be evaluated again, and the adjustment of the threshold value may be repeated if necessary. The threshold value adjustment performed once or a plurality of times makes it possible to change a short-circuit pixel to a black pixel and to reduce variation in the amount of light emission. Accordingly, LED display chips that are excellent in consistency can be produced with high yield.

In the drive circuit 90 illustrated in FIG. 57, which does not include the test transistor 80 illustrated in FIG. 7, the drive circuit 90 of the pixel cannot be tested before bonding the light emitting array 30. Alternatively, the test transistor 80 may be added to the drive circuit 90 so that the drive circuit 90 of the IC chip 20 can be tested before bonding the light emitting array 30.

In this configuration, the light emitting unit 31 is the same as in the first embodiment. That is, the light emitting array 30 includes an electrode on the first surface and an electrode on the second surface. However, the scope of the present invention is not limited thereto. For example, the light emitting unit 31 may include the P-side individual electrode 42 and the N-side electrode on the first surface, and each pixel of the IC chip 20 may include the N-side electrode 47 together with the P-side electrode 46.

In this configuration, the first row-selection transistor 75 is formed of nMOS. However, pMOS may be used for the first row-selection transistor 75 by reversing the polarity of the first row-selection signal line 71. Desirably, a transfer gate using both pMOS and nMOS may be used, and accordingly the voltage of the second column signal line 96 can be transmitted to the first drive transistor 77 without being affected by the threshold value of the first row-selection transistor 75. The first drive transistor 77 may be formed of nMOS, and is not limited to pMOS.

Ninth Embodiment

A ninth embodiment of the present invention will be described below with reference to FIG. 58. For convenience of description, the elements having the same functions as those of the elements described in the foregoing embodiments will be denoted by the same reference numerals, and the description thereof will be omitted. The present embodiment is different from the eighth embodiment in the configuration of the current adjusting circuit.

FIG. 58 illustrates an example of the drive circuit 90 and a current adjusting circuit 91A according to the present embodiment. The drive circuit 90 is the same as in the foregoing eighth embodiment. The current adjusting circuit 91A is a series circuit including the second drive transistor 100, the nonvolatile memory transistor 102, and the second row-selection transistor 101 that are arranged in series between a power supply line 99A and the GND line 98. The gate electrode of the second drive transistor 100 is connected to the column signal line 72. The gate electrode of the nonvolatile memory transistor 102 is connected to the gate control signal line 79. The gate electrode of the second row-selection transistor 101 is connected to the second row-selection signal line 97. Preferably, the second drive transistor 100 has the same size and performance as those of the first drive transistor 77, and the voltage of the power supply line 99A connected to the current adjusting circuit 91A is the same as the voltage of the power supply line 73 connected to the drive circuit 90. In FIG. 58, the second row-selection transistor 101 is closer than the nonvolatile memory transistor 102 to the GND. Alternatively, the nonvolatile memory transistor 102 may be closer than the second row-selection transistor 101 to the GND. When the second row-selection signal line 97 is activated, the first column signal CS output from the first column signal output circuit portion 23 is input to the gate electrode of the second drive transistor 100 through the first column signal line 72, and a reference current Tref flowing through this series circuit is controlled in accordance with the voltage of the first column signal CS. At this time, the magnitude of the reference current is affected also by the threshold value of the nonvolatile memory transistor 102.

In accordance with the amount of the reference current Tref, the potential of the second column signal line 96, that is, the second column signal CS2 is determined. Preferably, at the time the second row-selection signal line 97 is activated, the potential of the second column signal line 96 is at the same potential level as the power supply line 73. After the second column signal CS2 is determined, the first row-selection signal line 71 connected to the corresponding drive circuit 90 is activated, the first row-selection transistor 75 is turned ON, and the second column signal CS2 is input to the gate electrode of the first drive transistor 77 through the second column signal line 96.

Thus, the amount of the drive current I flowing through the light emitting unit 31 is determined in accordance with the voltage of the second column signal CS2. After the gate potential of the first drive transistor 77 is determined, the first row-selection transistor 75 is turned OFF. However, the gate potential of the drive transistor is held at the potential of the input second column signal CS2 by the voltage holding capacitor 76, and the drive current I determined in accordance with the voltage of the input second column signal CS2 continuously flows until the first row-selection transistor 75 is turned ON next time. The gate control signal ling 79 applies the same voltage to the nonvolatile memory transistors 102 of all the current adjusting circuits 91A, and the reference current is adjusted by the threshold value of each nonvolatile memory transistor 102.

In the present embodiment, the column signal line 72 is connected to the gate electrode of the second drive transistor 100, and the gate electrode of the nonvolatile memory transistor 102 is connected to the dedicated gate control signal line 79. In the eighth embodiment, the output of the first column signal output circuit portion 23 is input to the gate electrode of the nonvolatile memory transistor 102, and thus the first column signal CS typically has a large value compared to the second column signal CS2. In the present embodiment, the first column signal CS output from the first column signal output circuit portion 23 is input to the gate electrode of the second drive transistor 100 similar to the first drive transistor 77, and thus the first column signal CS and the second column signal CS2 may have configurations not so different from each other. Thus, the voltage of the first column signal CS output from the first column signal output circuit portion 23 decreases, and the power consumption can be reduced. In addition, the first column signal output circuit portion 23 can be formed of a low-voltage transistor, and thus the circuit area can be reduced.

The threshold value of the nonvolatile memory transistor 102 is controlled by a pulse applied to the gate control signal line 79 in accordance with the amount of light emission of the light emitting unit 31. Other than that, the configuration is basically the same as in the eighth embodiment. In this configuration, it is not necessary to apply a high voltage required for write or erase through the column signal line 72, and thus the first column signal output circuit portion 23 can be formed of a low-voltage transistor. This is advantageous in that the circuit area of the first column signal output circuit portion 23 can be reduced.

In this configuration, as in the eighth embodiment, a short-circuit pixel can be changed to a black pixel, and variation in the amount of light emission can be reduced. Accordingly, LED display chips that are excellent in consistency can be produced with high yield. Furthermore, there is an advantage that the area of the first column signal output circuit portion 23 can be reduced and the power consumption can be reduced.

Tenth Embodiment

A tenth embodiment of the present invention will be described below with reference to FIG. 59 to FIG. 63. For convenience of description, the elements having the same functions as those of the elements described in the foregoing embodiments will be denoted by the same reference numerals, and the description thereof will be omitted.

Figure 59:
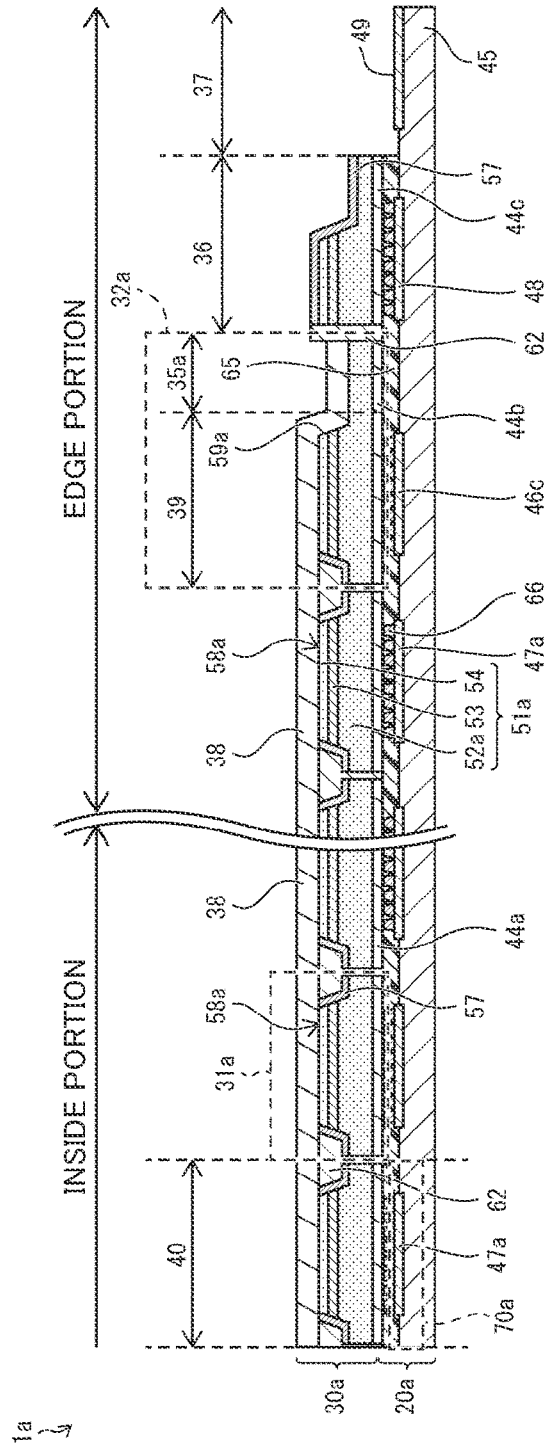
FIG. 59 is a cross-sectional view illustrating a schematic configuration of an LED display chip according to still another embodiment of the present invention.

FIG. 59 is a cross-sectional view illustrating a schematic configuration of an LED display chip 1a according to the tenth embodiment.

As illustrated in FIG. 59, the LED display chip 1a according to the present tenth embodiment is different from the LED display chip 1 according to the first embodiment in that the polarity is reverted. The LED display chip 1a according to the present tenth embodiment may be variously changed, for example, a wavelength conversion layer may be included, as in the LED display chips 1 according to the other embodiments.

As illustrated in FIG. 59, a light emitting unit 31a includes a compound semiconductor layer 51a including an N-side epitaxial layer 52a, the light emitting layer 53, and the P-side epitaxial layer 54 that are stacked in this order; the protective film 57 for protecting the compound semiconductor layer 51a; a P-side common electrode 38 (second electrode) that is in contact with the P-side epitaxial layer 54; and an N-side individual electrode 44a (first electrode) connected to the N-side epitaxial layer 52a. In the light emitting unit 31a according to the tenth embodiment illustrated in FIG. 59, unlike in the light emitting unit 31 according to the first embodiment illustrated in FIG. 2, the N-side epitaxial layer 52a is disposed near an IC chip 20a (near the first surface) and the P-side epitaxial layer 54 is disposed near the display surface (near the second surface). Thus, in the present tenth embodiment, the N-side individual electrode 44a is provided for each light emitting unit 31a, and the P-side common electrode 38 as one body is provided for a plurality of light emitting units 31a.

On the other hand, a wiring unit 32a (connection unit) includes the compound semiconductor layer 51a, the protective film 57, the P-side common electrode 38 (fourth electrode), and a P-side wiring electrode 44b (third electrode) connected to the N-side epitaxial layer 52a. The P-side wiring electrode 44b is provided on a surface (third surface) near the IC chip 20a. The wiring unit 32a includes an N-side epitaxial layer exposed region 35a and a P-side electrode region 39. In the N-side epitaxial layer exposed region 35a on the surface (fourth surface) opposite to the IC chip 20a, the N-side epitaxial layer 52a is exposed, and the exposed N-side epitaxial layer 52a is covered by the P-side common electrode 38. The P-side common electrode 38 continuously extends over the light emitting units 31a and the wiring unit 32a.

Also in the IC chip 20a according to the present tenth embodiment, the polarity is reversed compared with the IC chip 20 according to the first embodiment. The IC chip 20a includes N-side electrodes 47a (first drive electrode) individually connected to the N-side individual electrodes 44a corresponding to the pixels 40. The IC chip 20a includes a P-side electrode 46c (second drive electrode) connected to the P-side wiring electrode 44b of the wiring unit 32a.

In the wiring unit 32a, the P-side common electrode 38 and the P-side wiring electrode 44b are connected to each other through the n-side epitaxial layer 52a in the N-side epitaxial layer exposed region 35a. Thus, the P-side common electrode 38 of the light emitting array 30a is connected to the P-side electrodes 46c of the IC chip 20a through the N-side epitaxial layer 52a, the P-side wiring electrodes 44b, and the microbumps 66.

As described above, in the present tenth embodiment, compared to the first embodiment, the polarity of the light emitting array 30a is reversed. On the other hand, the connection relationship among the light emitting units 31a, the wiring units 32a, and the IC chip 20a is similar.

(Drive Circuit)

Figure 60:
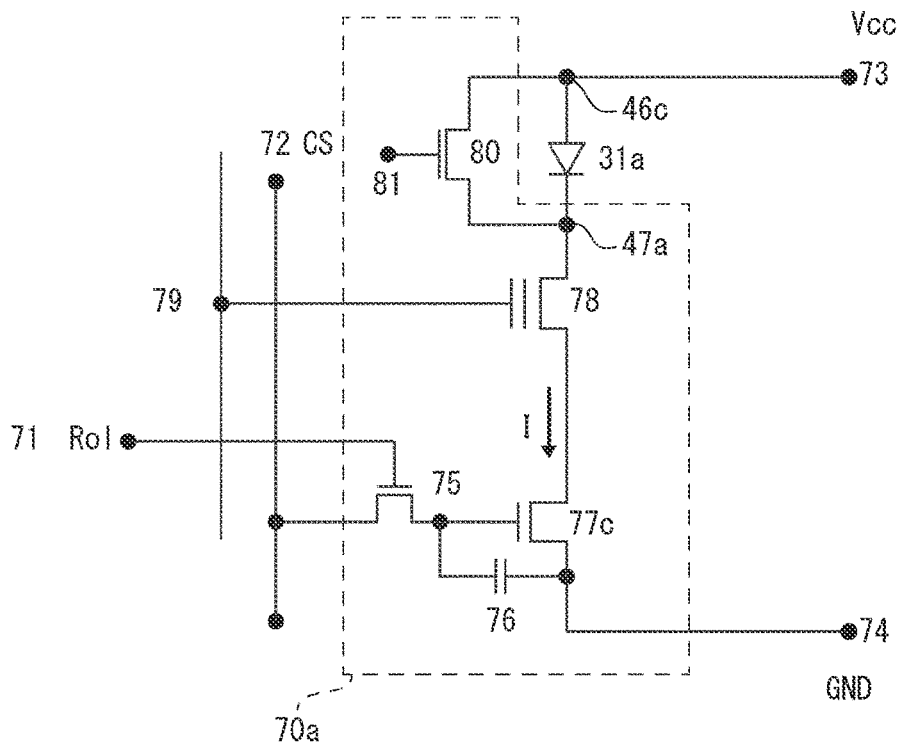
FIG. 60 is a circuit diagram illustrating an example of a drive circuit provided in an IC chip according to the still another embodiment of the present invention.

FIG. 60 is a circuit diagram illustrating an example of a drive circuit 70a according to the tenth embodiment. The drive circuit 70a is not limited to the example illustrated in FIG. 60. The circuit configurations of various known pixel drive circuits may be used in combination with various circuit elements functioning as nonvolatile memories.

Since the polarity is reversed as described above, the drive circuit 70a according to the present tenth embodiment has a reversed polarity with respect to the drive circuit 70 according to the first embodiment. On the other hand, the connection relationship is not changed as described above, and thus the operation is not changed.

The drive circuit 70a illustrated in FIG. 60 has a configuration similar to that of the drive circuit 70 illustrated in FIG. 7 except for the following two points: the light emitting unit 31a is disposed near the power supply voltage Vcc; and a drive transistor 77c is formed of an NMOS transistor. The drive transistor 77c is closer than the nonvolatile memory transistor 78 to the GND. Alternatively, the nonvolatile memory transistor 78 may be closer than the drive transistor 77c to the GND.

The LED display chip 1a may include dummy units 36 in addition to the light emitting units 31a and the wiring units 32a. Each dummy unit 36 may include a dummy electrode 44c, and the IC chip 20a may include a corresponding dummy electrode 48. When the dummy electrode 44c and the dummy electrode 48 corresponding to each other are connected to each other, the dummy unit 36 can be fixed onto the IC chip 20a. The dummy unit 36 is disposed in a portion without the drive circuit 70a on the IC chip 20a, for example, and is directed to increase the flatness of the surface of the LED display chip 1a and to make it easier to form a wavelength conversion layer. In addition, the LED display chip 1a may include a bonding pad 49 and a through-silicon via (TSV) for connecting the LED display chip 1a to a wiring substrate or the like, and may include a bonding region 37 for external connection therefor.

(Manufacturing Steps)

Figure 61:
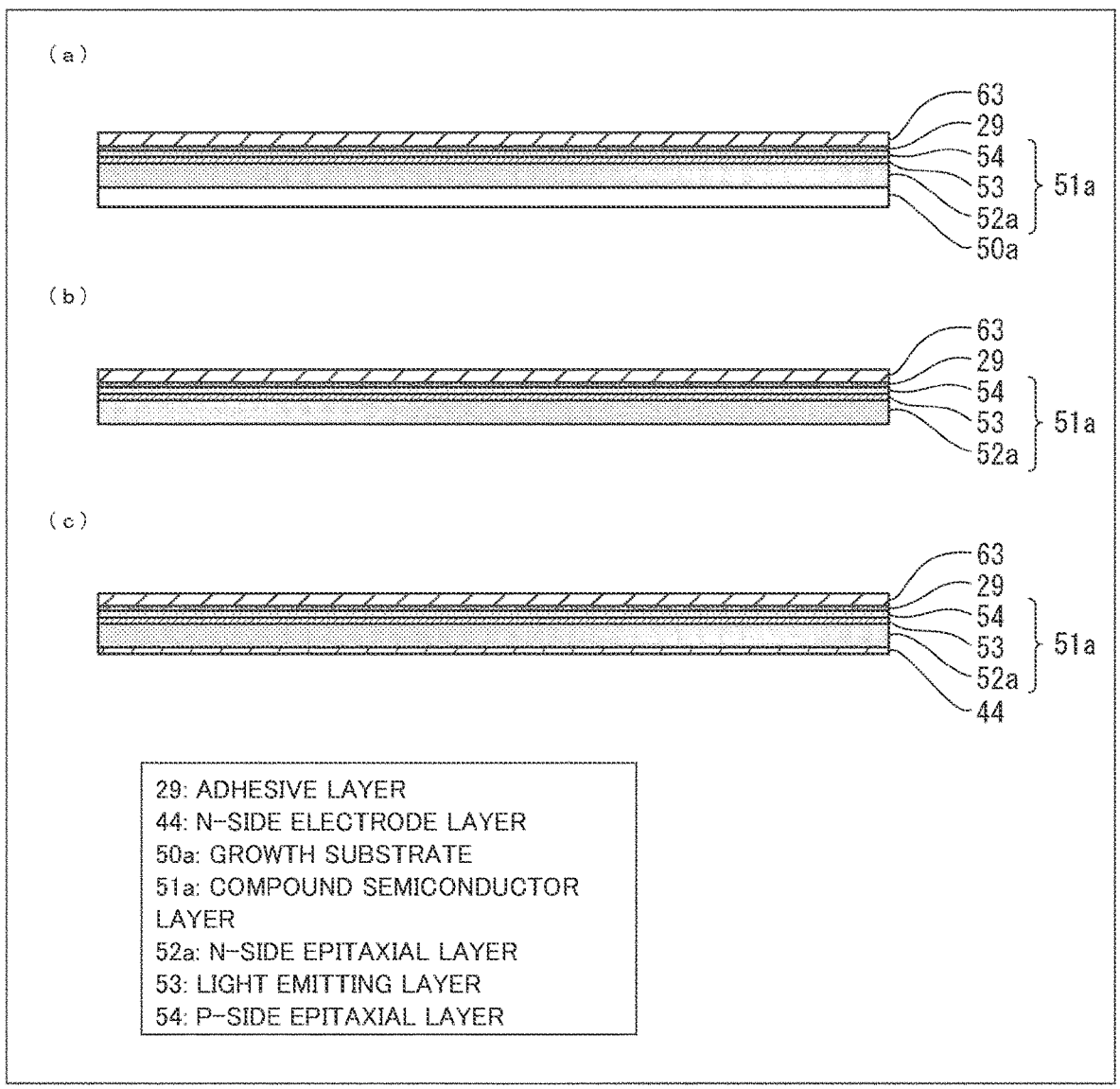
FIG. 61 is a cross-sectional view for describing part of exemplary manufacturing steps of the LED display chip illustrated in FIG. 59.
Figure 62:
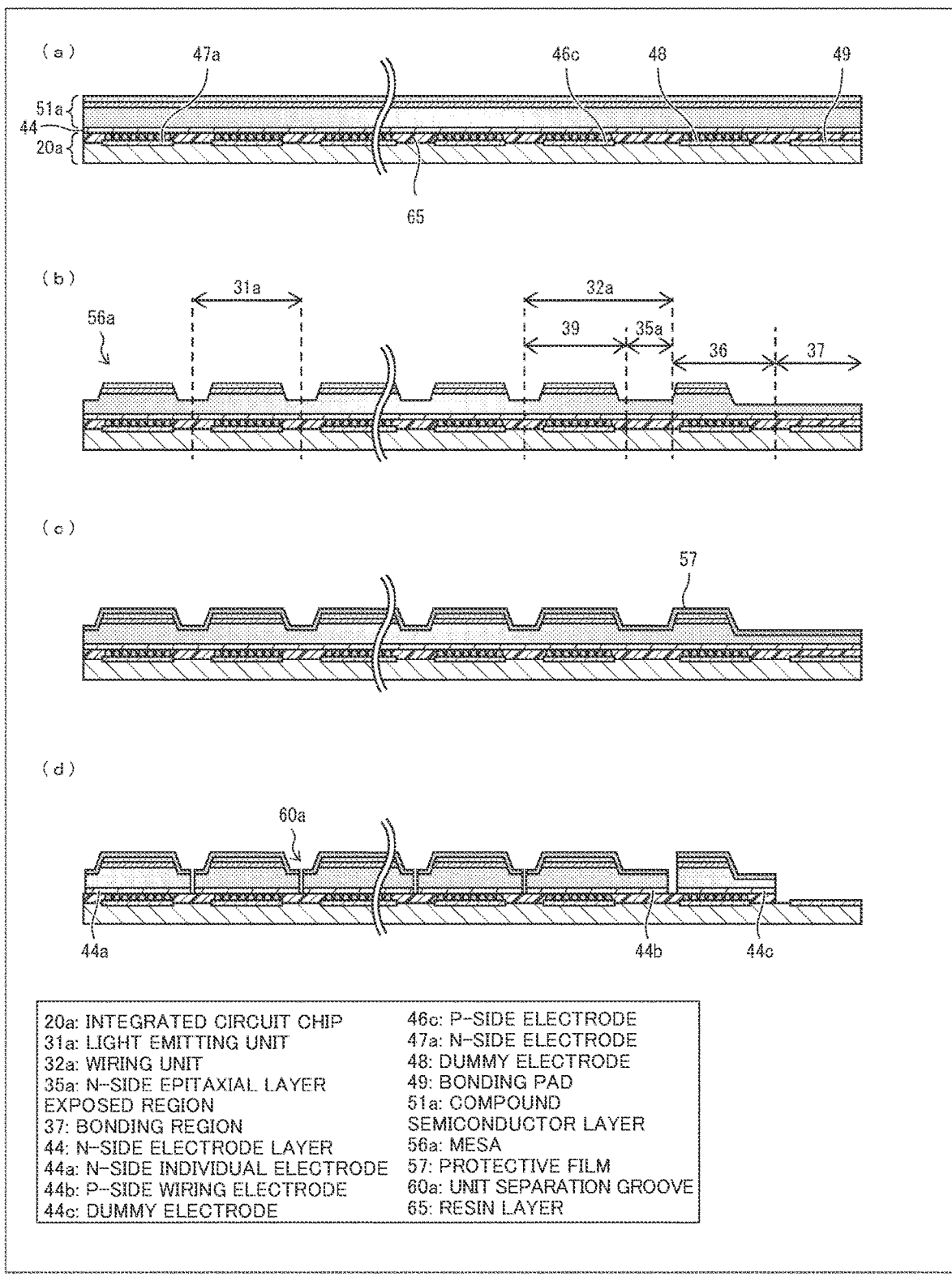
FIG. 62 is a cross-sectional view for describing part of the exemplary manufacturing steps of the LED display chip illustrated in FIG. 59.
Figure 63:
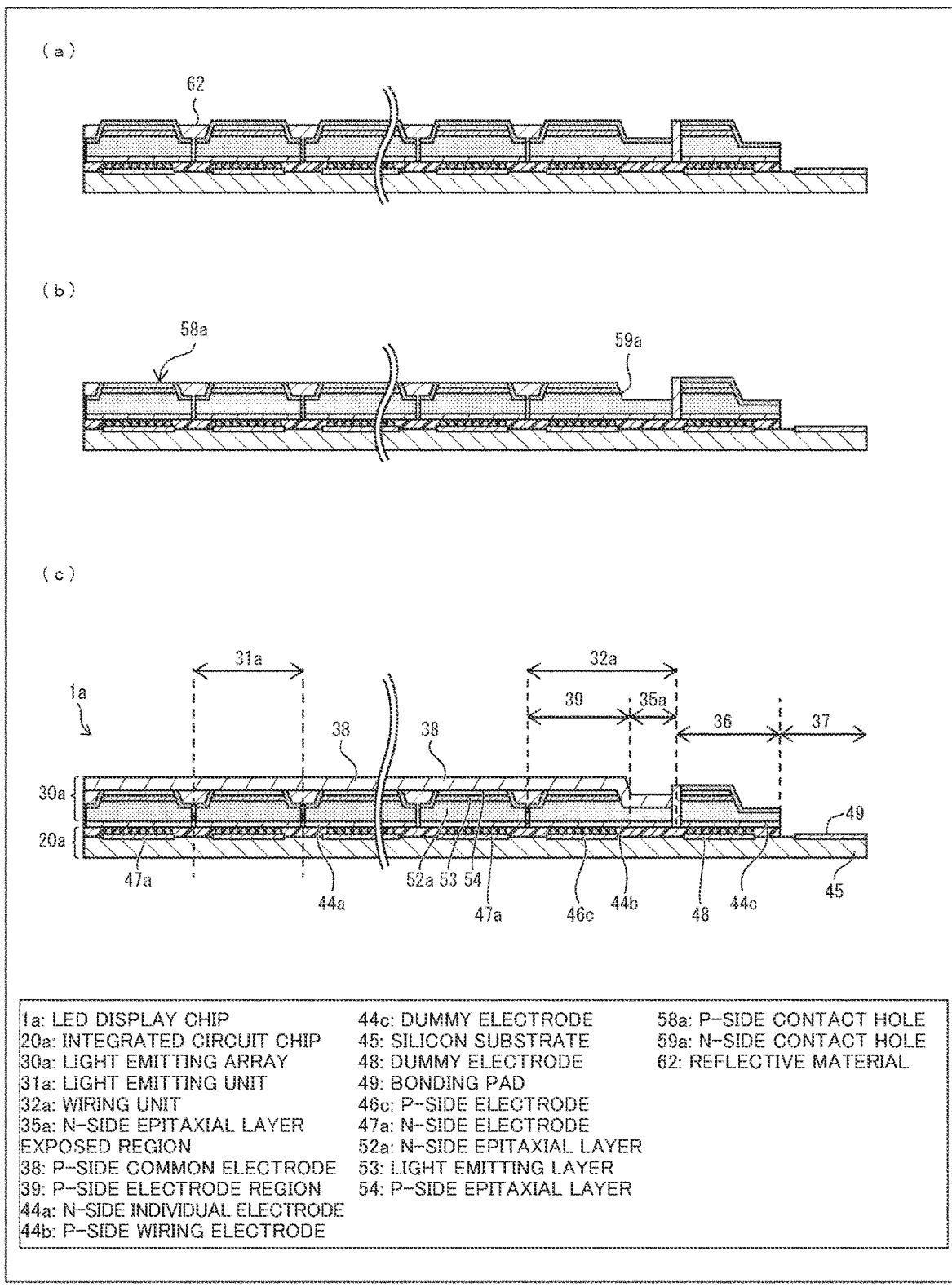
FIG. 63 is a cross-sectional view for describing part of the exemplary manufacturing steps of the LED display chip illustrated in FIG. 59.

FIG. 61 to FIG. 63 are diagrams illustrating exemplary manufacturing steps of manufacturing the LED display chip 1a according to the present tenth embodiment in order. FIG. 61 to FIG. 63 illustrate an exemplary sequence of steps in order. Thus, reference numerals in a figure illustrating a preceding step will appropriately be omitted in a figure illustrating a subsequent step for the sake of simplicity.

Hereinafter, exemplary manufacturing steps of manufacturing the LED display chip 1a will be described in detail with reference to FIG. 61 to FIG. 63.

First, as illustrated in part (a) of FIG. 61, a growth substrate 50a for growing the compound semiconductor layer 51a is prepared, and the N-side epitaxial layer 52a including a buffer layer or the like, the light emitting layer 53, and the P-side epitaxial layer 54 are grown in this order on the growth substrate 50a. The growth substrate 50a is, for example, a silicon substrate, and a (111) surface is preferably used as a growth surface. Preferably, the N-side epitaxial layer 52a is entirely n-doped for conduction in the film thickness direction. A transparent conductive film may be stacked on the P-side epitaxial layer 54. Subsequently, the compound semiconductor layer 51a is bonded to the peel substrate 63 with an adhesive layer 29 interposed therebetween, on the side of the P-side epitaxial layer 54.

Subsequently, as illustrated in part (b) of FIG. 61, the growth substrate 50a is removed. When the growth substrate 50a is a silicon substrate, the growth substrate 50a can be removed by using grinding, polishing, plasma etching, wet etching, and the like in combination. Subsequently, as illustrated in part (c) of FIG. 61, an N-side electrode layer 44 is formed on the surface of the exposed N-side epitaxial layer 52a. The N-side electrode layer 44 is a metallic multilayer film including a metallic thin film that is in contact with the compound semiconductor layer 51a and has high interface reflectivity, for example, a thin film made of aluminum, silver, or the like.

Subsequently, as illustrated in part (a) of FIG. 62, the compound semiconductor layer 51a and the N-side electrode layer 44 bonded to the peel substrate 63 are bonded to the IC chip 20a, and the peel substrate 63 is peeled off from the compound semiconductor layer 51a. At this time, the N-side electrode layer 44 is connected to the P-side electrodes 46c, the N-side electrodes 47a, and the dummy electrodes 48 on the IC chip 20a. Note that this step does not require accurate alignment. It is sufficient that the wafers, that is, the wafer on which the IC chip 20a is formed and the peel substrate 63 bonded to the compound semiconductor layer 51a be bonded together, and it is not necessary to accurately align the electrodes. The electrode connection method may be similar to that in the first embodiment, or the individual electrodes may be directly connected to each other. In part (a) of FIG. 62, the P-side electrode 46c, the N-side electrodes 47a, and the dummy electrode 48 on the IC chip 20a are protruded on the substrate surface, but these electrodes may be formed in the substrate like damascene interconnection and only the surfaces thereof may be exposed.

Subsequently, as illustrated in part (b) of FIG. 62, mesas 56a are formed. In the region of the mesas 56a, part of the N-side epitaxial layer 52a, the light emitting layer 53, and the P-side epitaxial layer 54 are partially removed by etching. The mesas 56a are formed in the light emitting units 31a, the P-side electrode region 39 of the wiring unit 32a, and the outer periphery of a dummy unit 36. In the N-side epitaxial layer exposed region 35a of the wiring unit 32a and in the region where the bonding pad 49 is formed, the light emitting layer 53 and the P-side epitaxial layer 54 are completely removed to expose the N-side epitaxial layer 52a. The sloped side surfaces of the mesas 56a are preferably sloped 35 degrees or more and 55 degrees or less with respect to the display surface of the LED display chip 1a, and more preferably sloped about 45 degrees. With this slope angle, the light emitted from the light emitting layer 53 substantially in parallel to the display surface of the LED display chip 1a can be reflected substantially orthogonally to the display surface of the LED display chip 1a, can be reflected again on the interface between the N-side individual electrode 44a and the N-side epitaxial layer 52a, and can be extracted in the direction of the display surface of the LED display chip 1a, thereby further increasing the light extraction efficiency.

Subsequently, as illustrated in part (c) of FIG. 62, the entire upper surface of the compound semiconductor layer 51a is covered with the protective film 57, and as illustrated in part (d) of FIG. 62, unit separation grooves 60a are formed. At this time, the N-side electrode layer 44 is divided into portions corresponding to the units to serve as the N-side individual electrode 44a in each light emitting unit 31a, as the P-side wiring electrode 44b in each wiring unit 32a, and as the dummy electrode 44c in each dummy unit 36. The compound semiconductor layer 51a on the bonding pad 49 is removed.

Subsequently, as illustrated in part (a) of FIG. 63, the unit separation grooves 60a are filled with the reflective material 62. At this time, the N-side epitaxial layer exposed region 35 and the bonding region 37 are not covered with the reflective material 62, or are once covered with the reflective material 62 and then the reflective material 62 is removed. Subsequently, as illustrated in part (b) of FIG. 63, (i) the P-side contact hole 58a is formed in the protective film 57 on each light emitting unit 31a, and (ii) an N-side contact hole 59a extending over the N-side epitaxial layer exposed region 35a and the P-side electrode region 39 is formed in the protective film 57 on each wiring unit 32a. Alternatively, the N-side contact hole 59a may be formed only in the N-side epitaxial layer exposed region 35a, not in the P-side electrode region 39.

Subsequently, as illustrated in part (c) of FIG. 63, the P-side common electrode 38 is formed. All the above-described steps illustrated in FIG. 62 and FIG. 63 can be performed on the wafer on which the IC chips 20a are formed. In this way, the LED display chips 1a are completed on the wafer on which the IC chips 20a are formed, and then division into chips can be performed.

In this structure and manufacturing method, the LED display chips 1a can be completed on the wafer on which the IC chips 20a are formed, as described above. Thus, it is easy to maintain the cleanness of the LED display chips 1a under manufacturing and the manufacturing steps of the LED display chips 1a, high yield can be realized, and the cost can be reduced. Furthermore, it is not necessary to accurately align the light emitting units 31a on the IC chip 20a, and the light emitting array 30a can be bonded to the IC chip 20a in a short time. Thus, the manufacturing cost can be advantageously reduced by increasing productivity. As described above, the present embodiment has, in addition to the advantages of the first embodiment, advantages that productivity is very high because accurate alignment between chips is not necessary for bonding wafers and that high-yield production is realized by using manufacturing steps with higher cleanness.

(Conclusion)

A display device according to an aspect 1 of the present invention (LED display chip 1, blue LED display chip 1B, green LED display chip 1G, red LED display chip 1R, display system 7, LED display chip 1a) includes: a plurality of light emitting units (31, 31a) each of which includes at least one light emitting element (light emitting unit 31 in first, eighth, and ninth embodiments, first LED 41 and second LED 41b in second to seventh embodiments, light emitting unit 31a in tenth embodiment) and has a first surface and a second surface opposite to the first surface; and an integrated circuit device (integrated circuit chip 20, 20a) that includes a plurality of drive circuits (70, 70a, 90) each of which is configured to drive a corresponding one of the plurality of light emitting units and that has a mounting surface on which the plurality of light emitting units are mounted. The first surface faces the mounting surface, each light emitting element includes a first electrode (P-side individual electrode 42, 42a, 42b, N-side individual electrode 44a) that is disposed on the first surface, each drive circuit includes a first drive electrode (P-side electrode 46, 46a, 46b, N-side electrode 47a) that is disposed on the mounting surface and connected to the first electrode of the light emitting element included in the corresponding light emitting unit, and includes a nonvolatile memory (78, 78a, 78b, 78c, 78d, 102) configured to control current supply to the first drive electrode.

According to the above-described configuration, the drive circuit includes the first drive electrode that is disposed on the mounting surface and connected to the first electrode of the light emitting element included in the corresponding light emitting unit, and includes the nonvolatile memory configured to control current supply to the first drive electrode. Accordingly, the nonvolatile memory is able to control current supply to the first electrode of the light emitting element, and is thus able to adjust the light emission intensity of the light emitting element and to cause the light emitting element to emit no light.

As a result of adjusting the light emission intensity of the light emitting element, the light emitting intensity of each light emitting unit can be adjusted to be within a range of the light emission intensity required for the display device, enabling the manufacturing yield of the light emitting unit to increase and the display device to be manufactured with a low defect rate and high yield.

In a display device according to an aspect 2 of the present invention (LED display chip 1, blue LED display chip 1B, green LED display chip 1G, red LED display chip 1R, display system 7, LED display chip 1a), in the above aspect 1, the nonvolatile memory (78, 78a, 78b, 78c, 78d, 102) may be configured to control, independently in each drive circuit (70, 70a, 90), current supply to the first drive electrode (P-side electrode 46, 46a, 46b, N-side electrode 47a).

According to the above-described configuration, current supply to the first drive electrode is controlled independently in each drive circuit. Thus, each drive circuit is able to independently control the corresponding light emitting unit.

In a display device according to an aspect 3 of the present invention (LED display chip 1, blue LED display chip 1B, green LED display chip 1G, red LED display chip 1R, display system 7, LED display chip 1*a*), in the above aspect 1 or 2, the nonvolatile memory (78, 78*a*, 78*b*, 78*c*, 78*d*, 102) may be configured to be able to block current supply to the first drive electrode.

According to the above-described configuration, the nonvolatile memory is able to block current supply to the light emitting element. Thus, when there is a defective light emitting element, current supply to the defective light emitting element can be blocked. The defective light emitting element may abnormally emit light or leak current to an adjacent light emitting element. Thus, it is desirable to block current supply to the defective light emitting element.

In a display device according to an aspect 4 of the present invention (LED display chip 1, blue LED display chip 1B, green LED display chip 1G, red LED display chip 1R, display system 7, LED display chip 1*a*), in any one of the above aspects 1 to 3, the nonvolatile memory (78*a*, 78*b*, 78*c*, 78*d*, 102) may be configured to be able to perform at least one of decreasing and increasing of an amount of current to be supplied to the first drive electrode.

According to the above-described configuration, the nonvolatile memory is able to increase/decrease the amount of current to the light emitting element. Thus, as a result of increasing/decreasing the amount of current to be supplied to the light emitting element included in each light emitting unit, the light emission intensity of each light emitting unit can be increased/decreased. For example, when the light emission intensity varies among the plurality of light emitting units, unevenness of an image displayed by the display device can be reduced by adjusting current supply such that the difference in light emission intensity among the light emitting units is reduced.

In a display device according to an aspect 5 of the present invention (LED display chip 1, blue LED display chip 1B, green LED display chip 1G, red LED display chip 1R, display system 7), in any one of the above aspects 1 to 4, each light emitting unit (31) may include a plurality of light emitting elements (first LED 41*a* and second LED 41*b*).

According to the above-described configuration, each light emitting unit includes the plurality of light emitting elements, and the nonvolatile memory is able to control current supply to each light emitting element. Thus, the nonvolatile memory is able to supply current to one or some of the plurality of light emitting elements included in one light emitting unit and to block current supply to the other light emitting element(s).

Defect of light emitting elements occurs locally, and the possibility that light emitting elements adjacent to each other are defective is very low. The possibility that all the plurality of light emitting elements included in one light emitting unit are defective is lower. Thus, a light emitting unit is a non-defective product as long as it includes one non-defective light emitting element, thereby significantly increasing the possibility that the light emitting unit is non-defective. Accordingly, the manufacturing yield of a light emitting unit and a light emitting array in which a plurality of light emitting units are integrated can be increased.

The light emission efficiency of a light emitting element, such as an LED, normally decreases when the current density is too high. Thus, when a light emitting unit is used at a high current density where the light emission efficiency decreases, the current density of each light emitting element can be decreased and the light emission efficiency of each light emitting element can be increased by using more light emitting elements. Thus, the light emission intensity of a light emitting unit can be adjusted by adjusting the number of light emitting elements that are simultaneously used.

In a display device according to an aspect 6 of the present invention (LED display chip 1, blue LED display chip 1B, green LED display chip 1G, red LED display chip 1R, display system 7), in any one of the above aspects 1 to 5, each light emitting unit (31) may include two or more light emitting elements (first LED 41*a* and second LED 41*b*), in each light emitting unit, the two or more light emitting elements may each include the first electrode, the first electrodes being separated from each other, and the two or more light emitting elements may include a second electrode which is a single body, and in each drive circuit (70), the first drive electrode (P-side electrode 46, 46*a*, 46*b*) may include two or more first drive electrodes, and the nonvolatile memory (78*a*, 78*b*) may be configured to independently control current supply to each of the two or more first drive electrodes.

A display device according to an aspect 7 of the present invention (LED display chip 1, blue LED display chip 1B, green LED display chip 1G, red LED display chip 1R, display system 7, LED display chip 1*a*), in any one of the above aspects 1 to 6, may further include at least one connection unit (wiring unit 32, 32*a*) that has a third surface and a fourth surface opposite to the third surface. The third surface may face the mounting surface, each light emitting element may include a second electrode (N-side common electrode 33, P-side common electrode 38) that is disposed on the second surface, the connection unit may include a third electrode (N-side wiring electrode 43, P-side wiring electrode 44*b*) that is disposed on the third surface and a fourth electrode (N-side common electrode 33, P-side common electrode 38) that is disposed on the fourth surface and connected to the third electrode through an inner portion (N-side epitaxial layer 52, 52*b*) of the connection unit, the integrated circuit device (IC chip 20, 20*a*) may include a second drive electrode (N-side electrode 47, P-side electrode 46*c*) that is disposed on the mounting surface and connected to each drive circuit (70, 70*a*, 90) through an inner portion of the integrated circuit device, the second electrode may be connected to the fourth electrode, and the third electrode may be connected to the second drive electrode.

A display device according to an aspect 8 of the present invention (LED display chip 1, blue LED display chip 1B, green LED display chip 1G, red LED display chip 1R, display system 7, LED display chip 1*a*) includes: a plurality of light emitting units (31, 31*a*) each of which includes at least one light emitting element (light emitting unit 31 in first, eighth, and ninth embodiments, first LED 41*a* and second LED 41*b* in second to seventh embodiments, light emitting unit 31*a* in tenth embodiment) and has a first surface and a second surface opposite to the first surface; a connection unit (wiring unit 32, 32*a*) that has a third surface and a fourth surface opposite to the third surface; and an integrated circuit device that includes a plurality of drive circuits (70, 70*a*, 90) each of which is configured to drive a corresponding one of the plurality of light emitting units and that has a mounting surface on which the plurality of light emitting units are mounted. The first surface and the third surface face the mounting surface, each light emitting element includes a first electrode (P-side individual electrode 42, 42*a*, 42*b*, N-side individual electrode 44*a*) that is disposed on the first surface and a second electrode (N-side common electrode 33, P-side common electrode 38) that is disposed on the second surface, the connection unit includes a third electrode (N-side wiring electrode 43, P-side wiring electrode 44*b*) that is disposed on the third surface and a fourth electrode (N-side common electrode 33, P-side common electrode 38) that is disposed on the fourth surface and connected to the third electrode through an inner portion of the connection unit, each drive circuit includes a first drive electrode (P-side electrode 46, 46*a*, 46*b*, N-side electrode 47*a*) that is disposed on the mounting surface and connected to the first electrode of the light emitting element included in the corresponding light emitting unit, the integrated circuit device includes a second drive electrode (N-side electrode 47, P-side electrode 46*c*) that is disposed on the mounting surface and connected to each drive circuit through an inner portion of the integrated circuit device, the second electrode is connected to the fourth electrode, and the third electrode is connected to the second drive electrode.

According to the above-described configuration, the second electrode of each light emitting element is disposed on the second surface opposite to the first surface and is connected to the fourth electrode of the connection unit. Furthermore, the third electrode of the connection unit is connected to the fourth electrode in the inner portion of the connection unit. Thus, the second electrode of each light emitting element is connected to the second drive electrode of the integrated circuit device via the connection unit.

Furthermore, according to the above-described configuration, the first surface of the light emitting unit and the third surface of the connection unit face the mounting surface of the integrated circuit device. Thus, a step of connecting the first electrode on the first surface to the first drive electrode and a step of connecting the third electrode on the third surface to the second drive electrode can be integrated into the same step. Furthermore, since the second surface of the light emitting unit and the fourth surface of the connection unit faces away from the integrated circuit device, the second electrode of each light emitting element can be easily connected to the fourth electrode of the connection unit, and the second electrode and the fourth electrode can be integrated with each other. The integration of the second electrode and the fourth electrode reduces the number of steps for manufacturing the display device, which is favorable.

Thus, in the light emitting element in which two electrodes are provided on surfaces oriented in opposite directions, both electrodes can be connected to the integrated circuit device substantially only by flip chip bonding. Thus, the number of steps for connection in the manufacturing steps of the display device can be reduced.

In a display device according to an aspect 9 of the present invention (LED display chip 1, blue LED display chip 1B, green LED display chip 1G, red LED display chip 1R, display system 7, LED display chip 1*a*), in the above aspect 7 or 8, the plurality of light emitting units (31, 31*a*) may be arranged to form a group, and the connection unit (wiring unit 32, 32*a*) may be arranged next to an outer periphery of the group of the plurality of light emitting units.

According to the above-described configuration, the connection unit is disposed next to the outer periphery of the group of the plurality of light emitting units. Thus, the connection unit can be arranged without changing the interval (pitch) of the light emitting units.

A display device according to an aspect 10 of the present invention (LED display chip 1, blue LED display chip 1B, green LED display chip 1G, red LED display chip 1R, display system 7), in any one of the above aspects 1 to 9, may further include a planarizing layer (67) for reducing a difference in level between the mounting surface of the integrated circuit device (IC chip 20) and the second surfaces of the plurality of light emitting units (31).

According to the above-described configuration, the difference in level between the integrated circuit device and the light emitting units is reduced. Thus, it becomes easy to form another layer, such as a wavelength conversion layer.

In a display device according to an aspect 11 of the present invention (LED display chip 1, blue LED display chip 1B, green LED display chip 1G, red LED display chip 1R, display system 7), in the above aspect 10, the planarizing layer (67) may be provided, on the mounting surface, outside a region where the plurality of light emitting units (31) are mounted.

In a display device according to an aspect 12 of the present invention (LED display chip 1, blue LED display chip 1B, green LED display chip 1G, red LED display chip 1R, display system 7, LED display chip 1*a*), in any one of the above aspects 1 to 11, the plurality of light emitting units (31, 31*a*) may be separated from each other by a reflective material (62) that is able to reflect light emitted by the plurality of light emitting units.

A display device according to an aspect 13 of the present invention (LED display chip 1, blue LED display chip 1B, green LED display chip 1G, red LED display chip 1R, display system 7, LED display chip 1*a*) includes a plurality of light emitting units (31, 31*a*). The plurality of light emitting units are separated from each other by a reflective material (62) that is able to reflect light emitted by the plurality of light emitting units.

According to the above-described configuration, the light emitting units are separated from each other by the reflective material. This prevents a situation from occurring where light generated in a light emitting unit leaks to a space between light emitting units, enters another light emitting unit, and is output to the outside from the other light emitting unit. Accordingly, the contrast of an image to be displayed can be increased.

A display device according to an aspect 14 of the present invention (LED display chip 1, blue LED display chip 1B, green LED display chip 1G, red LED display chip 1R, display system 7), in any one of the above aspects 1 to 13, may further include, for at least a part of each light emitting unit (31), a wavelength conversion layer (68, 68R, 68B, 68G) that is able to convert a wavelength of light emitted by the light emitting unit.

In a display device according to an aspect 15 of the present invention (LED display chip 1, blue LED display chip 1B, green LED display chip 1G, red LED display chip 1R, display system 7, LED display chip 1*a*), in any one of the above aspects 1 to 14, the plurality of light emitting units (31, 31*a*) may correspond to a plurality of pixels or sub-pixels constituting a displayed image in a one-to-one relationship.

A manufacturing method for a display device according to an aspect 16 of the present invention includes: a light emitting unit formation step of forming, on a first heterogeneous substrate (sapphire wafer W2, sapphire substrate 50), a plurality of light emitting units (31) each of which includes at least one light emitting element (light emitting unit 31 in the first, eighth, and ninth embodiments, first LED 41*a* and second LED 41*b* in the second to seventh embodiments) and has a first surface and a second surface opposite to the first surface such that the second surface faces the first heterogeneous substrate; an integrated circuit device formation step of forming an integrated circuit device (IC chip 20) that includes a plurality of drive circuits (70, 70*a*) each of which is configured to drive a corresponding one of the plurality of light emitting units and that has a mounting surface; a light emitting unit mounting step of mounting the plurality of light emitting units on the mounting surface of the integrated circuit device such that the first surface faces the mounting surface; and a first heterogeneous substrate separation step of selectively separating the first heterogeneous substrate from the plurality of light emitting units. Each light emitting element includes a first electrode (P-side individual electrode 42, 42*a*, 42*b*) that is disposed on the first surface, each drive circuit includes a first drive electrode (P-side electrode 46, 46*a*, 46*b*) that is disposed on the mounting surface and includes a nonvolatile memory (78, 78*a*, 78*b*, 78*c*, 78*d*, 102) configured to control current supply to the first drive electrode, and in the light emitting unit mounting step, the first drive electrode of each drive circuit is connected to the first electrode of the light emitting element included in the corresponding light emitting unit.

In a manufacturing method for a display device according to an aspect 17 of the present invention, in the above aspect 16, in the light emitting unit formation step, the plurality of light emitting units (31) may be monolithically formed on the same first heterogeneous substrate (sapphire wafer W2, sapphire substrate 50) such that the plurality of light emitting units (31) are included in one light emitting array (30). The manufacturing method may further include a light emitting unit separation step of separating the plurality of light emitting units included in the one light emitting array from each other.

According to the above-described manufacturing method, a plurality of light emitting units can be monolithically formed on the same substrate in units of light emitting arrays. Thus, a plurality of light emitting units can be formed and mounted in units of light emitting arrays, and various types of alignment can be easily performed in manufacturing steps.

According to the above-described manufacturing method, the display device according to the above aspect 1 can be manufactured.

In a manufacturing method for a display device according to an aspect 18 of the present invention, in the above aspect 17, in the light emitting unit formation step, a plurality of light emitting arrays, each of which is the light emitting array (30), may be formed on the same first heterogeneous substrate (sapphire wafer W2, sapphire substrate 50) and may be separated into individual light emitting arrays by cutting.

In a manufacturing method for a display device according to an aspect 19 of the present invention, in the above aspect 18, after the plurality of light emitting units are fixed to the integrated circuit device in the light emitting unit mounting step, the light emitting unit separation step may be performed.

According to the above-described manufacturing method, the light emitting unit separation step is performed after the plurality of light emitting units are fixed to the integrated circuit device. Thus, the plurality of light emitting units are not separated from each other at the time of fixing in the light emitting unit mounting step. Accordingly, misalignment is less likely to be caused by a difference in thermal expansion coefficient between the light emitting units and the integrated circuit device and a change in temperature in the light emitting unit mounting step.

In a manufacturing method for a display device according to an aspect 20 of the present invention, in in any one of the above aspects 16 to 19, after the plurality of light emitting units are fixed to the integrated circuit device in the light emitting unit mounting step, the first heterogeneous substrate separation step may be performed, and then a thermal compression bonging step may be performed.

According to the above-described manufacturing method, the first heterogeneous substrate separation step is performed after the plurality of light emitting units are fixed to the integrated circuit device. Thus, the plurality of light emitting units are not separated from each other at the time of fixing in the light emitting unit mounting step, which makes it easy to perform a fixing step. Furthermore, since a thermal compression bonding step that requires high temperature is performed after the first heterogeneous substrate separation step, misalignment is less likely to be caused by a difference in thermal expansion coefficient between the light emitting units and the integrated circuit device.

In a manufacturing method for a display device according to an aspect 21 of the present invention, in any one of the above aspects 16 to 20, in the integrated circuit device formation step, a plurality of integrated circuit devices, each of which is the integrated circuit device (IC chip 20), may be monolithically formed on a substrate (silicon wafer W1, silicon substrate 45) different from the heterogeneous substrate (sapphire wafer W2, sapphire substrate 50).

A manufacturing method for a display device according to an aspect 22 of the present invention, in any one of the above aspects 16 to 21, may further include: a connection unit formation step of forming, on a second heterogeneous substrate (sapphire wafer W2, sapphire substrate 50), at least one connection unit (wiring unit 32) that has a third surface and a fourth surface opposite to the third surface such that the fourth surface faces the second heterogeneous substrate; a connection unit mounting step of mounting the connection unit on the mounting surface of the integrated circuit device such that the third surface faces the mounting surface; and a second heterogeneous substrate separation step of selectively separating the second heterogeneous substrate from the connection unit. Each light emitting element may include a second electrode that is disposed on the second surface, the connection unit may include a third electrode (N-side wiring electrode 43) that is disposed on the third surface and a fourth electrode (N-side common electrode 33) that is disposed on the fourth surface and connected to the third electrode through an inner portion (N-side epitaxial layer 52) of the connection unit, each drive circuit may include a first drive electrode (P-side electrode 46, 46*a*, 46*b*) that is disposed on the mounting surface, the integrated circuit device may include a second drive electrode (N-side electrode 47) that is disposed on the mounting surface and connected to each drive circuit through an inner portion of the integrated circuit device, and in the connection unit mounting step, the third electrode may be connected to the second drive electrode. The manufacturing method may further include a unit-to-unit connection step of connecting the second electrode to the fourth electrode.

A manufacturing method for a display device according to an aspect 23 of the present invention includes: a light emitting unit formation step of forming, on a first heterogeneous substrate (sapphire wafer W2, sapphire substrate 50), a plurality of light emitting units (31) each of which includes at least one light emitting element (light emitting unit 31 in the first, eighth, and ninth embodiments, first LED 41*a* and second LED 41*b* in the second to seventh embodiments) and has a first surface and a second surface opposite to the first surface such that the second surface faces the first heterogeneous substrate; a connection unit formation step of forming, on a second heterogeneous substrate (sapphire wafer W2, sapphire substrate 50), at least one connection unit (wiring unit 32) that has a third surface and a fourth surface opposite to the third surface such that the fourth surface faces the second heterogeneous substrate; an integrated circuit device formation step of forming an integrated circuit device (IC chip 20) that includes a plurality of drive circuits (70, 70*a*) each of which is configured to drive a corresponding one of the plurality of light emitting units and that has a mounting surface; a light emitting unit mounting step of mounting the plurality of light emitting units on the mounting surface of the integrated circuit device such that the first surface faces the mounting surface; a connection unit mounting step of mounting the connection unit on the mounting surface of the integrated circuit device such that the third surface faces the mounting surface; a first heterogeneous substrate separation step of selectively separating the first heterogeneous substrate from the plurality of light emitting units; and a second heterogeneous substrate separation step of selectively separating the second heterogeneous substrate from the connection unit. Each light emitting element includes a first electrode (P-side individual electrode 42, 42*a*, 42*b*) that is disposed on the first surface and a second electrode (N-side common electrode 33) that is disposed on the second surface, the connection unit includes a third electrode (N-side wiring electrode 43) that is disposed on the third surface and a fourth electrode (N-side common electrode 33) that is disposed on the fourth surface and connected to the third electrode through an inner portion (N-side epitaxial layer 52) of the connection unit, each drive circuit includes a first drive electrode (P-side electrode 46, 46*a*, 46*b*) that is disposed on the mounting surface, the integrated circuit device includes a second drive electrode (N-side electrode 47) that is disposed on the mounting surface and connected to each drive circuit through an inner portion of the integrated circuit device, in the connection unit mounting step, the third electrode is connected to the second drive electrode, and in the light emitting unit mounting step, the first drive electrode of each drive circuit is connected to the first electrode of the light emitting element included in the corresponding light emitting unit. The manufacturing method further includes a unit-to-unit connection step of connecting the second electrode to the fourth electrode.

In a manufacturing method for a display device according to an aspect 24 of the present invention, in the above aspect 22 or 23, the second heterogeneous substrate (sapphire wafer W2, sapphire substrate 50) may be a substrate identical to the first heterogeneous substrate (sapphire wafer W2, sapphire substrate 50), and in the connection unit formation step, the connection unit (wiring unit 32) may be monolithically formed on the first heterogeneous substrate such that the connection unit is included in one light emitting array (30) together with the plurality of light emitting units (31). The manufacturing method may further include a connection unit separation step of separating the connection unit from the plurality of light emitting units.

A manufacturing method for a display device according to an aspect 25 of the present invention, in any one of the above aspects 16 to 24, may further include a filling-with-reflective-material step of filling spaces between the plurality of light emitting units (31) with a reflective material (62) that is able to reflect light emitted by the plurality of light emitting units.

A manufacturing method for a display device according to an aspect 26 of the present invention includes: a light emitting unit formation step of forming a plurality of light emitting units (31); and a filling-with-reflective-material step of filling spaces between the plurality of light emitting units with a reflective material (62) that is able to reflect light emitted by the plurality of light emitting units.

A manufacturing method for a display device according to an aspect 27 of the present invention, in the above aspect 26, may further include a light emitting unit mounting step of mounting the plurality of light emitting units (31) on an integrated circuit device (IC chip 20). The filling-with-reflective-material step may be performed after the light emitting unit mounting step.

According to the above-described manufacturing method, the filling-with-reflective-material step is performed after the light emitting unit mounting step. Thus, the filling-with-reflective-material step is not affected by the light emitting unit mounting step, and thus a void is less likely to occur in the reflective material.

A manufacturing method for a display device according to an aspect 28 of the present invention includes: an other light emitting unit formation step of forming, on an integrated circuit device having a mounting surface, a plurality of light emitting units (31*a*) each of which includes at least one light emitting element (light emitting unit 31*a* in tenth embodiment) and has a first surface and a second surface opposite to the first surface such that the first surface faces the mounting surface; and an integrated circuit device formation step of forming the integrated circuit device that includes a plurality of drive circuits (70*a*) each of which is configured to drive a corresponding one of the plurality of light emitting units. Each light emitting element includes a first electrode (N-side individual electrode 44*a*) that is disposed on the first surface, each drive circuit includes a first drive electrode (N-side electrode 47*a*) that is disposed on the mounting surface and includes a nonvolatile memory (78) configured to control current supply to the first drive electrode, and in the other light emitting unit mounting step, each first electrode is connected to the corresponding first drive electrode.

According to the manufacturing method according to the above aspect 28, an effect similar to that in the manufacturing method according to the aspect 16 is obtained, and also an effect of increasing the cleanness of manufacturing steps is obtained.

In a manufacturing method for a display device according to an aspect 29 of the present invention, in the above aspect 28, the other light emitting unit formation step may include: a first sub-step of forming a functional layer (compound semiconductor layer 51*a*) including a light emitting layer (53) on a first heterogeneous substrate (growth substrate 50*a*); a second sub-step of bonding a peel substrate (63) on the functional layer; a third sub-step of peeling off the first heterogeneous substrate from the functional layer; a fourth sub-step of forming an electrode layer (N-side electrode layer 44) on a surface of the functional layer from which the first heterogeneous substrate has been peeled off; a fifth sub-step of mounting the functional layer and the electrode layer on the integrated circuit device (20*a*) on the electrode layer side; a sixth sub-step of peeling off the peel substrate from the functional layer; and a seventh sub-step of forming a second electrode (P-side common electrode 38) on a surface of the functional layer from which the peel substrate has been peeled off. The plurality of light emitting elements may be formed from the functional layer, the electrode layer, and the second electrode, and the first electrode may be formed from the electrode layer.

A manufacturing method for a display device (LED display chip 1*a*) according to an aspect 29 of the present invention includes: a step of growing, on a growth substrate (50*a*), a compound semiconductor layer (51*a*) including a light emitting layer (53); a step of peeling off the growth substrate from the compound semiconductor layer; a step of forming a first electrode layer (N-side electrode layer 44) on a surface of the compound semiconductor layer exposed by the peeling step; an integrated circuit device formation step of forming an integrated circuit device (IC chip 20a) that includes a plurality of drive circuits (70a) each of which is configured to drive a corresponding one of a plurality of light emitting units (31a), each drive circuit including a first drive electrode (N-side electrode 47a) that is disposed on a mounting surface and including a nonvolatile memory (nonvolatile memory transistor 78) configured to control current supply to the first drive electrode; a step of bonding the compound semiconductor layer and the first electrode layer to the integrated circuit device such that the first electrode layer faces the mounting surface of the integrated circuit device; a step of processing the compound semiconductor layer into the plurality of light emitting units each of which includes at least one light emitting element; and a step of processing the first electrode layer into first electrodes (N-side individual electrode 44a) of the respective light emitting elements such that each first electrode faces the corresponding first drive electrode.

The present invention is not limited to the above-described embodiments and may be variously changed within the scope specified in the claims. An embodiment obtained by appropriately combining technical means disclosed in different embodiments is also included in the technical scope of the present invention. Furthermore, a new technical feature can be formed by combining technical means disclosed in the individual embodiments.

For example, in the above-described embodiments, the light emitting units 31 and the drive circuits 70 constituting the pixels 40 are arranged in N rows and M columns. Alternatively, these units and circuits may be arranged in a honeycomb pattern.

INDUSTRIAL APPLICABILITY

The present invention can be utilized in display devices and is useful to, for example, projectors, head-up displays, head-mounted displays, wearable terminals, and the like.

REFERENCE SIGNS LIST 1, 1a LED display chip
1B blue LED display chip
1G green LED display chip
1R red LED display chip
5 center control device
6 prism
7 display system
8 projection surface
20, 20a integrated circuit (IC) chip
21 image processing circuit portion
22 row-selection circuit portion, first row-selection circuit portion
23 column signal output circuit portion, first column signal output circuit portion
24 pixel drive circuit array portion
29 adhesive layer
30 light emitting array
31, 31a light emitting unit
32, 32a wiring unit (connection unit)
N-side common electrode (second electrode, fourth electrode)
N-side electrode region
35, 35a N-side epitaxial layer exposed region
36 dummy unit
37 bonding region
38 P-side common electrode (second electrode, fourth electrode)
39 P-side electrode region
40 pixel
40B blue sub-pixel
40G green sub-pixel
40R red sub-pixel
41a first LED (light emitting element)
41b second LED (light emitting element)
42 P-side individual electrode (first electrode)
43 N-side wiring electrode (third electrode)
44 N-side electrode layer (first electrode layer)
44a N-side individual electrode (first electrode)
44b P-side wiring electrode (third electrode)
44c dummy electrode
45 silicon substrate
46 P-side electrode (first drive electrode)
46a P-side electrode (second drive electrode)
47 N-side electrode (second drive electrode)
47a N-side electrode (first drive electrode)
48 dummy electrode
49 bonding pad
50 sapphire substrate
51 compound semiconductor layer
52, 52a N-side epitaxial layer
53 light emitting layer
54 P-side epitaxial layer
55 transparent conductive film
55a first transparent conductive film pattern
55b second transparent conductive film pattern
56, 56a mesa
57 protective film
58, 58a P-side contact hole
59, 59a N-side contact hole
60, 60a unit separation groove
61 cap layer
62 reflective material
63 peel substrate
64 transfer substrate
65 resin layer
66 microbump
67 planarizing layer
68, 68B, 68G, 68R wavelength conversion layer
68B blue wavelength conversion layer
68G green wavelength conversion layer
68R red wavelength conversion layer
69 light-shielding layer
70, 70a, 90 drive circuit
71 row-selection signal line, first row-selection signal line
72 column signal line, first column signal line
73 power supply line
74 GND line
75 row-selection transistor, first row-selection transistor
76 voltage holding capacitor
77 drive transistor, first drive transistor
77a first drive transistor
77b second drive transistor
77c drive transistor
78 nonvolatile memory transistor
78a first nonvolatile memory transistor
78b second nonvolatile memory transistor
78c third nonvolatile memory transistor
78d fourth nonvolatile memory transistor
79 gate control signal line
79a first gate control signal line
79b second gate control signal line
79c third gate control signal line 79d fourth gate control signal line
80 test transistor
80a first test transistor
80b second test transistor
81 test terminal
81a first test terminal
81b second test terminal
91, 91A current adjusting circuit
92 current adjusting circuit array portion
93 second column signal line control circuit portion
94 second row-selection circuit portion
95 row-selection circuit portion, first row-selection circuit portion
96 second column signal line
97 second row-selection signal line
98 GND line
99, 99A power supply line
100 second drive transistor
101 second row-selection transistor
102 nonvolatile memory transistor
CS column signal, first column signal
CS2 second column signal
I drive current
Iref reference current
Rol row-selection signal, first row-selection signal
Vcc power supply voltage
W1 silicon wafer
W2 sapphire wafer

The invention claimed is:

1. A display device comprising:
a plurality of light emitting units each of which has at least one light emitting element, a first surface, and a second surface opposite to the first surface;
an integrated circuit device that has a plurality of drive circuits each of which is configured to drive a corresponding one of the plurality of light emitting units, and a mounting surface on which the plurality of light emitting units is mounted, wherein
the first surface faces the mounting surface,
the at least one light emitting element includes at least one first electrode on the first surface,
each of the plurality of drive circuits includes a first drive electrode on the mounting surface, the first drive electrode being connected to the first electrode of the at least one light emitting element included in the corresponding one of the plurality of light emitting units, and
each of the plurality of light emitting units includes a compound semiconductor layer isolated from other compound semiconductor layers by a reflective material that is able to reflect light emitted by the plurality of light emitting units,
the display device further comprises:
a plurality of wavelength conversion layers disposed on the second surface of at least a part of the plurality of light emitting units, the plurality of wavelength conversion layers being able to convert a wavelength of light emitted by the plurality of light emitting units and each of the plurality of wavelength conversion layers being mutually isolated by spaces; and
a light-shielding layer filling the spaces between the plurality of wavelength conversion layers adjacent to each other.

2. The display device according to claim 1 further comprising a second electrode between the second surface of each of the plurality of light emitting units and the plurality of wavelength conversion layers.

3. The display device according to claim 2, wherein the second electrode is in contact with a surface of the reflective material between the plurality of light emitting units adjacent to each other.

4. The display device according to claim 2, wherein the second electrode is in contact with a protective film between the plurality of light emitting units adjacent to each other, wherein the protective film is an insulating film which covers sidewalls of the plurality of light emitting units.

5. A display device comprising:
a plurality of light emitting units each of which has at least one light emitting element, a first surface, and a second surface opposite to the first surface; and
an integrated circuit device that has a plurality of drive circuits each of which is configured to drive a corresponding one of the plurality of light emitting units, and a mounting surface on which the plurality of light emitting units is mounted, wherein
the first surface faces the mounting surface,
the at least one light emitting element includes at least one first electrode on the first surface,
each of the plurality of drive circuits includes a first drive electrode on the mounting surface, the first drive electrode being connected to the first electrode of the at least one light emitting element included in the corresponding one of the plurality of light emitting units, and
the plurality of light emitting units is separated from each other by a reflective material that is able to reflect light emitted by the plurality of light emitting units,
the display device further comprises:
for a second surface side of at least a part of the plurality of light emitting units, a plurality of wavelength conversion layers that is able to convert a wavelength of light emitted by the plurality of light emitting units, respectively;
a light-shielding layer between the plurality of wavelength conversion layers adjacent to each other;
a second electrode between the second surface of each of the plurality of light emitting units and the plurality of wavelength conversion layers; and
at least one wiring unit having a third surface and a fourth surface opposite to the third surface, wherein
the third surface faces the mounting surface,
the wiring unit includes a third electrode on the third surface and a fourth electrode on the fourth surface, the fourth electrode being connected to the third electrode,
the integrated circuit device includes a second drive electrode on the mounting surface, the second drive electrode being connected to each one of the plurality of drive circuits through an inner portion of the integrated circuit device,
the second electrode is connected to the fourth electrode, and
the third electrode is connected to the second drive electrode.

6. The display device according to claim 5, wherein the wiring unit has a multilayer structure identical to that of the plurality of light emitting units.

7. The display device according to claim 5, wherein
the plurality of light emitting units is arranged to form a group, and
the wiring unit is arranged next to an outer periphery of the group of the plurality of light emitting units.

8. The display device according to claim 5, wherein the plurality of light emitting units and the wiring unit are separated from each other by the reflective material.

9. The display device according to claim 5, wherein the light-shielding layer resides also on the wiring unit.

10. The display device according to claim 1 further comprising a planarizing layer for reducing a difference in level between the mounting surface of the integrated circuit device and the second surfaces of the plurality of light emitting units.

11. The display device according to claim 10, wherein the planarizing layer is disposed outside a region where the plurality of light emitting units is mounted on the mounting surface.

12. The display device according to claim 10, wherein the planarizing layer has light-shielding characteristics.

13. The display device according to claim 1, wherein the second surfaces of the plurality of light emitting units are uneven.

14. The display device according to claim 1, wherein the plurality of wavelength conversion layers includes a color filter.

15. The display device according to claim 1, wherein the reflective material reflects light emitted by the plurality of wavelength conversion layers.

16. The display device according to claim 1, wherein the integrated circuit device includes a current adjusting circuit configured to individually adjust a current flow through the plurality of light emitting units.

17. The display device according to claim 16, wherein the current adjusting circuit blocks the current flow through the plurality of light emitting units.

18. The display device according to claim 1, wherein
each of the plurality of light emitting units includes a plurality of light emitting elements, and
the plurality of light emitting elements includes respective first electrodes and a common second electrode.

19. The display device according to claim 18, wherein the integrated circuit device controls an amount of current supplied to each of the plurality of light emitting elements.

20. The display device according to claim 19, wherein the integrated circuit device supplies a current to some of the plurality of light emitting elements and blocks current supply to the other light emitting elements.

* * * * *